(12) United States Patent
Suh et al.

(10) Patent No.: US 11,631,821 B2
(45) Date of Patent: Apr. 18, 2023

(54) POLYCYCLIC AROMATIC COMPOUNDS CONTAINING A 1,11-DIOXA-,1,11-DITHIA-, OR 1-OXA-11-THIA-4,8-DIAZA-11B-BORADICYCLOPENTA[A,J]PHENALENE CORE AND ORGANIC LIGHT-EMITTING DEVICE COMPRISING SAME

(71) Applicant: LG CHEM, LTD., Seoul (KR)

(72) Inventors: Sang Duk Suh, Daejeon (KR); Sung Kil Hong, Daejeon (KR); Yongbum Cha, Daejeon (KR); Seong So Kim, Daejeon (KR); Minseung Chun, Daejeon (KR)

(73) Assignee: LG CHEM, LTD., Seoul (KR)

( * ) Notice: Subject to any disclaimer, the term of this patent is extended or adjusted under 35 U.S.C. 154(b) by 151 days.

(21) Appl. No.: 16/771,361

(22) PCT Filed: Feb. 22, 2019

(86) PCT No.: PCT/KR2019/002206
§ 371 (c)(1),
(2) Date: Jun. 10, 2020

(87) PCT Pub. No.: WO2019/164331
PCT Pub. Date: Aug. 29, 2019

(65) Prior Publication Data
US 2021/0184121 A1   Jun. 17, 2021

(30) Foreign Application Priority Data

Feb. 23, 2018   (KR) .......................... 10-2018-0021871

(51) Int. Cl.
*H01L 51/00* (2006.01)
*C07F 5/02* (2006.01)
(Continued)

(52) U.S. Cl.
CPC ............ *H01L 51/008* (2013.01); *C07F 5/027* (2013.01); *C09K 11/06* (2013.01);
(Continued)

(58) Field of Classification Search
CPC ..................................................... H01L 51/008
See application file for complete search history.

(56) References Cited

U.S. PATENT DOCUMENTS 9,212,198 B2   12/2015   Franz et al.
10,333,085 B2   6/2019   Nakano et al.
(Continued)

FOREIGN PATENT DOCUMENTS

CN   107501311   12/2017
DE   102009041414   3/2011
(Continued)

OTHER PUBLICATIONS

International Search Report and the Written Opinion of PCT/KR2019/002206, dated Jun. 4, 2019.
(Continued)

*Primary Examiner* — Caleb E Henry
(74) *Attorney, Agent, or Firm* — Dentons US LLP

(57) ABSTRACT

Provided is a heterocyclic compound of Chemical Formula 1:
(Continued)

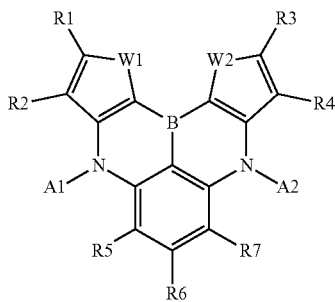

wherein:
W1 and W2 are the same as or different from each other, and each independently is O or S;
A1 and A2 each independently is a substituted or unsubstituted aryl group, or a substituted or unsubstituted heteroaryl group;
R1 to R7 each independently is hydrogen, deuterium, a nitrile group, a halogen group, a substituted or unsubstituted alkyl group, a substituted or unsubstituted cycloalkyl group, a substituted or unsubstituted alkoxy group, a substituted or unsubstituted silyl group, a substituted or unsubstituted amine group, a substituted or unsubstituted aryl group, or a substituted or unsubstituted heteroaryl group; and
R1 to R7, A1 and A2 bond to adjacent substituents to form a substituted or unsubstituted ring,
and an organic light-emitting device including the same.

8 Claims, 2 Drawing Sheets

(51) Int. Cl.
*C09K 11/06* (2006.01)
*H01L 51/50* (2006.01)

(52) U.S. Cl.
CPC ............ *C09K 2211/1007* (2013.01); *C09K 2211/1011* (2013.01); *C09K 2211/1014* (2013.01); *C09K 2211/1018* (2013.01); *H01L 51/5012* (2013.01); *H01L 51/5016* (2013.01)

(56) References Cited

U.S. PATENT DOCUMENTS

| | | | |
|---|---|---|---|
| 10,374,166 B2* | 8/2019 | Hatakeyama | H01L 51/0054 |
| 10,689,402 B2* | 6/2020 | Hatakeyama | H01L 51/0052 |
| 2018/0094000 A1* | 4/2018 | Hatakeyama | C09K 11/06 |
| 2019/0058124 A1* | 2/2019 | Hatakeyama | C09K 11/06 |
| 2019/0181350 A1* | 6/2019 | Hatakeyama | C07F 5/027 |
| 2019/0207112 A1* | 7/2019 | Hatakeyama | C07D 307/91 |
| 2019/0393419 A1* | 12/2019 | Hatakeyama | H01L 51/0054 |
| 2020/0091431 A1* | 3/2020 | Hatakeyama | C09K 11/06 |
| 2020/0176680 A1* | 6/2020 | Hatakeyama | C09K 11/06 |

FOREIGN PATENT DOCUMENTS

| | | |
|---|---|---|
| KR | 10-20160119683 | 10/2016 |
| KR | 10-20170130434 | 11/2017 |
| KR | 10-20170130435 | 11/2017 |
| KR | 10-20180007727 | 1/2018 |
| WO | 2012-115394 A2 | 8/2012 |

OTHER PUBLICATIONS

Zhang et al., "Advance in Development of Organic Electroluminescence Materials," Journal of Shanxi University (Natural Science Edition), vol. 35, No. 136(02), pp. 293-302 (2012). Only English Language Abstract included.

Nakatsuka et al., "Divergent Synthesis of Heteroatom-Centered 4,8,12-Triazatriangulenes," Angewandte Chemie International Edition 56:5087-5090 (2017).

Office Action of Chinese Patent Office in Appl'n No. 201980006178.8, dated Sep. 15, 2022.

* cited by examiner

[FIG. 1]

| 4 |
|---|
| 3 |
| 2 |
| 1 |

[FIG. 2]

| 4 |
|---|
| 10 |
| 9 |
| 8 |
| 7 |
| 6 |
| 5 |
| 2 |
| 1 |

[FIG. 3]
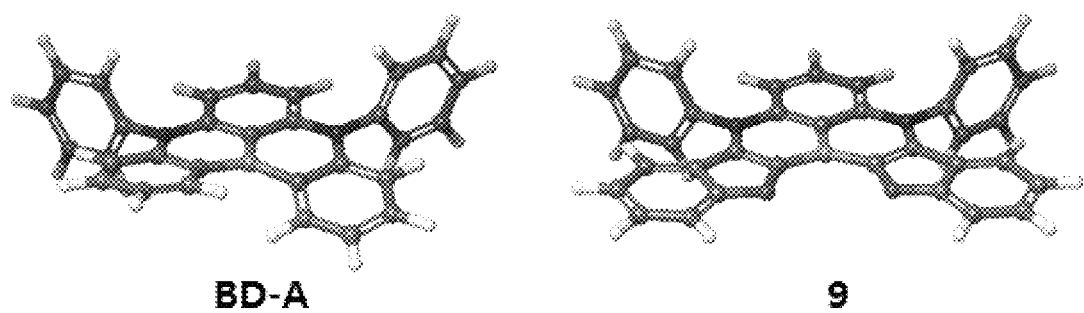

POLYCYCLIC AROMATIC COMPOUNDS CONTAINING A 1,11-DIOXA-,1,11-DITHIA-, OR 1-OXA-11-THIA-4,8-DIAZA-11B-BORADICYCLOPENTA[A,J]PHENALENE CORE AND ORGANIC LIGHT-EMITTING DEVICE COMPRISING SAME

CROSS-REFERENCE TO RELATED APPLICATIONS

This application is a National Stage Application of International Application No. PCT/KR2019/002206 filed on Feb. 22, 2019, which claims priority to and the benefits of Korean Patent Application No. 10-2018-0021871, filed with the Korean Intellectual Property Office on Feb. 23, 2018, the entire contents of which are incorporated herein by reference.

TECHNICAL FIELD

The present specification relates to a heterocyclic compound, and an organic light emitting device formed using the heterocyclic compound.

BACKGROUND

An organic light emission phenomenon generally refers to a phenomenon converting electrical energy to light energy using an organic material. An organic light emitting device using an organic light emission phenomenon normally has a structure including an anode, a cathode, and an organic material layer therebetween. Herein, the organic material layer is often formed in a multilayer structure formed with different materials in order to increase efficiency and stability of the organic light emitting device, and for example, can be formed with a hole injection layer, a hole transfer layer, a light emitting layer, an electron transfer layer, an electron injection layer and the like. When a voltage is applied between the two electrodes in such an organic light emitting device structure, holes and electrons are injected to the organic material layer from the anode and the cathode, respectively, and when the injected holes and electrons meet, excitons are formed, and light emits when these excitons fall back to the ground state.

Development of new materials for such an organic light emitting device has been continuously required.

BRIEF SUMMARY

Technical Problem

The present specification is directed to providing a heterocyclic compound, and an organic light emitting device including the same.

Technical Solution

One embodiment of the present specification provides a heterocyclic compound of the following Chemical Formula 1:

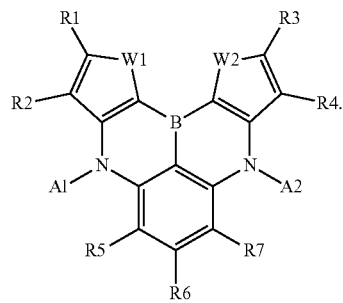

Chemical Formula 1

In Chemical Formula 1:

W1 and W2 are the same as or different from each other, and each independently is O or S;

A1 and A2 are the same as or different from each other, and each independently is a substituted or unsubstituted aryl group, or a substituted or unsubstituted heteroaryl group;

R1 to R7 are the same as or different from each other, and each independently is hydrogen, deuterium, a nitrile group, a halogen group, a substituted or unsubstituted alkyl group, a substituted or unsubstituted cycloalkyl group, a substituted or unsubstituted alkoxy group, a substituted or unsubstituted silyl group, a substituted or unsubstituted amine group, a substituted or unsubstituted aryl group, or a substituted or unsubstituted heteroaryl group; and R1 to R7, A1 and A2 can bond to adjacent substituents to form a substituted or unsubstituted ring.

Another embodiment of the present specification provides an organic light emitting device including a first electrode; a second electrode provided opposite to the first electrode; and one or more organic material layers provided between the first electrode and the second electrode, wherein one or more layers of the organic material layers include the heterocyclic compound.

Advantageous Effects

A heterocyclic compound according to one embodiment of the present specification can be used as a material of an organic material layer of an organic light emitting device, and by using the same, properties of efficiency enhancement and color purity can be obtained in the organic light emitting device.

DESCRIPTION OF DRAWINGS

FIG. 1 illustrates an organic light emitting device according to one embodiment of the present specification.

FIG. 2 illustrates an organic light emitting device according to one embodiment of the present specification.

FIG. 3 illustrates optimized structures of Compound BD-A and Compound 9 obtained through a quantum calculation.

REFERENCE NUMERALS

1: Substrate
2: First Electrode
3: Organic Material Layer
4: Second Electrode
5: Hole Injection Layer
6: Hole Transfer Layer
7: Electron Blocking Layer 8: Light Emitting Layer
9: Electron Transfer Layer
10: Electron Injection Layer

DETAILED DESCRIPTION

Hereinafter, the present specification will be described in more detail.

One embodiment of the present specification provides a heterocyclic compound of Chemical Formula 1.

In the present specification, a description of a certain part "including" certain constituents means capable of further including other constituents, and does not exclude other constituents unless particularly stated to the contrary.

Examples of substituents in the present specification are described below, however, the substituents are not limited thereto.

The term "substitution" means a hydrogen atom bonding to a carbon atom of a compound is changed to another substituent, and the position of substitution is not limited as long as it is a position at which the hydrogen atom is substituted, that is, a position at which a substituent can substitute, and when two or more substituents substitute, the two or more substituents can be the same as or different from each other.

In the present specification, the term "substituted or unsubstituted" means being substituted with one, two or more substituents selected from the group consisting of deuterium, a nitrile group, a substituted or unsubstituted alkyl group, a substituted or unsubstituted cycloalkyl group, a substituted or unsubstituted silyl group, a substituted or unsubstituted aryl group, and a substituted or unsubstituted heterocyclic group, or substituted with a substituent linking two or more substituents among the substituents illustrated above, or having no substituents. For example, "a substituent linking two or more substituents" can include an aryl group substituted with an aryl group, an aryl group substituted with a heteroaryl group, a heterocyclic group substituted with an aryl group, an aryl group substituted with an alkyl group, and the like.

In the present specification, examples of the halogen group can include a fluoro group, a chloro group, a bromo group, an iodo group and the like.

In the present specification, the alkyl group can be linear or branched, and although not particularly limited thereto, the number of carbon atoms is preferably from 1 to 30. Specific examples thereof can include methyl, ethyl, propyl, n-propyl, isopropyl, butyl, n-butyl, isobutyl, tert-butyl, sec-butyl, 1-methyl-butyl, 1-ethyl-butyl, pentyl, n-pentyl, isopentyl, neopentyl, tert-pentyl, hexyl, n-hexyl, 1-methylpentyl, 2-methylpentyl, 4-methyl-2-pentyl, 3,3-dimethylbutyl, 2-ethylbutyl, heptyl, n-heptyl, 1-methylhexyl, cyclopentylmethyl, cyclohexylmethyl, octyl, n-octyl, tert-octyl, 1-methylheptyl, 2-ethylhexyl, 2-propylpentyl, n-nonyl, 2,2-dimethylheptyl, 1-ethyl-propyl, 1,1-dimethyl-propyl, isohexyl, 2-methylpentyl, 4-methylhexyl, 5-methylhexyl and the like, but are not limited thereto.

In the present specification, the cycloalkyl group is not particularly limited, but preferably has 3 to 30 carbon atoms, and specific examples thereof can include cyclopropyl, cyclobutyl, cyclopentyl, 3-methylcyclopentyl, 2,3-dimethylcyclopentyl, cyclohexyl, 3-methylcyclohexyl, 4-methylcyclohexyl, 2,3-dimethylcyclohexyl, 3,4,5-trimethyl-cyclohexyl, 4-tert-butylcyclohexyl, cycloheptyl, cyclooctyl and the like, but are not limited thereto.

In the present specification, the alkoxy group can be linear, branched or cyclic. The number of carbon atoms of the alkoxy group is not particularly limited, but is preferably from 1 to 30. Specifically, the number of carbon atoms is preferably from 1 to 20. More specifically, the number of carbon atoms is preferably from 1 to 10. Specific examples thereof can include a methoxy group, an ethoxy group, an n-propoxy group, an isopropoxy group, an i-propyloxy group, an n-butoxy group, an isobutoxy group, a tert-butoxy group, a sec-butoxy group, an n-pentyloxy group, a neopentyloxy group, an isopentyloxy group, an n-hexyloxy group, a 3,3-dimethylbutyloxy group, a 2-ethylbutyloxy group, an n-octyloxy group, an n-nonyloxy group, an n-decyloxy group, a benzyloxy group, a p-methylbenzyloxy group and the like, but are not limited thereto.

In the present specification, specific examples of the silyl group can include a trimethylsilyl group, a triethylsilyl group, a t-butyldimethylsilyl group, a vinyldimethylsilyl group, a propyldimethylsilyl group, a triphenylsilyl group, a diphenylsilyl group, a phenylsilyl group and the like, but are not limited thereto.

In the present specification, the aryl group is not particularly limited, but preferably has 6 to 30 carbon atoms, and the aryl group can be monocyclic or polycyclic.

When the aryl group is a monocyclic aryl group, the number of carbon atoms is not particularly limited, but is preferably from 6 to 30. Specific examples of the monocyclic aryl group can include a phenyl group, a biphenyl group, a terphenyl group and the like, but are not limited thereto.

When the aryl group is a polycyclic aryl group, the number of carbon atoms is not particularly limited, but is preferably from 10 to 30. Specific examples of the polycyclic aryl group can include a naphthyl group, an anthracenyl group, a phenanthryl group, a triphenyl group, a pyrenyl group, a phenalenyl group, a perylenyl group, a chrysenyl group, a fluorene group and the like, but are not limited thereto.

In the present specification, the fluorene group can be substituted, and adjacent groups can bond to each other to form a ring.

When the fluorene group is substituted,

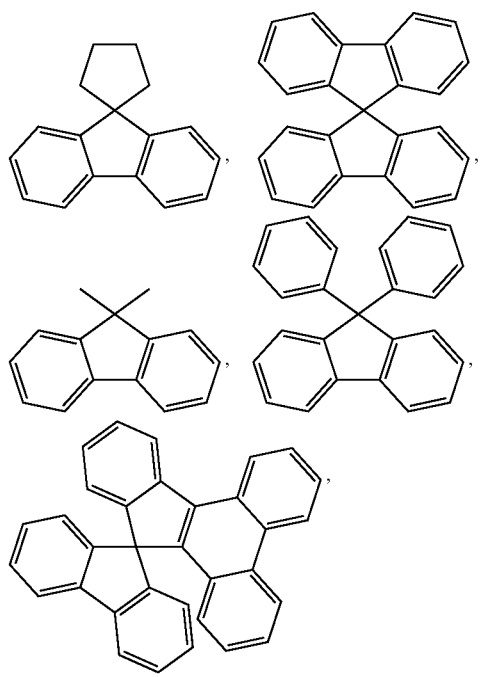

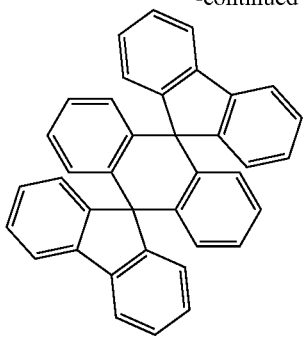

and the like can be included. However, the structure is not limited thereto.

In the present specification, examples of the arylamine group include a substituted or unsubstituted monoarylamine group, a substituted or unsubstituted diarylamine group, or a substituted or unsubstituted triarylamine group. The aryl group in the arylamine group can be a monocyclic aryl group or a polycyclic aryl group. The arylamine group including two or more aryl groups can include monocyclic aryl groups, polycyclic aryl groups, or both monocyclic aryl groups and polycyclic aryl groups. For example, the aryl group in the arylamine group can be selected from among the examples of the aryl group described above.

In the present specification, the heteroaryl group is a group including one or more atoms that are not carbon, that is, heteroatoms, and specifically, the heteroatom can include one or more atoms selected from the group consisting of O, N, Se, S and the like. The number of carbon atoms is not particularly limited, but is preferably from 2 to 30, and the heteroaryl group can be monocyclic or polycyclic. Examples of the heterocyclic group can include a thiophene group, a furanyl group, a pyrrole group, an imidazolyl group, a thiazolyl group, an oxazolyl group, an oxadiazolyl group, a pyridyl group, a bipyridyl group, a pyrimidyl group, a triazinyl group, a triazolyl group, an acridyl group, a pyridazinyl group, a pyrazinyl group, a quinolinyl group, a quinazolinyl group, a quinoxalinyl group, a phthalazinyl group, a pyridopyrimidyl group, a pyridopyrazinyl group, a pyrazinopyrazinyl group, an isoquinolinyl group, an indolyl group, a carbazolyl group, a benzoxazolyl group, a benzimidazolyl group, a benzothiazolyl group, a benzocarbazolyl group, a benzothiophene group, a dibenzothiophene group, a benzofuranyl group, a phenanthrolinyl group, an isoxazolyl group, a thiadiazolyl group, a phenothiazinyl group, a dibenzofuranyl group and the like, but are not limited thereto.

In the present specification, examples of the heteroarylamine group include a substituted or unsubstituted monoheteroarylamine group, a substituted or unsubstituted diheteroarylamine group, or a substituted or unsubstituted triheteroarylamine group. The heteroarylamine group including two or more heteroaryl groups can include monocyclic heteroaryl groups, polycyclic heteroaryl groups, or both monocyclic heteroaryl groups and polycyclic heteroaryl groups. For example, the heteroaryl group in the heteroarylamine group can be selected from among the examples of the heteroaryl group described above.

In the present specification, examples of the heteroaryl group in the N-arylheteroarylamine group and the N-alkylheteroarylamine group are the same as the examples of the heteroaryl group described above.

In the present specification, "bonding to adjacent groups to form a ring" refers to bonding to substituents on ortho positions to form an aliphatic ring, an aromatic ring, or a heteroring including a heteroatom.

According to one embodiment of the present specification, Chemical Formula 1 is any one of the following Chemical Formula 2 to Chemical Formula 4.

According to one embodiment of the present specification, Chemical Formula 1 is one of the following Chemical Formula 2 or 3.

Chemical Formula 2

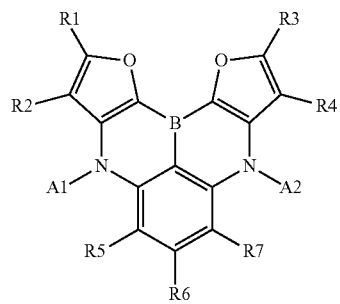

Chemical Formula 3

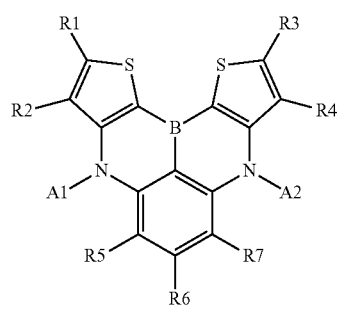

In Chemical Formulae 2 and 3,

A1, A2, and R1 to R7 have the same definitions as in Chemical Formula 1.

According to one embodiment of the present specification, Chemical Formula 1 is one of the following Chemical Formula 4 or 5:

Chemical Formula 4

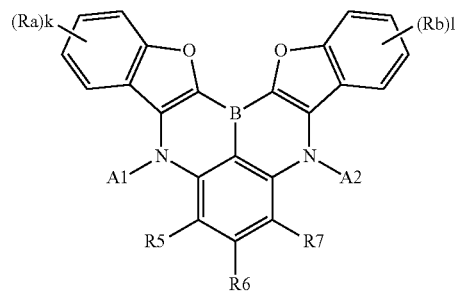

Chemical Formula 5

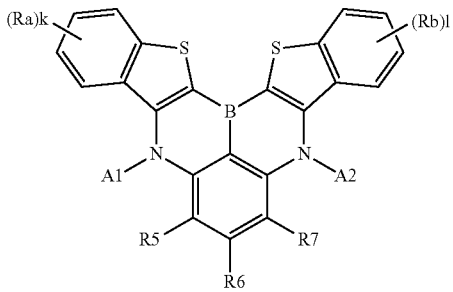

In Chemical Formulae 4 and 5:

A1, A2, and R5 to R7 have the same definitions as in Chemical Formula 1;

Ra and Rb are the same as or different from each other, and each independently is hydrogen, deuterium, a nitrile group, a halogen group, a substituted or unsubstituted alkyl group, a substituted or unsubstituted alkoxy group, a substituted or unsubstituted silyl group, a substituted or unsubstituted amine group, a substituted or unsubstituted aryl group, or a substituted or unsubstituted heteroaryl group, or adjacent substituents can bond to each other to form a substituted or unsubstituted ring;

k and l are each an integer of 0 to 4; and when k and l are each a plural number, substituents in the parentheses are the same as or different from each other.

According to one embodiment of the present specification, R1 to R7, Ra and Rb are the same as or different from each other, and each independently is hydrogen, deuterium, a nitrile group, a halogen group, a substituted or unsubstituted alkyl group, a substituted or unsubstituted silyl group, a substituted or unsubstituted alkoxy group, a substituted or unsubstituted amine group, a substituted or unsubstituted aryl group, or a substituted or unsubstituted heteroaryl group, or adjacent substituents can bond to each other to form a substituted or unsubstituted ring.

According to one embodiment of the present specification, R1 to R7, Ra and Rb are the same as or different from each other, and each independently is hydrogen; a nitrile group; a halogen group; an aryl group that is unsubstituted or substituted with a silyl group or an alkyl group; an alkyl group having 1 to 10 carbon atoms; a silyl group that is unsubstituted or substituted with an alkyl group having 1 to 10 carbon atoms; an alkoxy group having 1 to 10 carbon atoms; an amine group that is unsubstituted or substituted with an aryl group having 6 to 30 carbon atoms unsubstituted or substituted with an alkyl group; or a heteroaryl group having 3 to 30 carbon atoms and containing any one or more of N, O and S unsubstituted or substituted with an alkyl group having 1 to 10 carbon atoms.

According to one embodiment of the present specification, R1 and R2 bond to each other to form a ring.

According to one embodiment of the present specification, R3 and R4 bond to each other to form a ring.

According to one embodiment of the present specification, R1 and R2 bond to each other to form an aromatic ring.

According to one embodiment of the present specification, R3 and R4 bond to each other to form an aromatic ring.

According to one embodiment of the present specification, R1 and R2 bond to each other to form a heteroring.

According to one embodiment of the present specification, R3 and R4 bond to each other to form a heteroring.

According to one embodiment of the present specification, R1 to R4 are the same as or different from each other, and each independently is hydrogen, a halogen group, an alkyl group, an alkoxy group, a silyl group, or a substituted or unsubstituted aryl group.

According to one embodiment of the present specification, R1 to R4 are the same as or different from each other, and each independently is hydrogen; a halogen group; an alkyl group having 1 to 10 carbon atoms; an alkoxy group having 1 to 10 carbon atoms; a silyl group that is unsubstituted or substituted with an alkyl group having 1 to 10 carbon atoms; or an aryl group having 6 to 30 carbon atoms unsubstituted or substituted with an alkyl group or an alkylsilyl group.

According to one embodiment of the present specification, R1 to R4 are the same as or different from each other, and each independently is hydrogen; F; Cl; Br; I; a methyl group; an ethyl group; a propyl group; an isopropyl group; a butyl group; a tert-butyl group; a pentyl group; a hexyl group; a heptyl group; an octyl group; a methoxy group; an ethoxy group; a propoxy group; a butoxy group; a tert-butoxy group; a pentoxy group; a silyl group substituted with a methyl group; a phenyl group that is unsubstituted or substituted with an alkyl group having 1 to 10 carbon atoms or an alkylsilyl group having 1 to 10 carbon atoms; a biphenyl group; a terphenyl group; a naphthyl group; an anthracene group; a phenanthrene group; a pyrene group; or a triphenylene group.

According to one embodiment of the present specification, R1 to R4 are the same as or different from each other, and each independently is hydrogen; F; a methyl group; a tert-butyl group; a methoxy group; a trimethylsilyl group; or a phenyl group that is unsubstituted or substituted with a methyl group, a tert-butyl group or a trimethylsilyl group.

According to one embodiment of the present specification, R5 and R7 are hydrogen.

According to one embodiment of the present specification, R6 is hydrogen; an alkyl group; a silyl group substituted with an alkyl group; a silyl group substituted with an aryl group; an alkoxy group substituted with a halogen group; an alkoxy group; an aryl group; an aryl group substituted with an aryl group; a cycloalkyl group; an amine group substituted with an aryl group that is unsubstituted or substituted with an alkyl group; or an N, O or S-containing heterocyclic group having 3 to 30 carbon atoms.

According to one embodiment of the present specification, R6 is hydrogen; an alkyl group having 1 to 10 carbon atoms; a silyl group substituted with an alkyl group having 1 to 10 carbon atoms; a silyl group substituted with an aryl group having 6 to 30 carbon atoms; an aryl group having 6 to 30 carbon atoms; an alkoxy group having 1 to 10 carbon atoms substituted with a halogen group; an alkoxy group having 1 to 10 carbon atoms; an amine group substituted with an aryl group having 6 to 30 carbon atoms unsubstituted or substituted with an alkyl group having 1 to 10 carbon atoms; a cycloalkyl group having 3 to 20 carbon atoms; or a monocyclic or polycyclic heterocyclic group containing N, O or S.

According to one embodiment of the present specification, R6 is hydrogen; a methyl group; a tert-butyl group; a phenyl group substituted with a phenyl group; a biphenyl group; a phenyl group; a terphenyl group; an arylamine group that is unsubstituted or substituted with a methyl group or a tert-butyl group; a silyl group substituted with a methyl group; a silyl group substituted with a phenyl group; a methoxy group substituted with a fluoro group; a methoxy group; a cyclohexyl group; an adamantly group; a carbazole group; a pyridine group; a pyrimidine group; a triazine group; a furan group; a thiophene group; a benzofuran group; a benzothiophene group; a dibenzofuran group; a dibenzothiophene group; an imidazole group; a phenoxazine group; a phenothiazine group; or a dimethyldihydroacridine group.

According to one embodiment of the present specification, R6 is hydrogen, a tert-butyl group, a phenyl group, an amine group substituted with a phenyl group that is unsubstituted or substituted with a tert-butyl group, a trifluoromethoxy group, a trimethylsilyl group, a triphenylsilyl group, a cyclohexyl group, an adamantly group, a carbazole group, a phenoxazine group, a phenothiazine group or a dimethyldihydroacridine group.

According to one embodiment of the present specification, R6 bonds to A1 and A2 to form a substituted or unsubstituted heteroring.

According to one embodiment of the present specification, R6 bonds to A1 and A2 to form a heteroring unsubstituted or substituted with an alkyl group or an aryl group.

According to one embodiment of the present specification, R6 bonds to A1 and A2 to form a heteroring including any one or more of N, O and S unsubstituted or substituted with an alkyl group or an aryl group.

According to one embodiment of the present specification, Ra and Rb are the same as or different from each other, and each independently is hydrogen, a halogen group, an alkyl group, an alkoxy group, an alkylsilyl group, or an aryl group that is unsubstituted or substituted with an alkyl group or an alkylsilyl group.

According to one embodiment of the present specification, Ra and Rb are the same as or different from each other, and each independently is hydrogen, a halogen group, an alkyl group having 1 to 10 carbon atoms, an alkoxy group having 1 to 10 carbon atoms, a silyl group substituted with an alkyl group having 1 to 10 carbon atoms, or an aryl group having 6 to 20 carbon atoms unsubstituted or substituted with an alkyl group or an alkylsilyl group.

According to one embodiment of the present specification, Ra and Rb are the same as or different from each other, and each independently is hydrogen; F; Cl; Br; I; a methyl group; an ethyl group; a propyl group; an isopropyl group; a butyl group; a tert-butyl group; a methoxy group; an ethoxy group; a propoxy group; an isopropoxy group; a tert-butoxy group; a butoxy group; a trimethylsilyl group; a phenyl group that is unsubstituted or substituted with an alkyl group or an alkylsilyl group; a biphenyl group that is unsubstituted or substituted with an alkyl group or an alkylsilyl group; a terphenyl group that is unsubstituted or substituted with an alkyl group or an alkylsilyl group; a naphthyl group that is unsubstituted or substituted with an alkyl group or an alkylsilyl group; an anthracene group that is unsubstituted or substituted with an alkyl group or an alkylsilyl group; or a phenanthrene group that is unsubstituted or substituted with an alkyl group or an alkylsilyl group.

According to one embodiment of the present specification, Ra and Rb are the same as or different from each other, and each independently is hydrogen; a fluoro group; a methyl group; a tert-butyl group; a methoxy group; a phenyl group that is unsubstituted or substituted with a trimethylsilyl group or a tert-butyl group; or a trimethylsilyl group.

According to one embodiment of the present specification, A1 and A2 are the same as or different from each other, and each independently is an aryl group that is unsubstituted or substituted with a substituted or unsubstituted alkyl group, or a substituted or unsubstituted heteroaryl group.

According to one embodiment of the present specification, A1 and A2 are the same as or different from each other, and each independently is a substituted or unsubstituted aryl group having 6 to 30 carbon atoms, or a substituted or unsubstituted N, O or S-containing heteroaryl group having 3 to 30 carbon atoms.

According to one embodiment of the present specification, A1 and A2 are the same as or different from each other, and each independently is a substituted or unsubstituted monocyclic aryl group having 6 to 30 carbon atoms, a substituted or unsubstituted polycyclic aryl group having 10 to 30 carbon atoms, a substituted or unsubstituted N, O or S-containing monocyclic heteroaryl group having 3 to 30 carbon atoms, or a substituted or unsubstituted N, O or S-containing polycyclic heteroaryl group having 3 to 30 carbon atoms.

According to one embodiment of the present specification, A1 and A2 are the same as or different from each other, and each independently is an aryl group having 6 to 30 carbon atoms, and examples of the aryl group having 6 to 30 carbon atoms can include a phenyl group, a biphenyl group, a terphenyl group, a naphthyl group, a fluorene group, an anthracene group, a phenanthrene group, a triphenylene group or a pyrene group, but are not limited thereto, and can be unsubstituted or substituted with one or more substituents selected from the group consisting of deuterium, a nitrile group, a halogen group, an alkyl group having 1 to 10 carbon atoms, a cycloalkyl group having 3 to 30 carbon atoms, a silyl group substituted with an alkyl group having 1 to 10 carbon atoms, an aryl group having 6 to 30 carbon atoms, and a heteroaryl group having 3 to 30 carbon atoms.

According to one embodiment of the present specification, A1 and A2 are the same as or different from each other, and each independently is an aryl group having 6 to 30 carbon atoms unsubstituted or substituted with an alkyl group having 1 to 10 carbon atoms, a cycloalkyl group having 3 to 30 carbon atoms, or a silyl group substituted with an alkyl group having 1 to 10 carbon atoms.

According to one embodiment of the present specification, A1 and A2 are the same as or different from each other, and each independently is a phenyl group that is unsubstituted or substituted with an alkyl group having 1 to 10 carbon atoms, a cycloalkyl group having 3 to 30 carbon atoms, or a silyl group substituted with an alkyl group having 1 to 10 carbon atoms.

According to one embodiment of the present specification, A1 and A2 are the same as or different from each other, and each independently is a phenyl group that is unsubstituted or substituted with a methyl group, a phenyl group that is unsubstituted or substituted with an ethyl group, a phenyl group that is unsubstituted or substituted with a propyl group, a phenyl group that is unsubstituted or substituted with an isopropyl group, a phenyl group that is unsubstituted or substituted with a butyl group, a phenyl group that is unsubstituted or substituted with a tert-butyl group, a phenyl group that is unsubstituted or substituted with a cyclohexyl group, or a phenyl group that is unsubstituted or substituted with a trimethylsilyl group.

According to one embodiment of the present specification, A1 and A2 are the same as or different from each other, and each independently is a phenyl group that is unsubstituted or substituted with a methyl group, a tert-butyl group, a cyclohexyl group or a trimethylsilyl group.

According to one embodiment of the present specification, A1 and A2 can be any one of the following substituents:

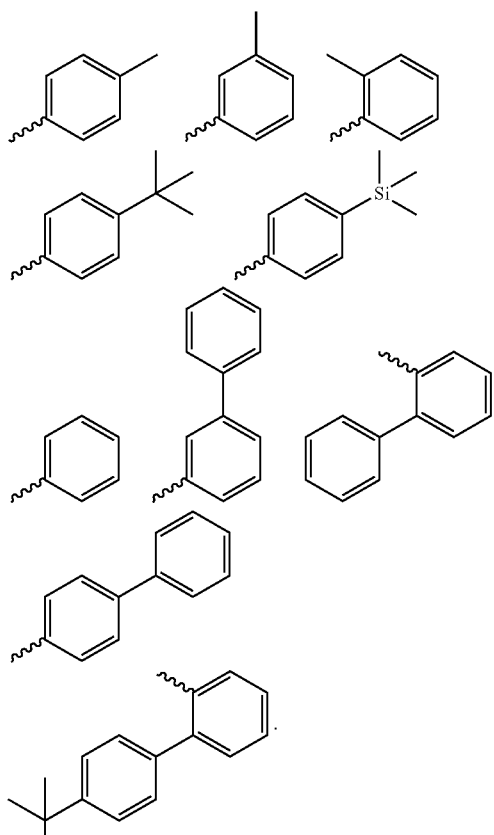

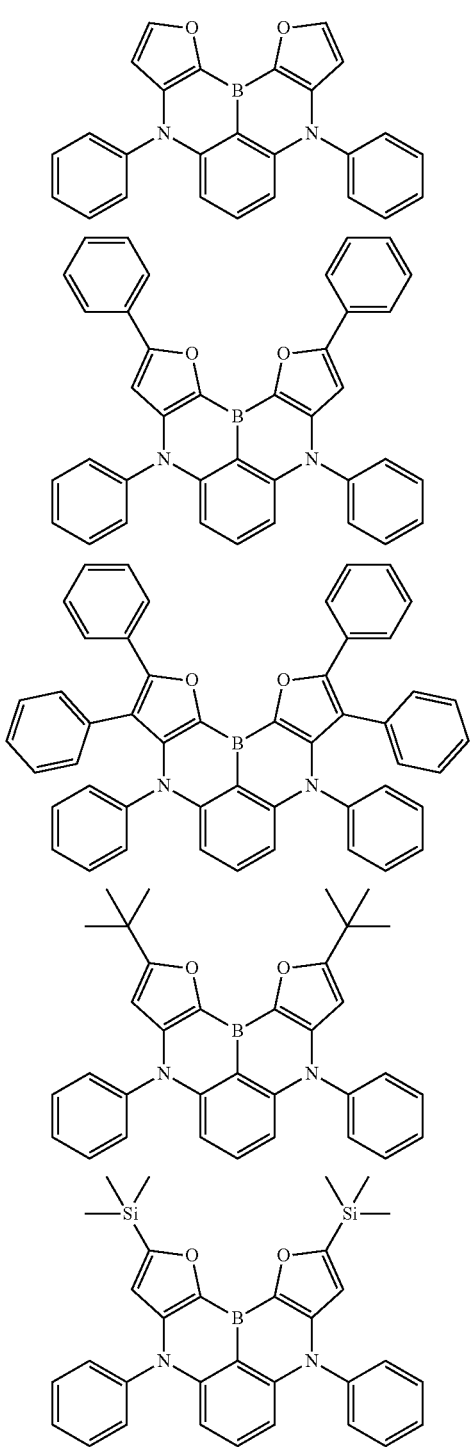

is a site bonding to a core.

According to one embodiment of the present specification, A1 and A2 are the same as or different from each other, and each independently is a phenyl group that is unsubstituted or substituted with a methyl group, a tert-butyl group or a cyclohexyl group, or a biphenyl group that is unsubstituted or substituted with a tert-butyl group.

According to one embodiment of the present specification, A1 and R5 bond to each other to form a substituted or unsubstituted ring.

According to one embodiment of the present specification, A2 and R7 bond to each other to form a substituted or unsubstituted ring.

According to one embodiment of the present specification, A1 and R5 bond to each other to form a substituted or unsubstituted heteroring.

According to one embodiment of the present specification, A2 and R7 bond to each other to form a substituted or unsubstituted heteroring.

According to one embodiment of the present specification, A1 and R5 bond to each other to form an N, O or S-including heteroring unsubstituted or substituted with an alkyl group having 1 to 10 carbon atoms.

According to one embodiment of the present specification, A2 and R7 bond to each other to form an N, O or S-including heteroring unsubstituted or substituted with an alkyl group having 1 to 10 carbon atoms.

According to another embodiment of the present specification, the heterocyclic compound of Chemical Formula 1 can be any one of the following compounds:

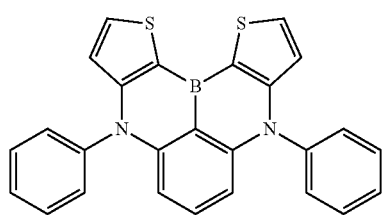

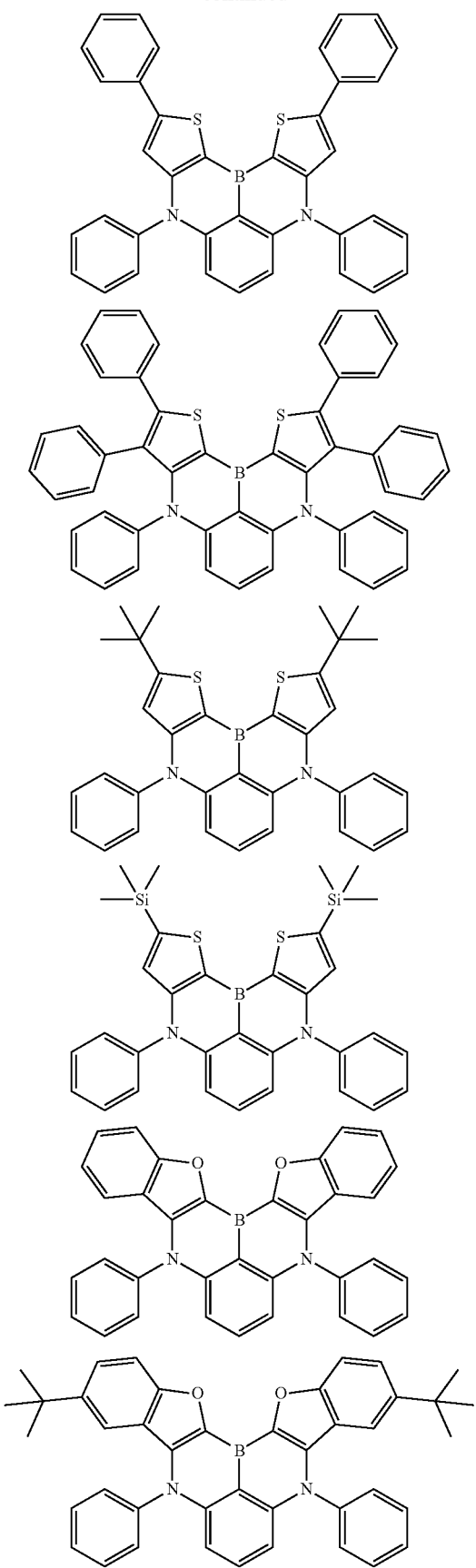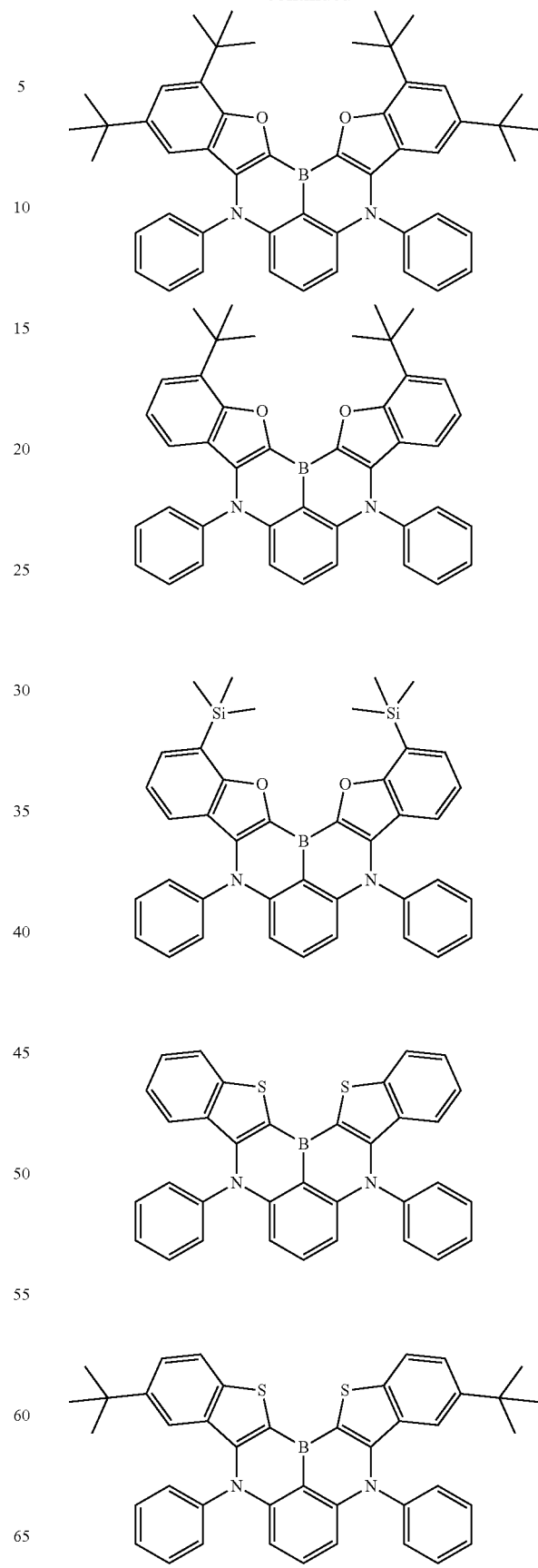

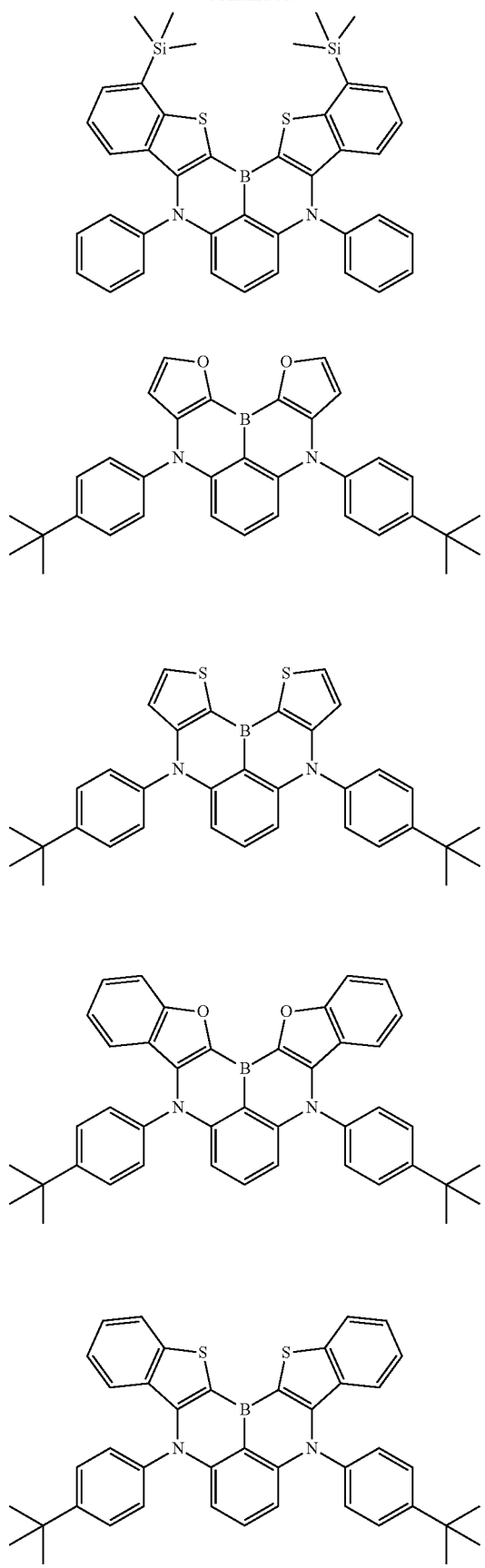
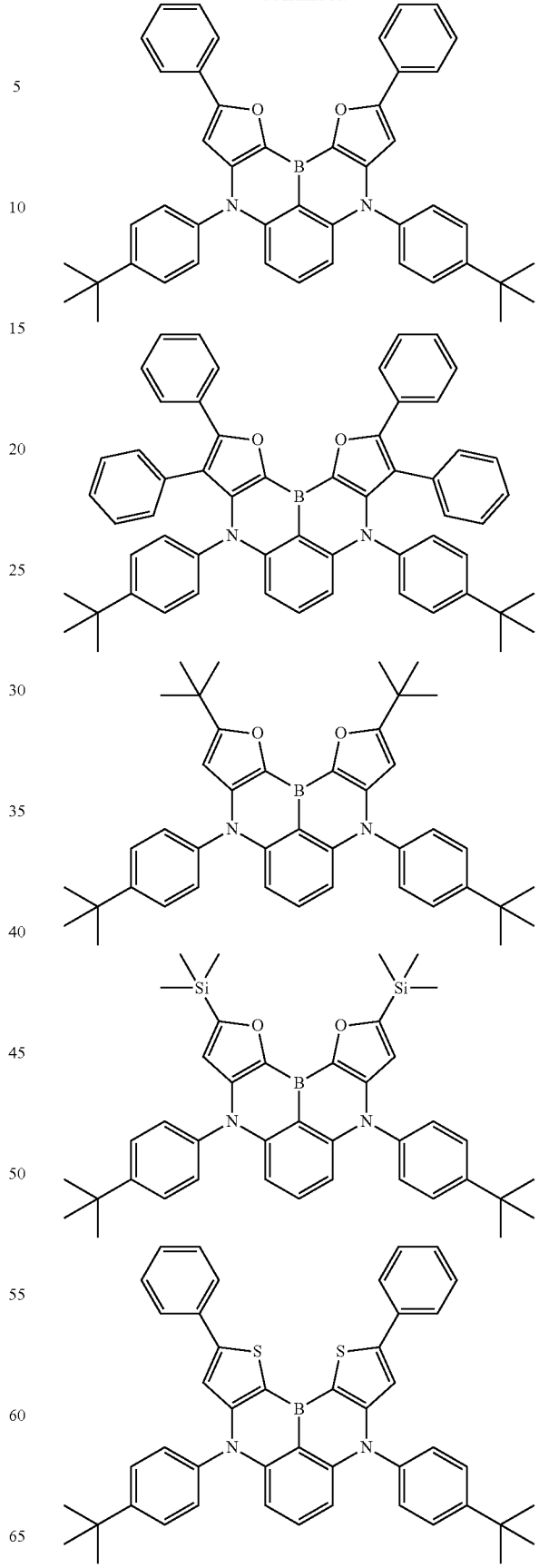

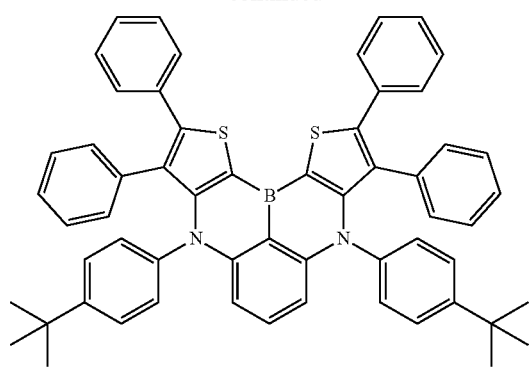
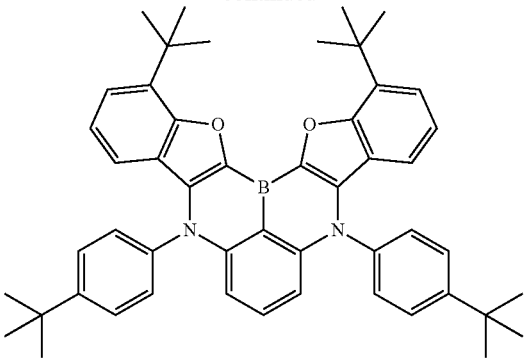
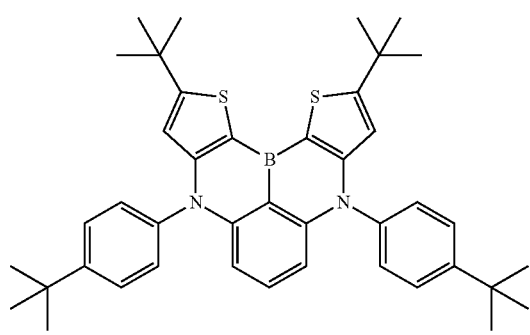
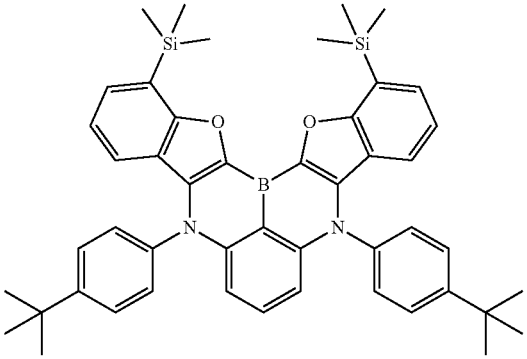
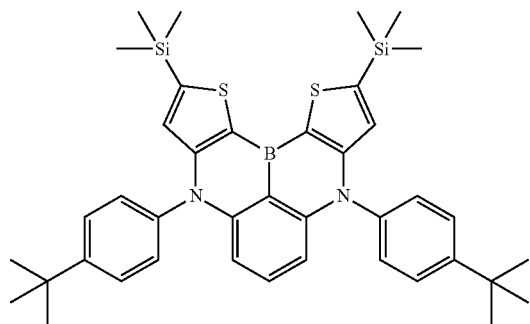
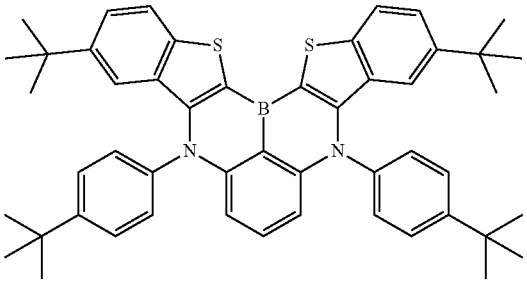
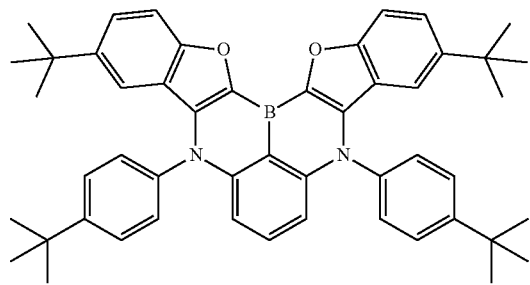
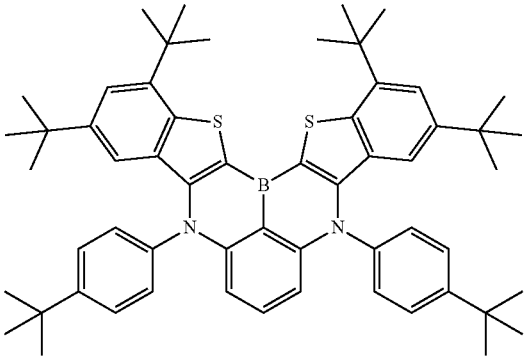
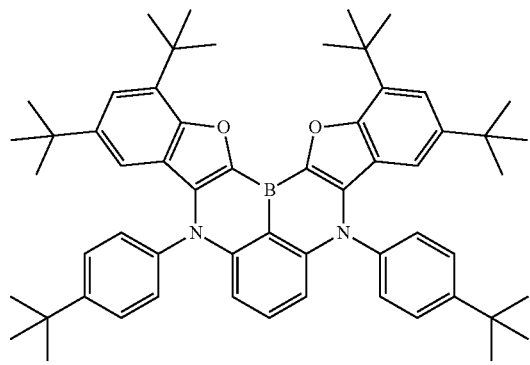
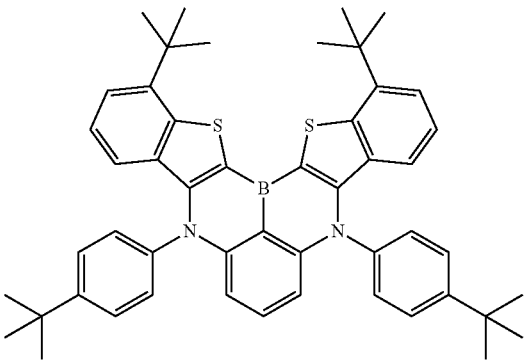

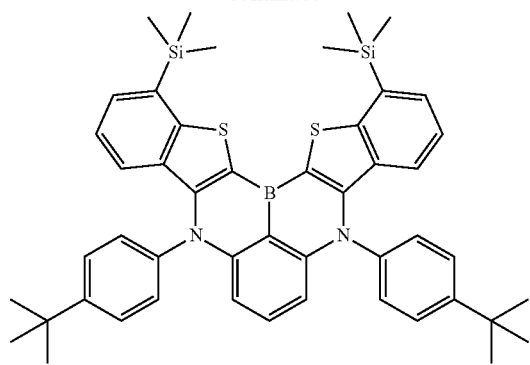
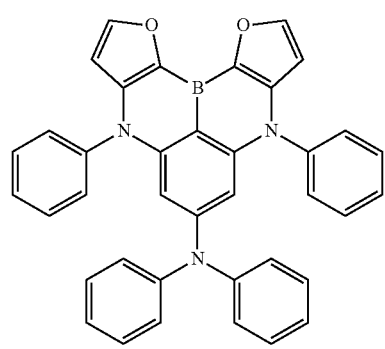
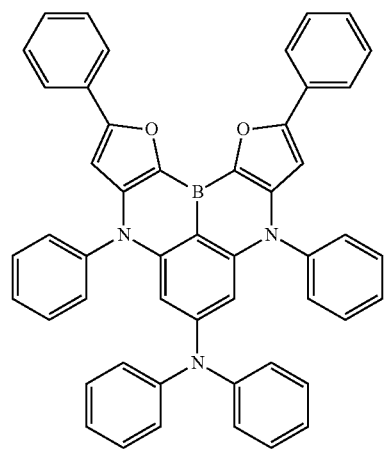
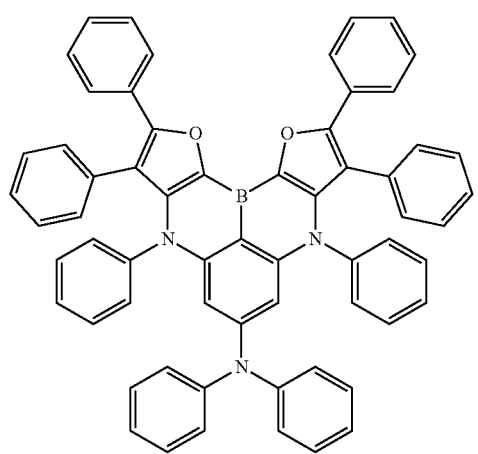
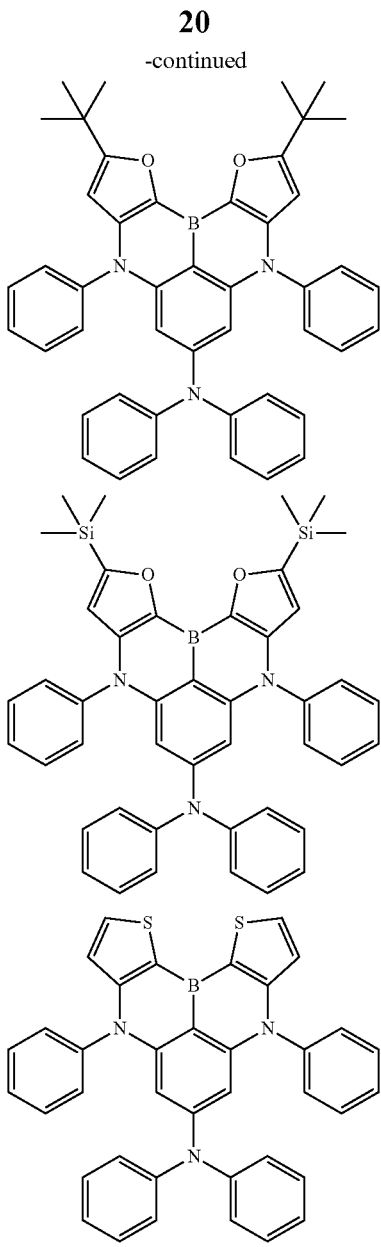
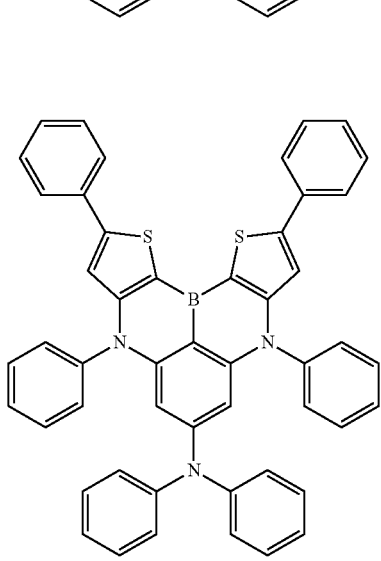

21
-continued
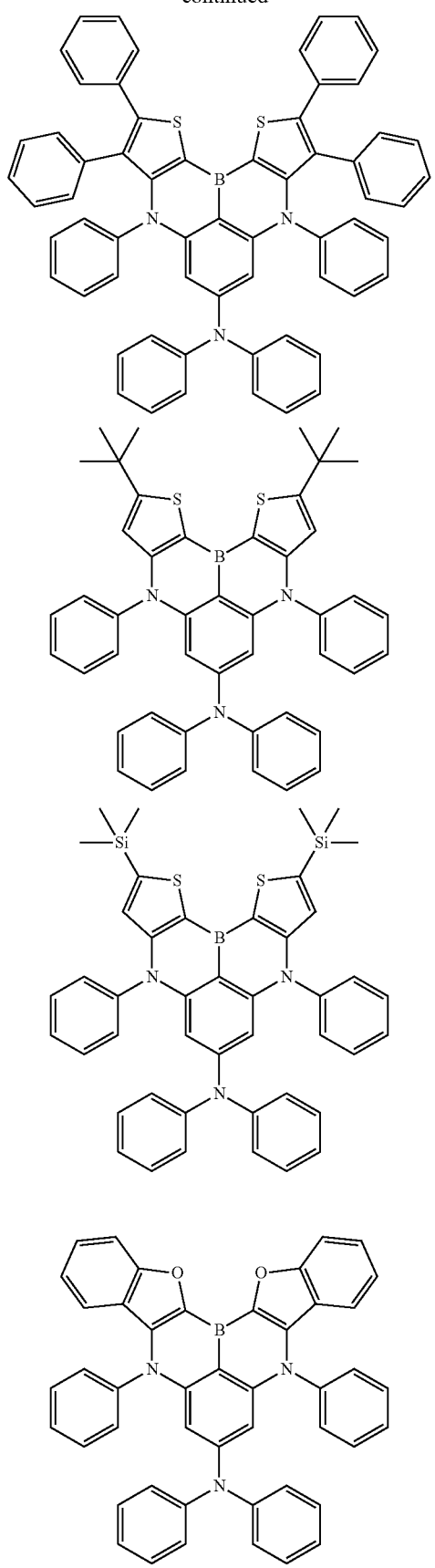
22
-continued
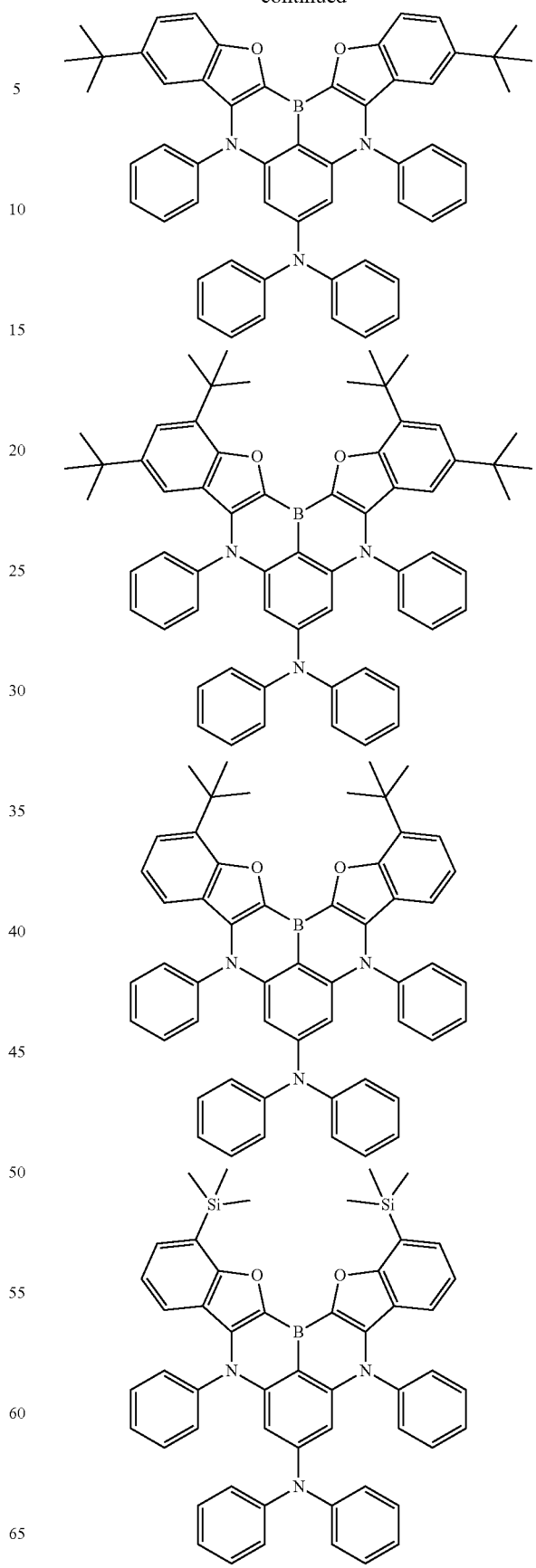

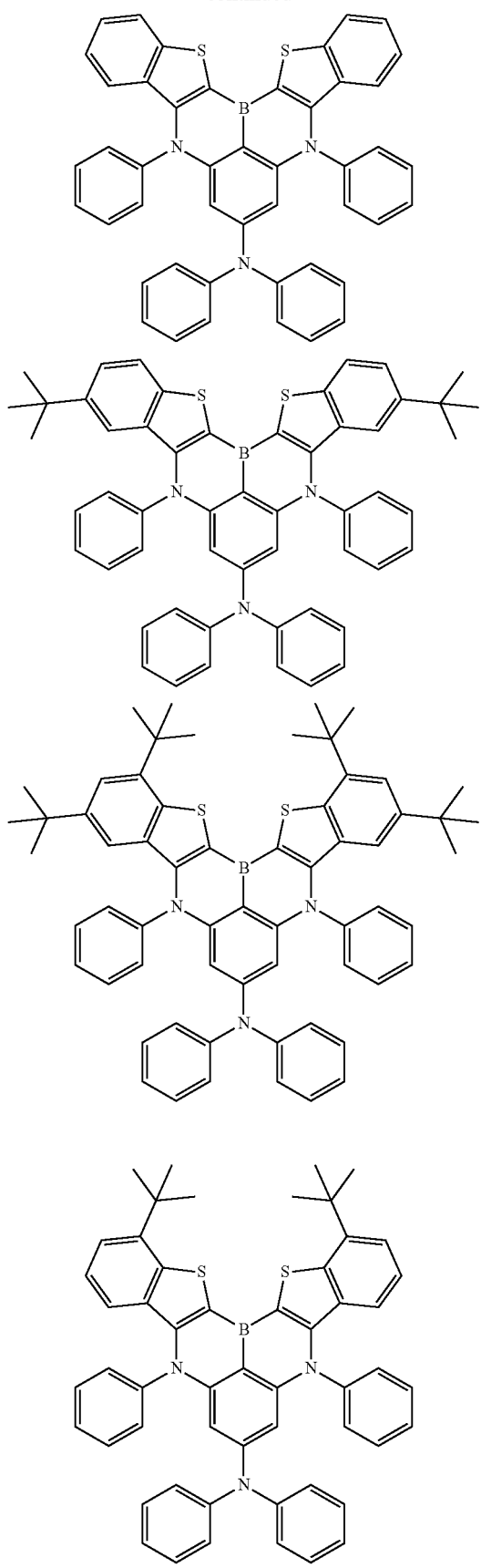
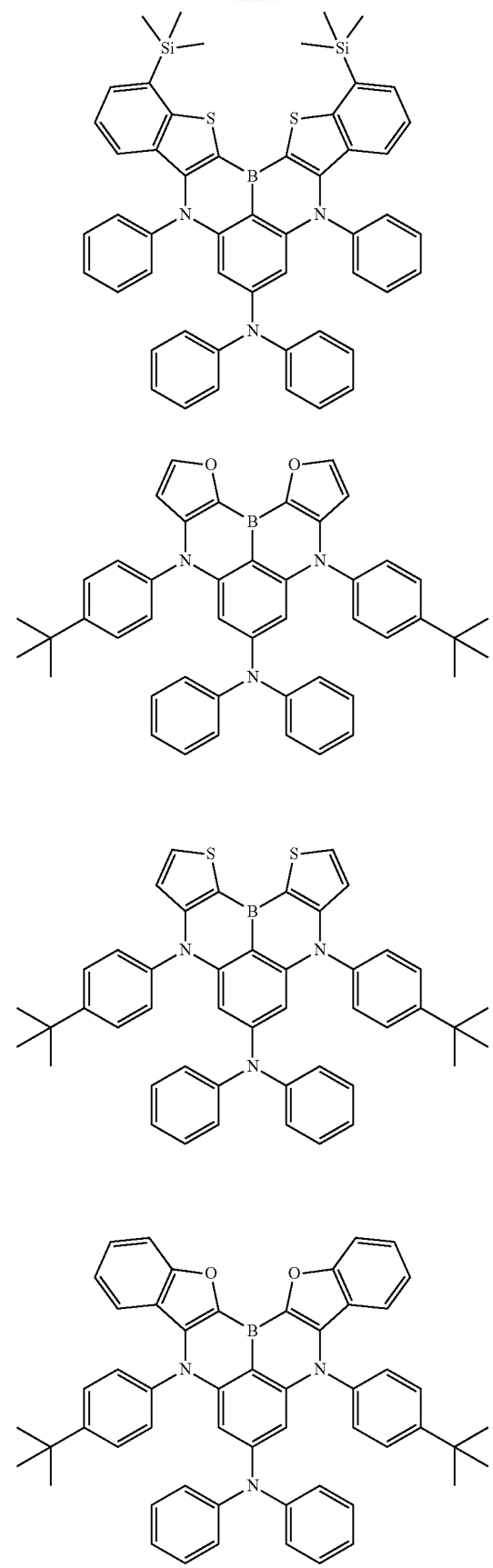

-continued
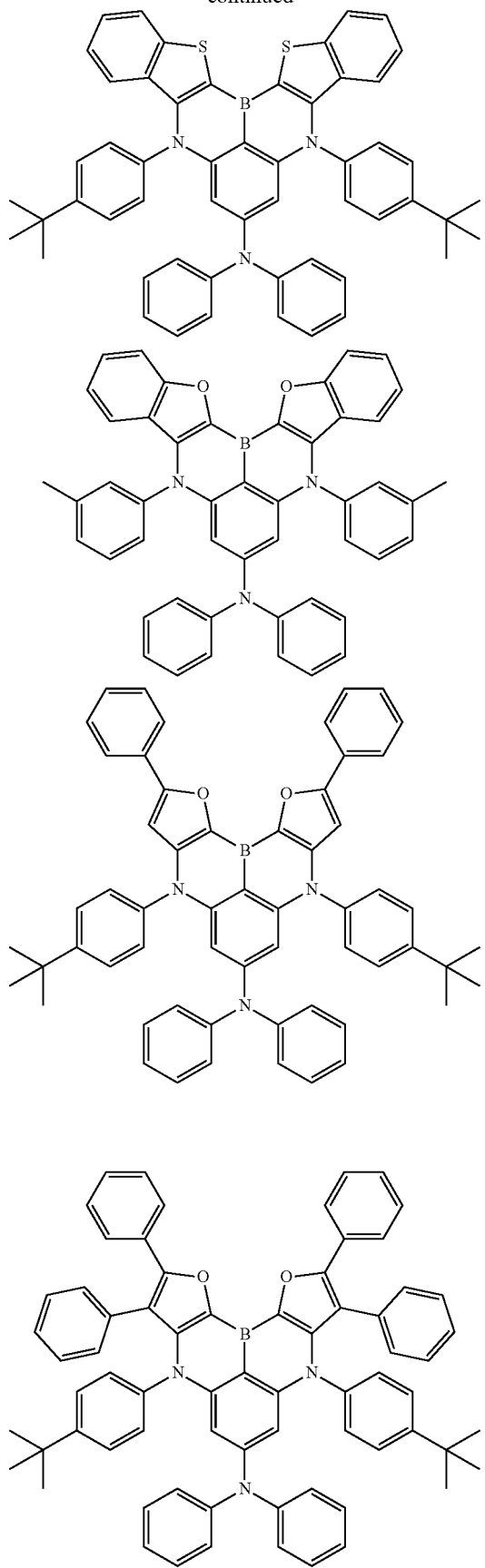
-continued
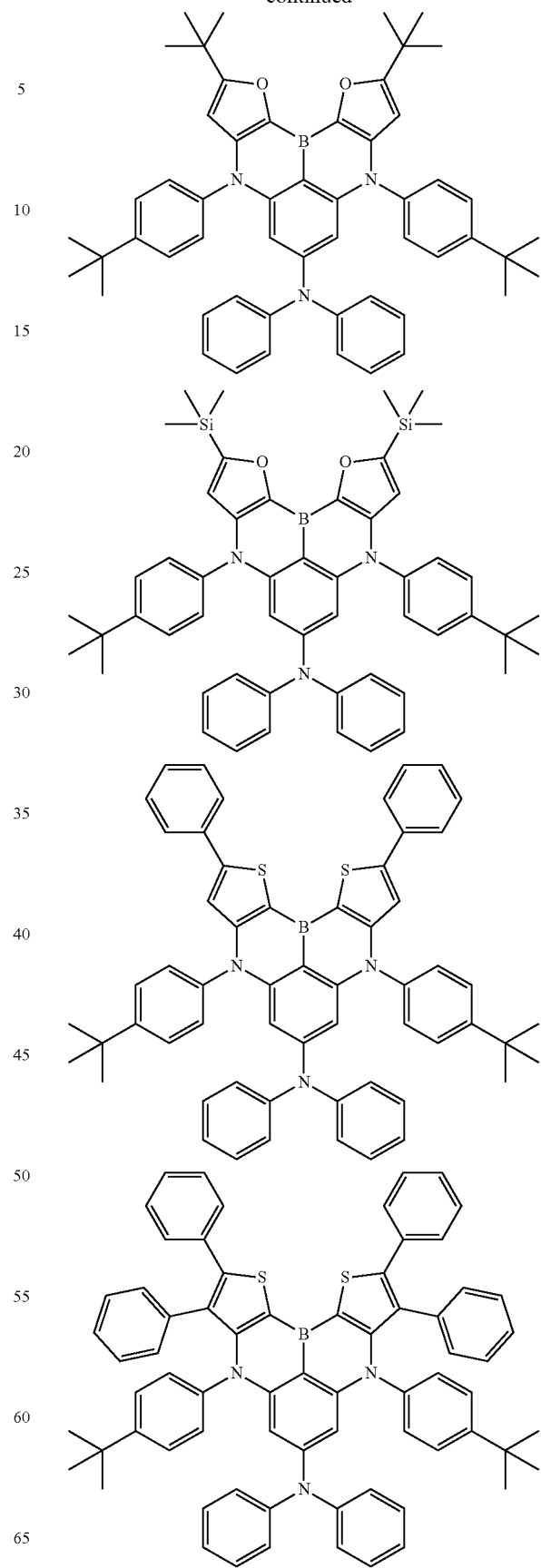

-continued
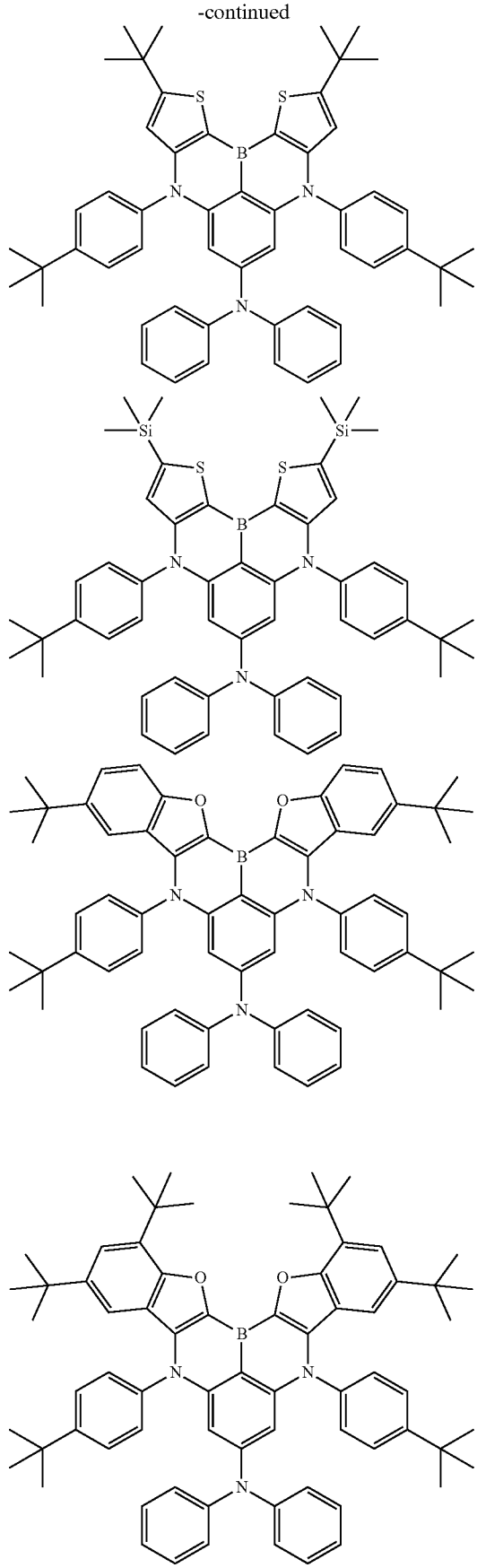
-continued
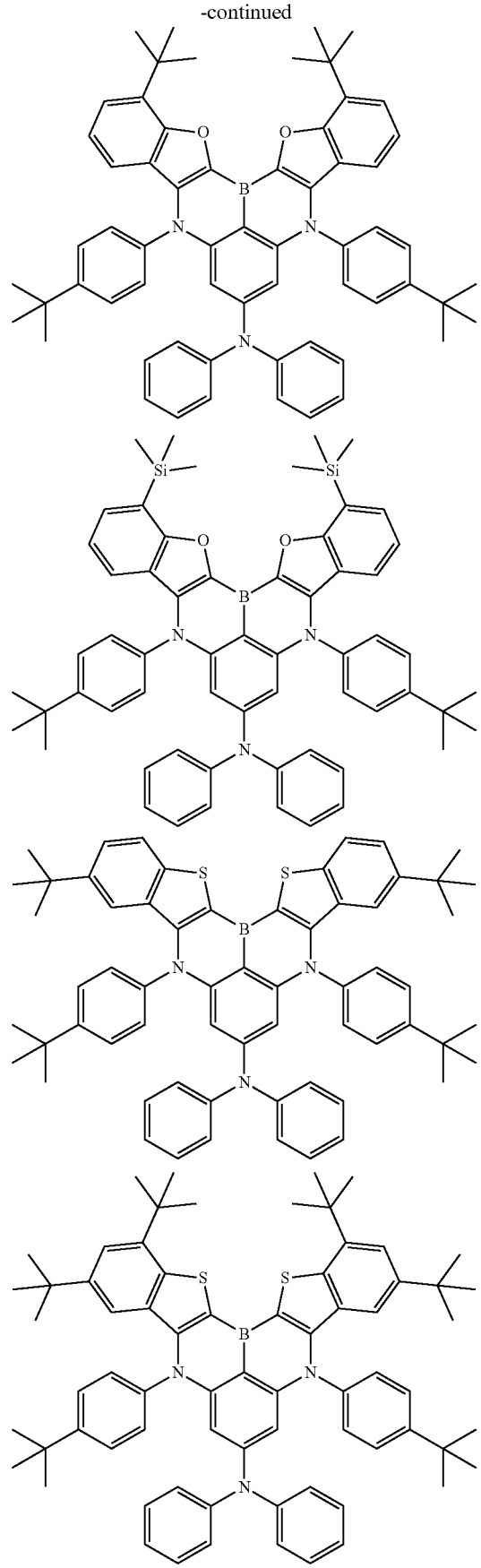

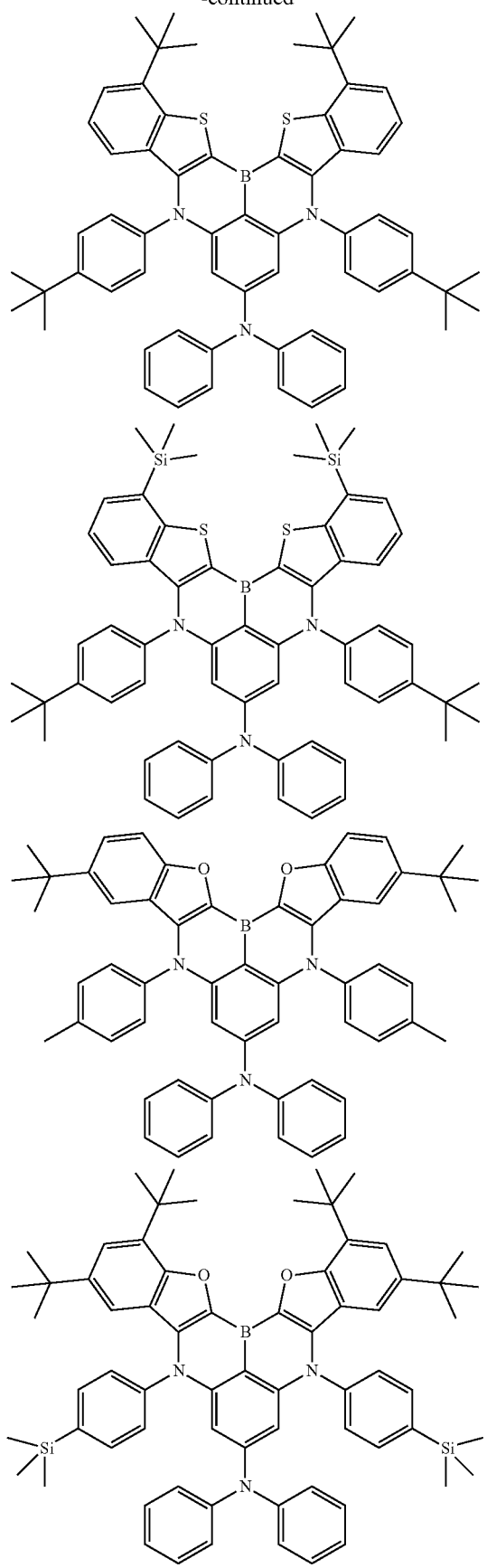
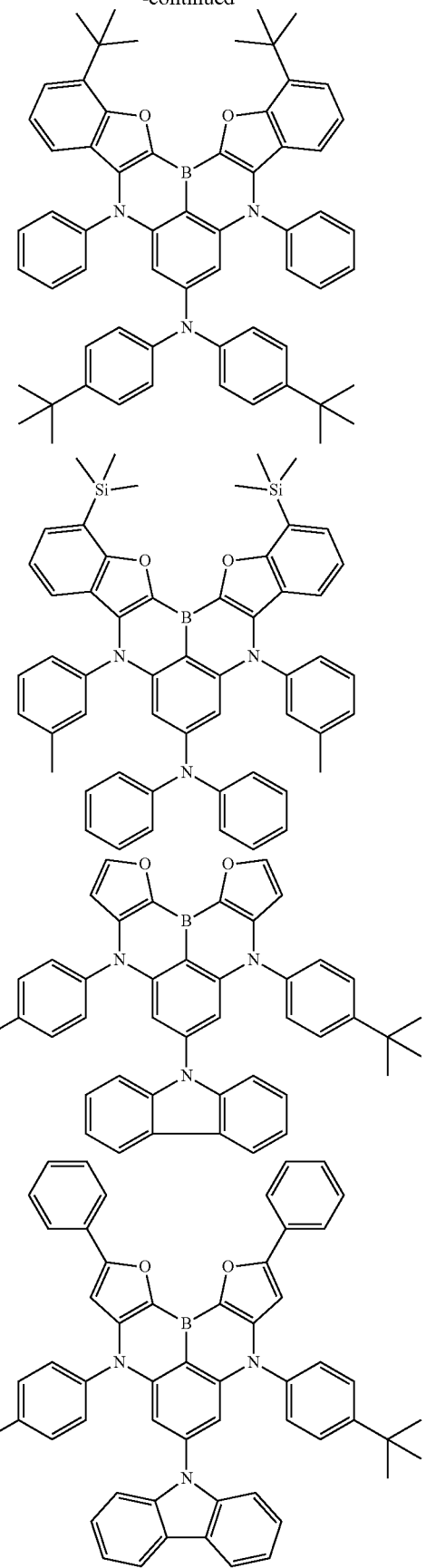

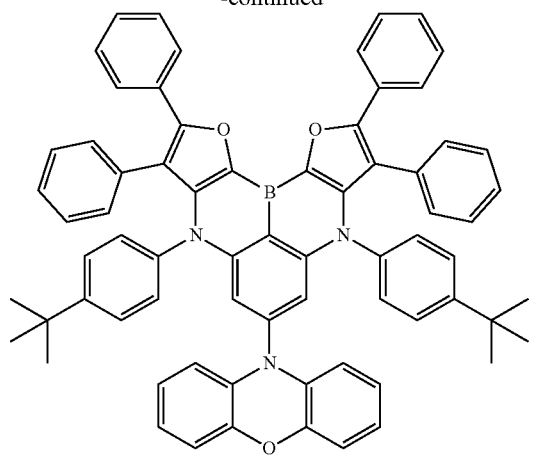
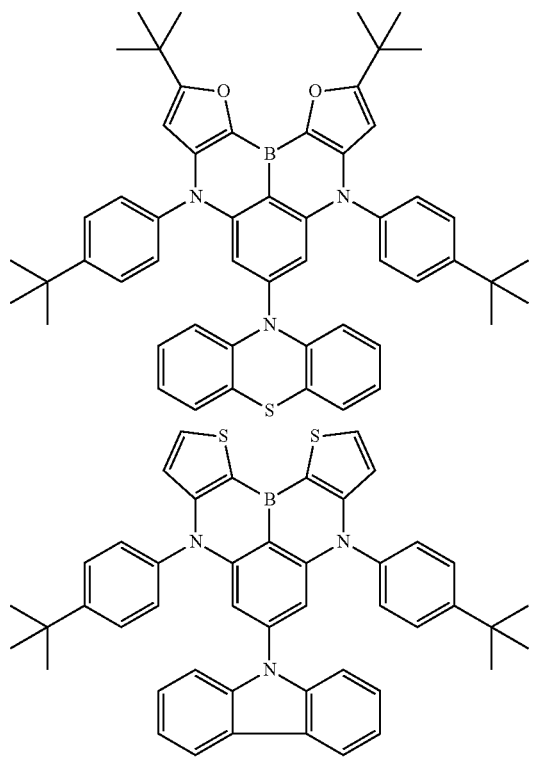
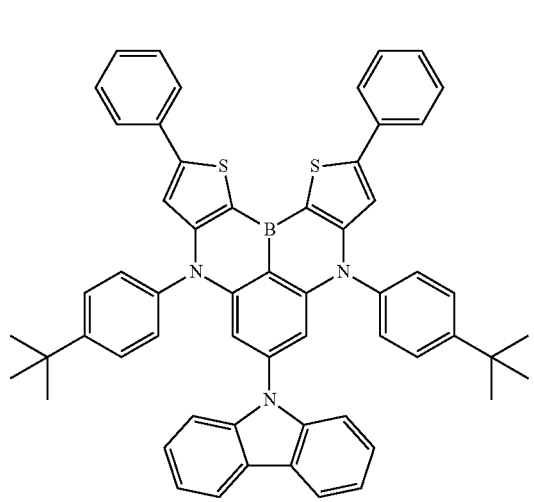
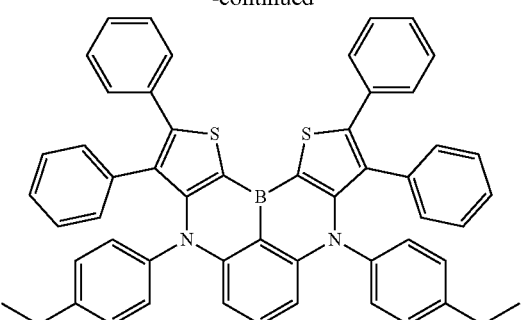
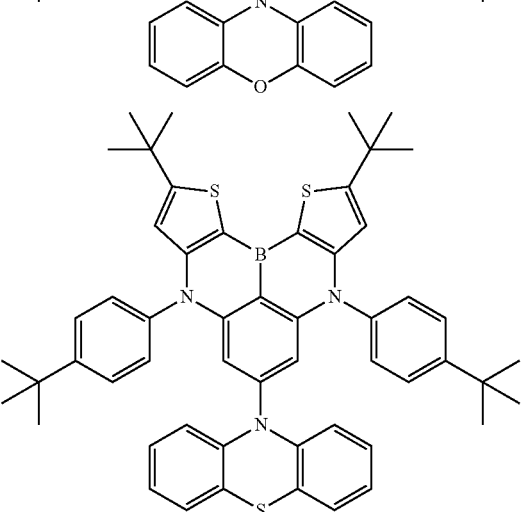
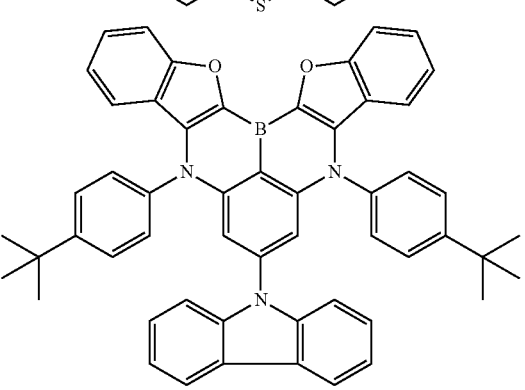
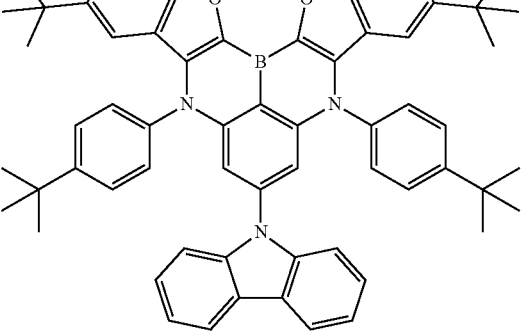

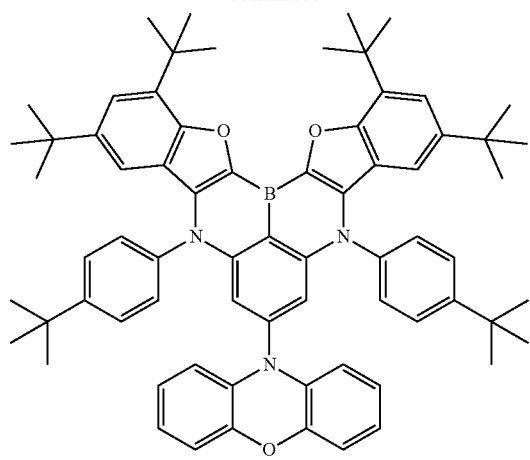
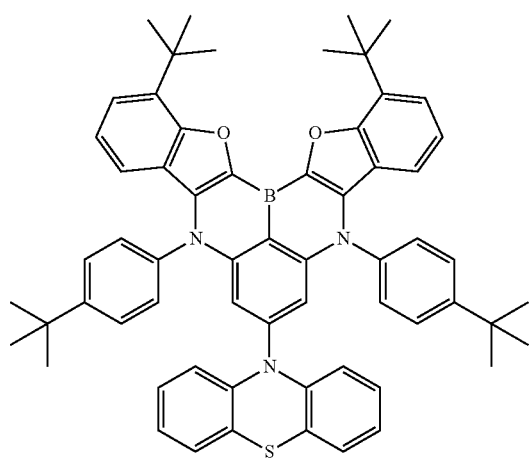
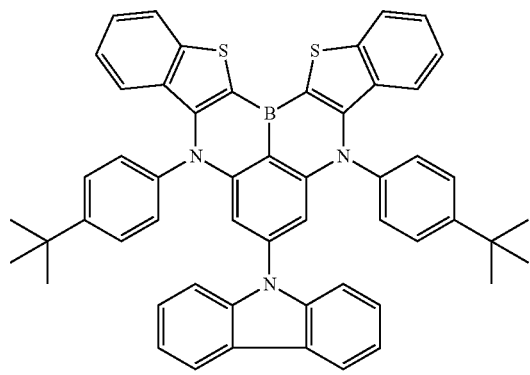
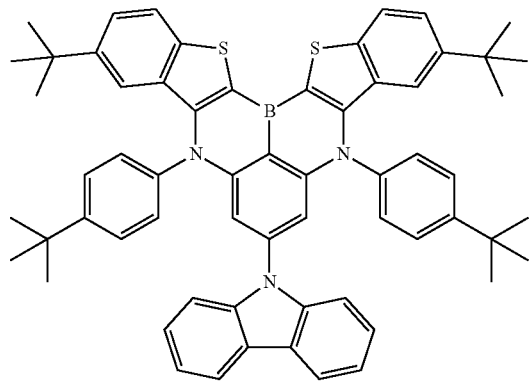
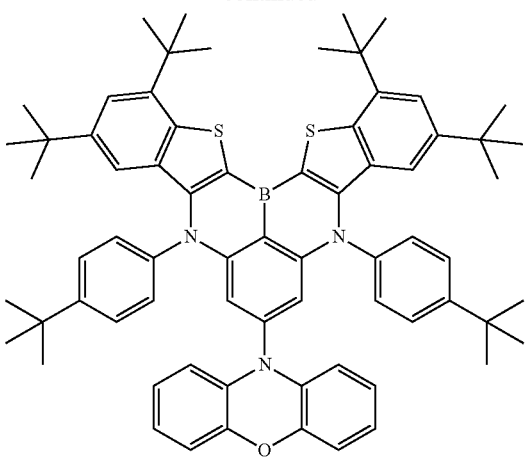
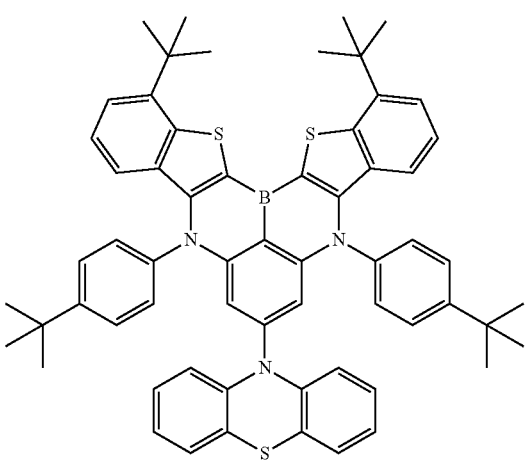
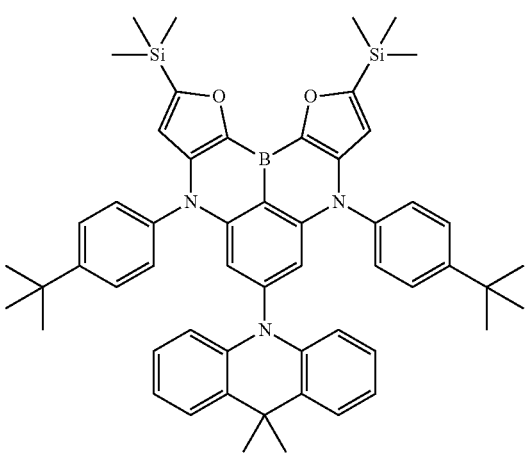

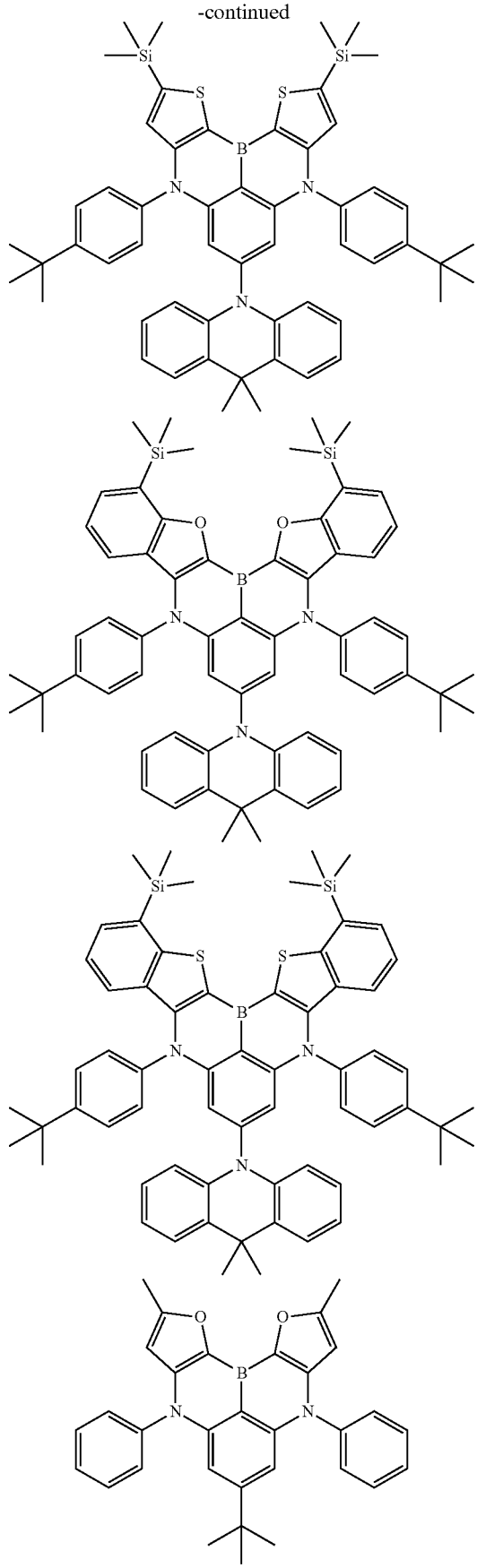
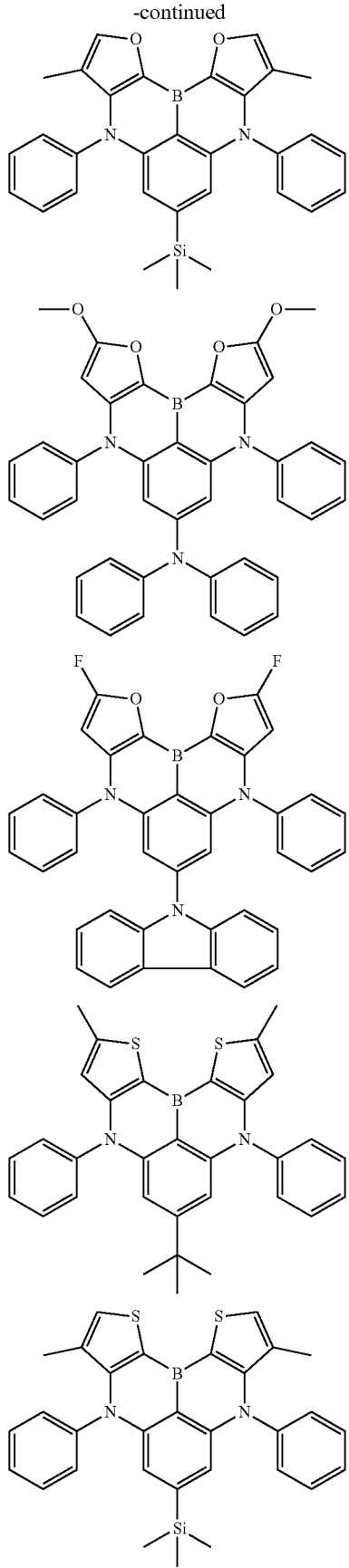

37
-continued
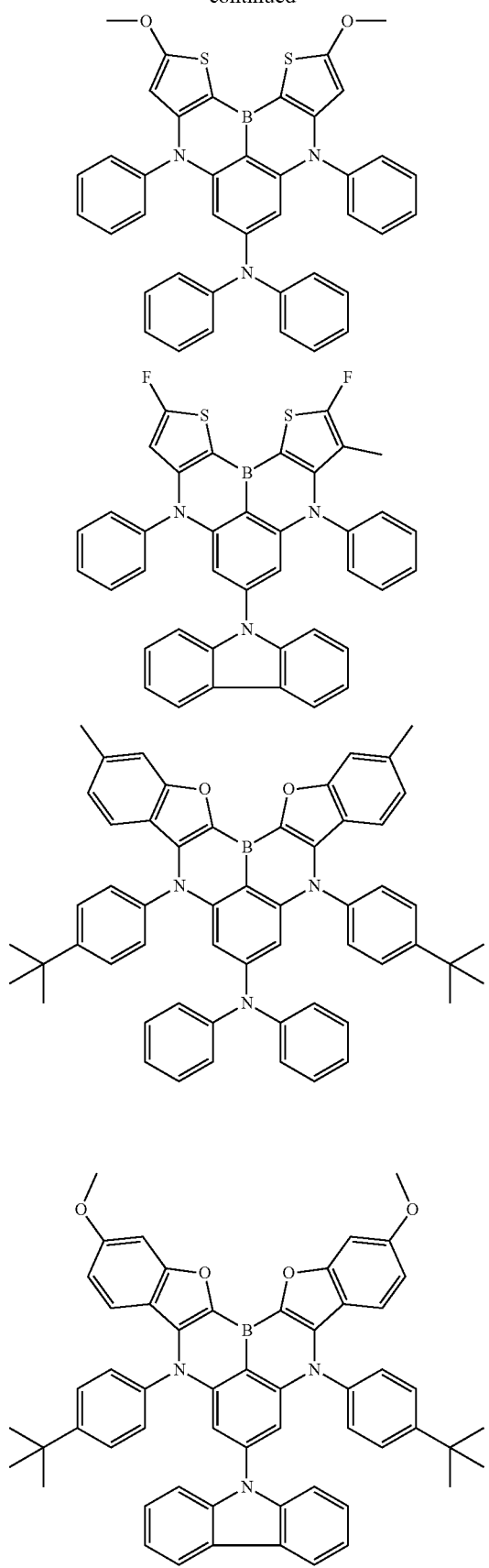
38
-continued
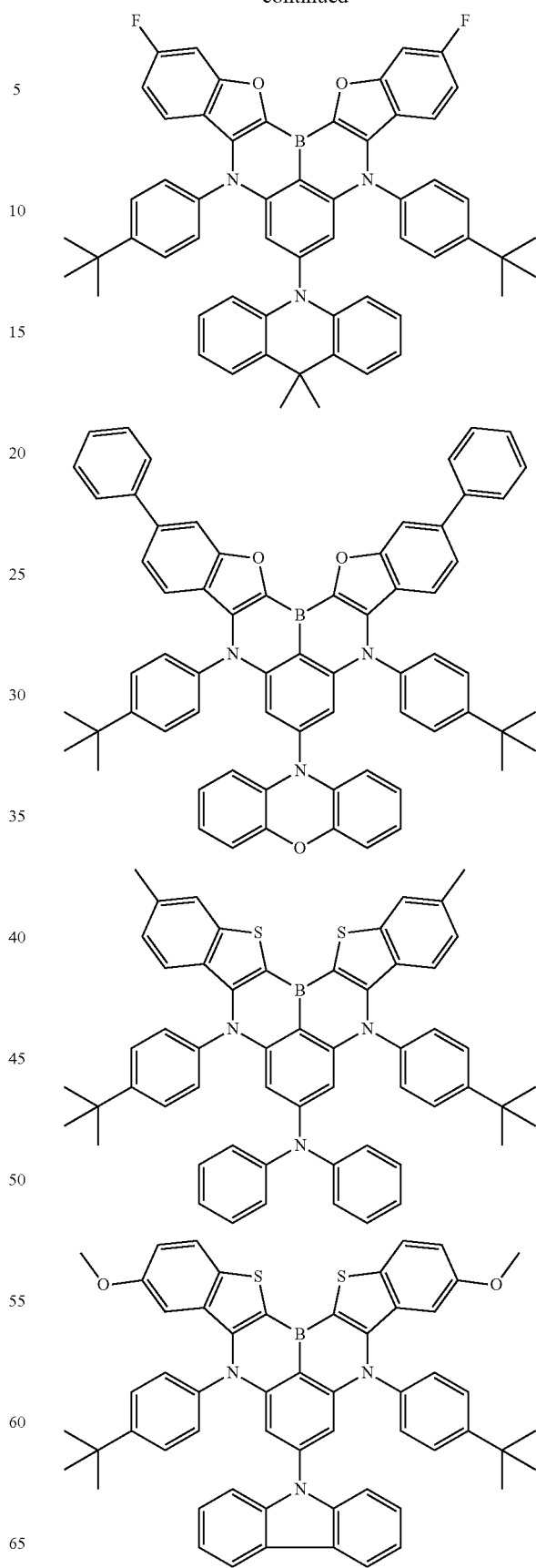

39
-continued
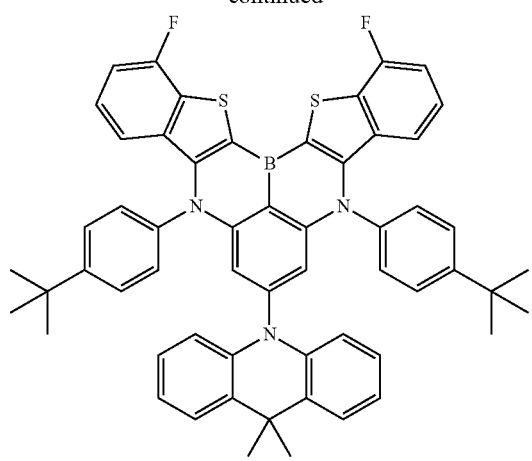
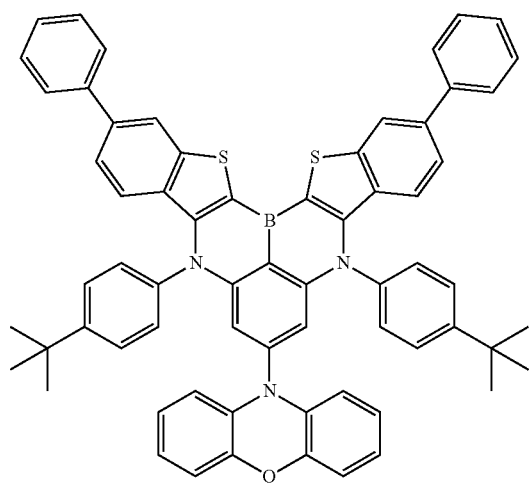
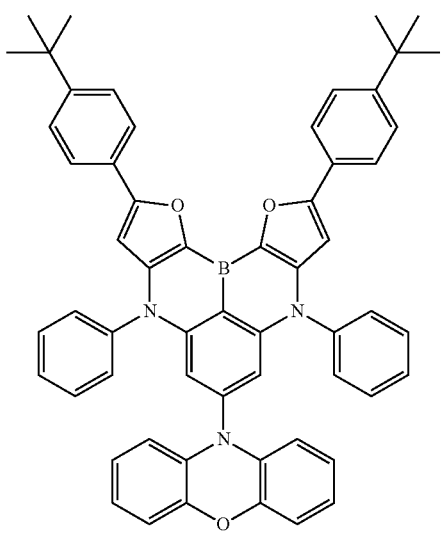
40
-continued
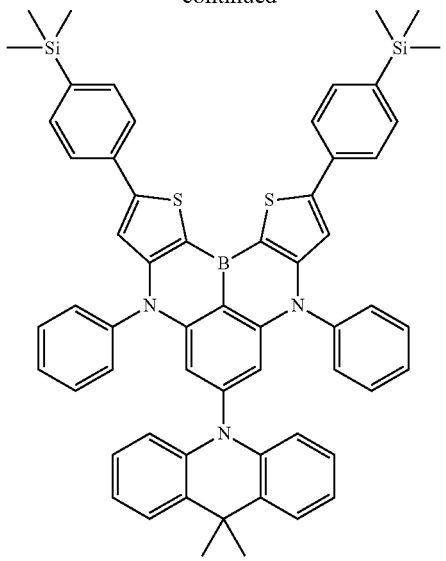
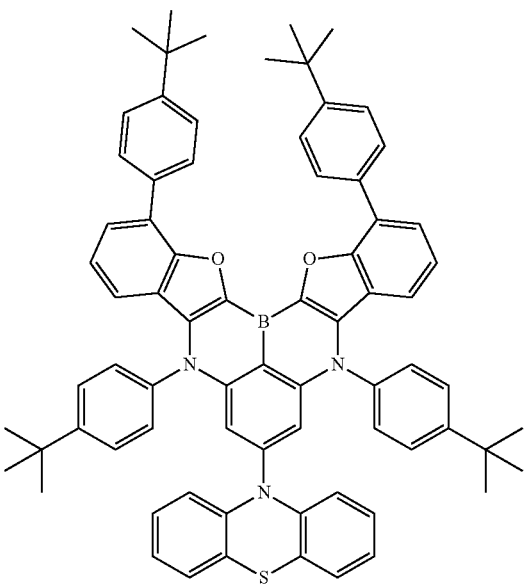
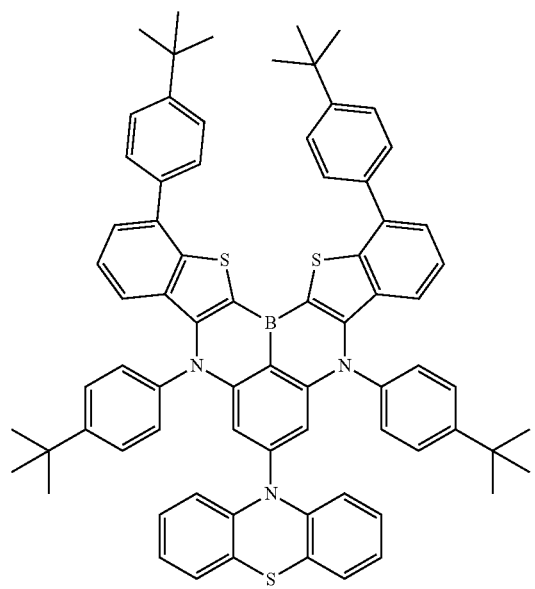

-continued
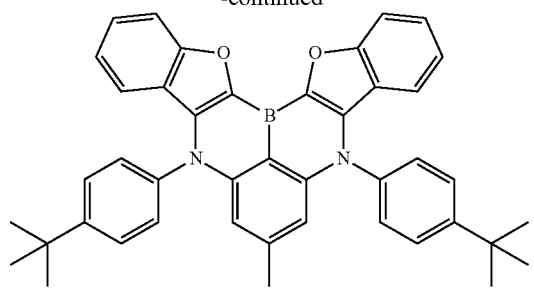
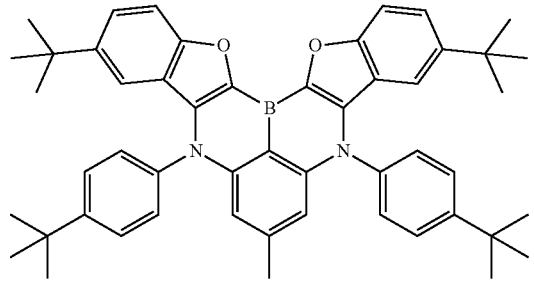
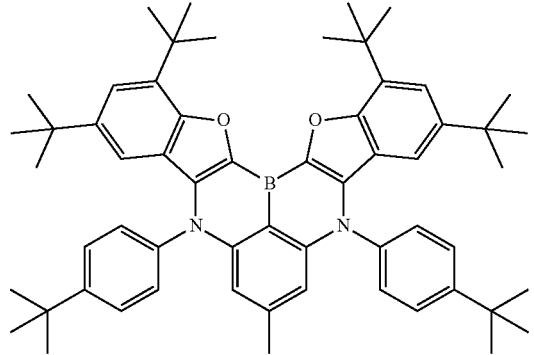
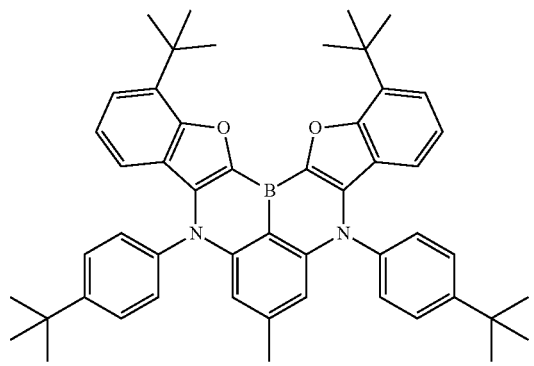
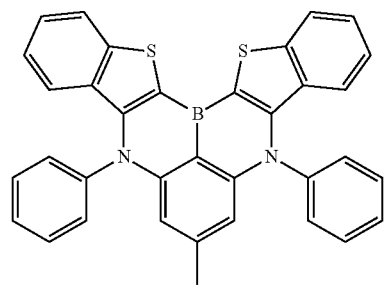
-continued
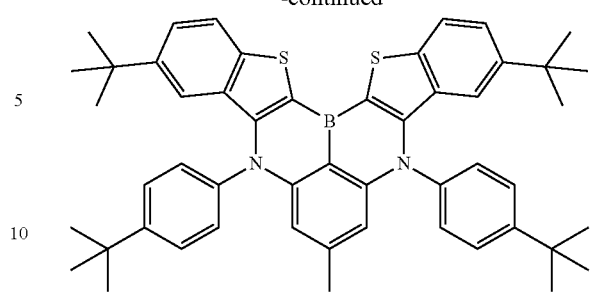
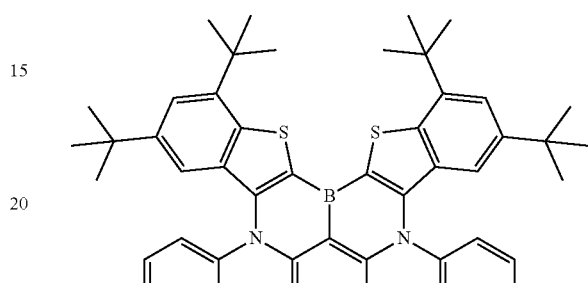
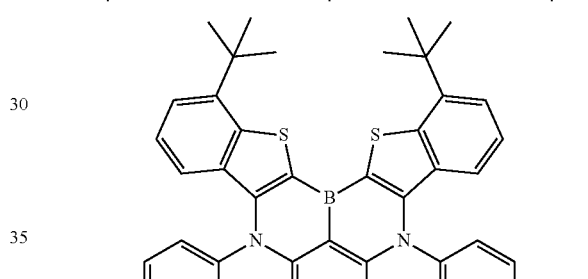
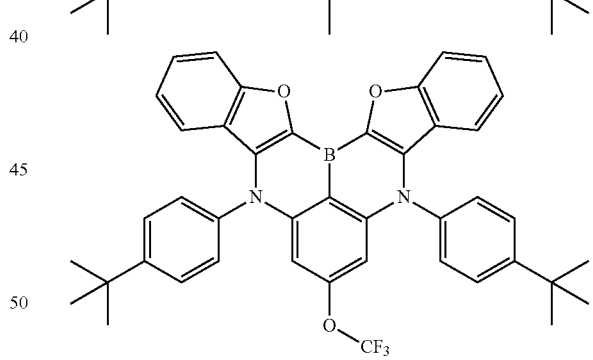
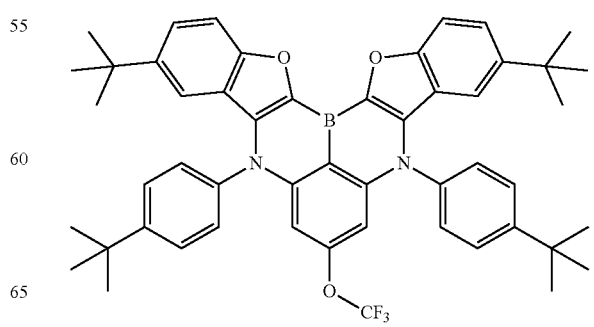

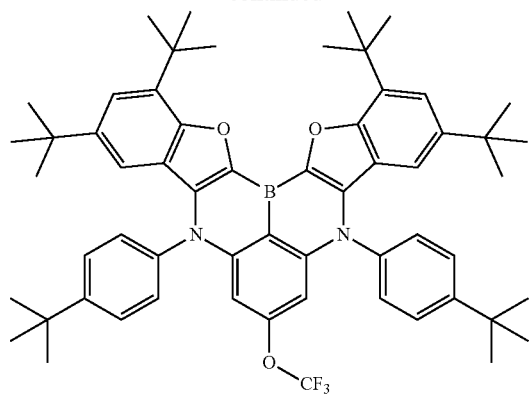
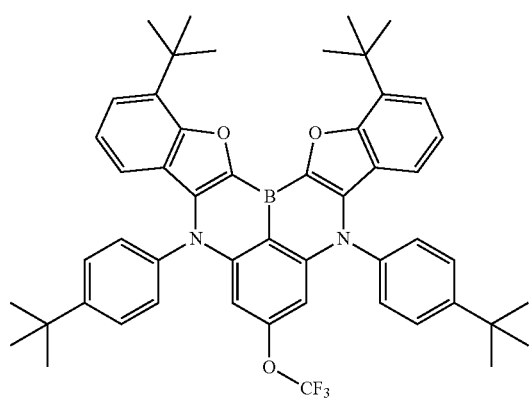
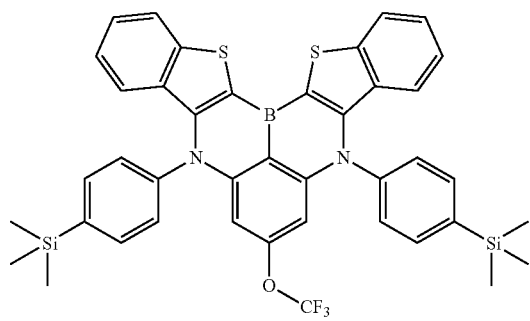
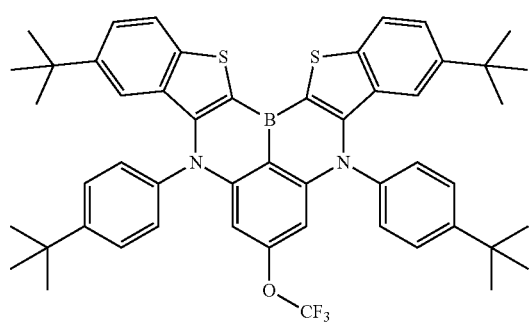
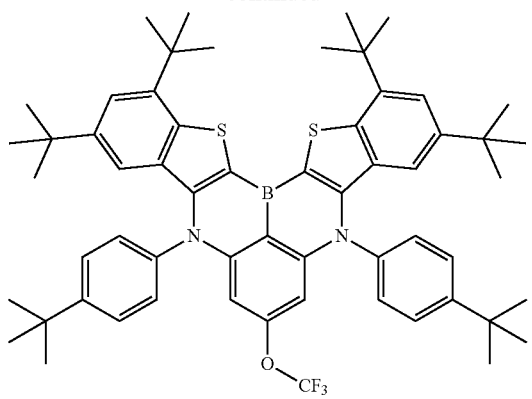
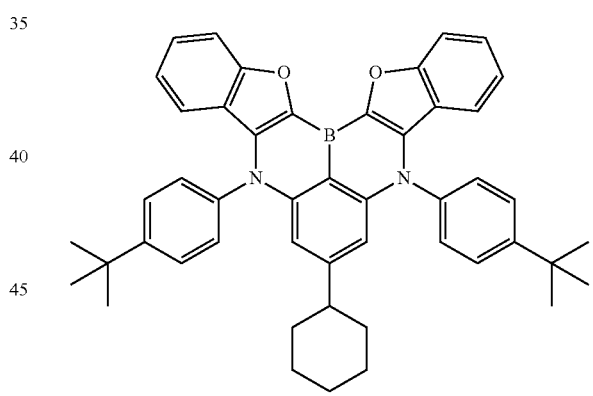
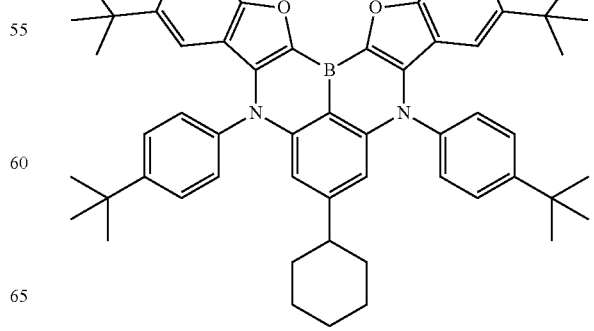

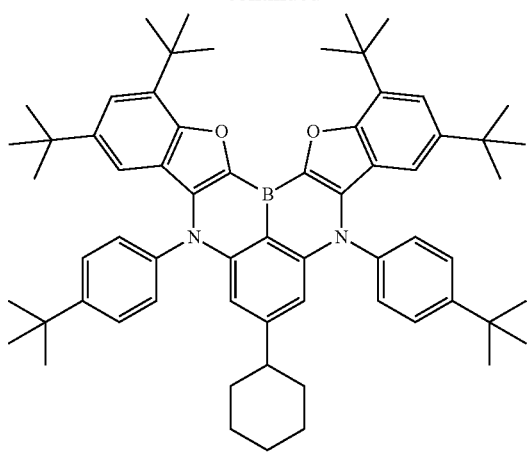
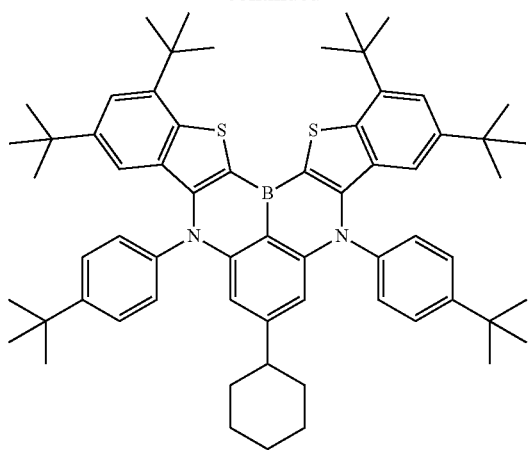
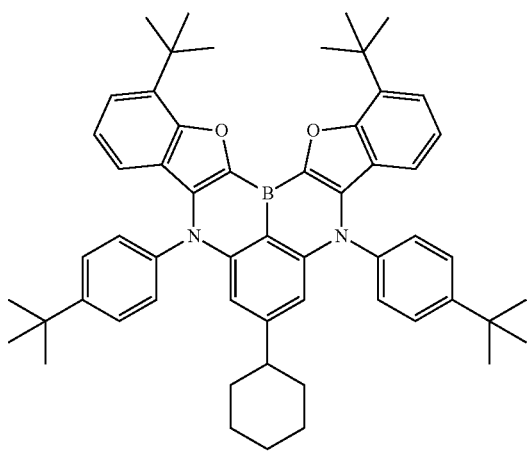
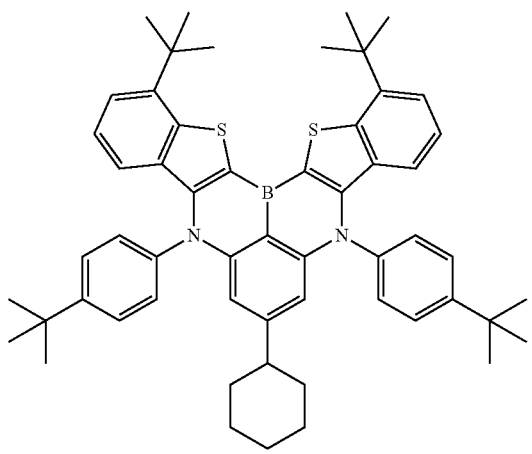
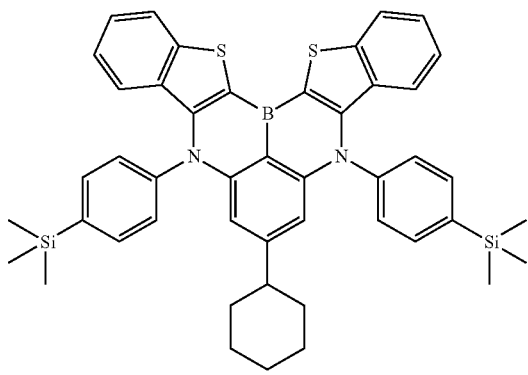
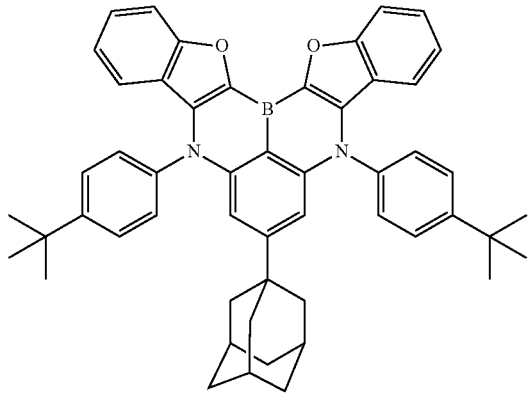
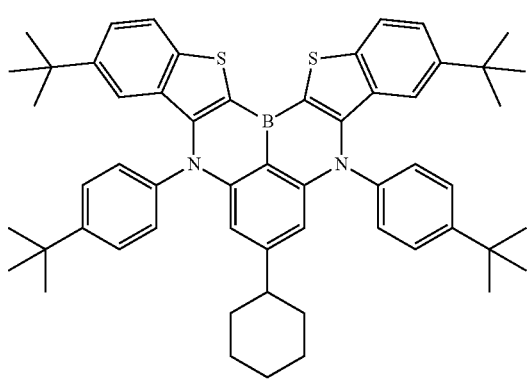
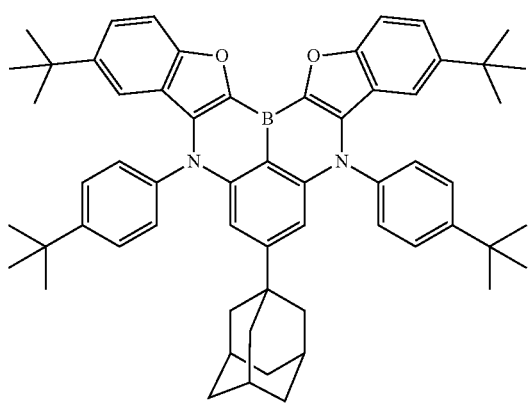

-continued
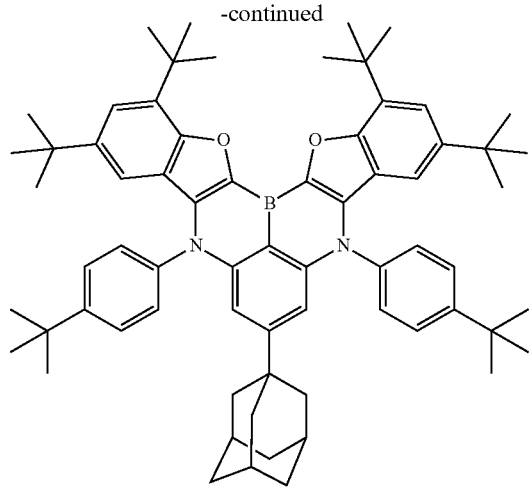
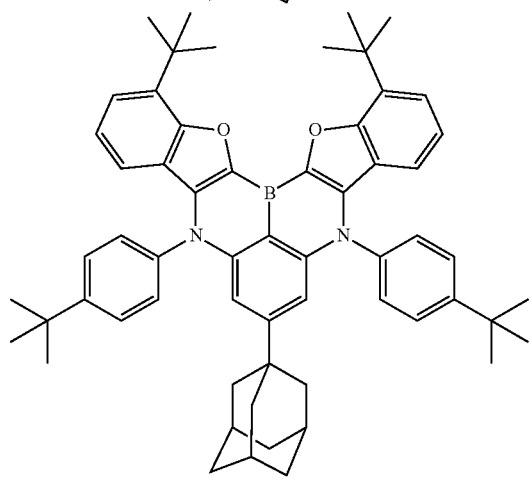
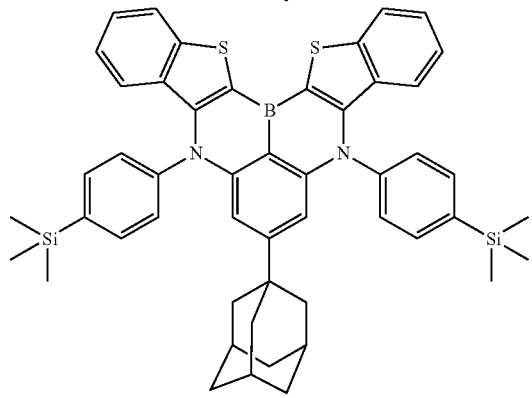
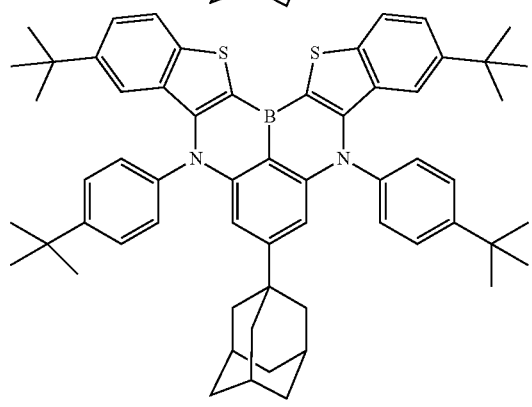
-continued
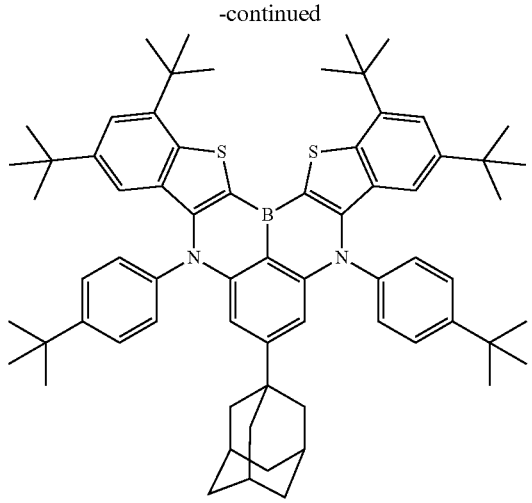
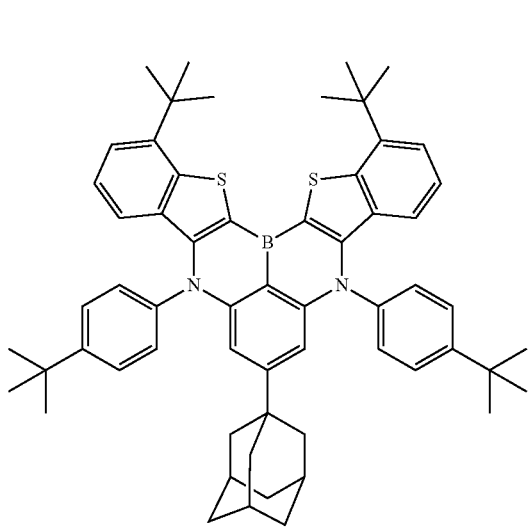
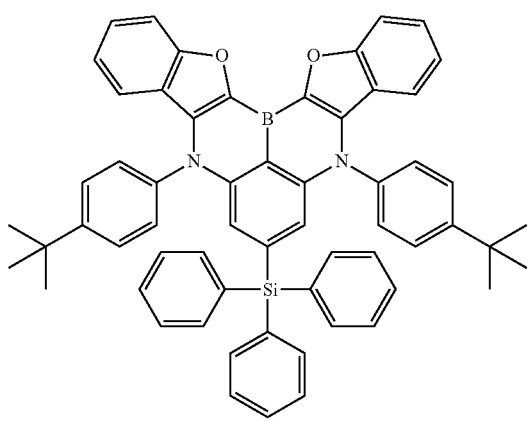

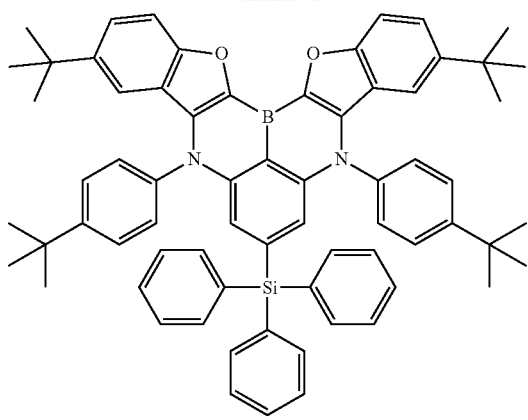
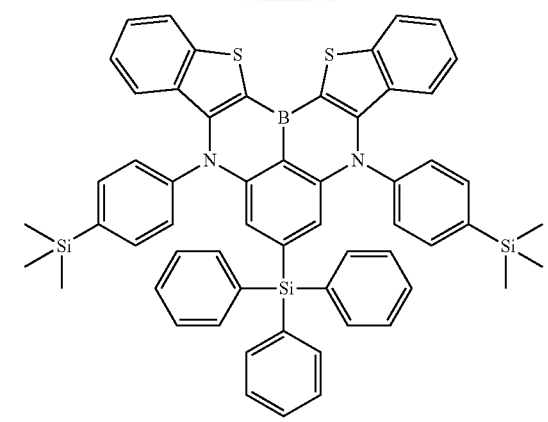
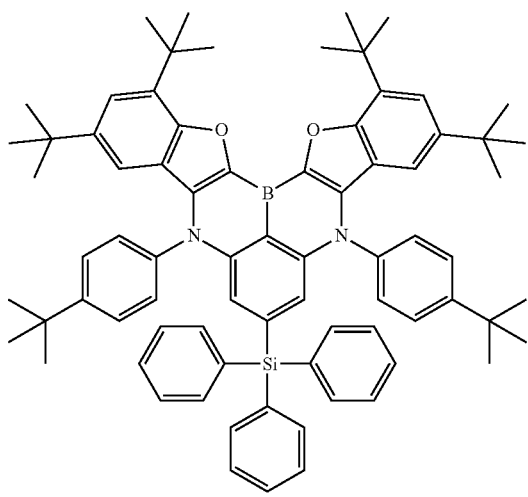
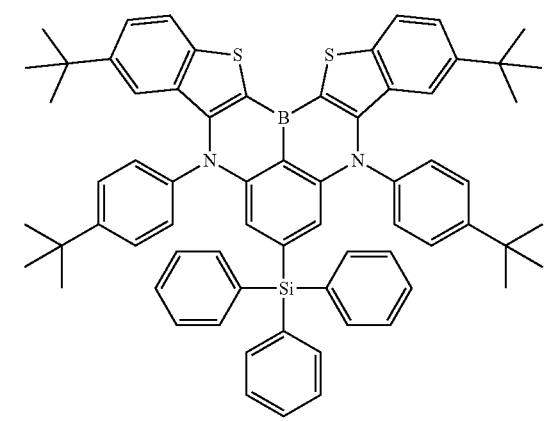
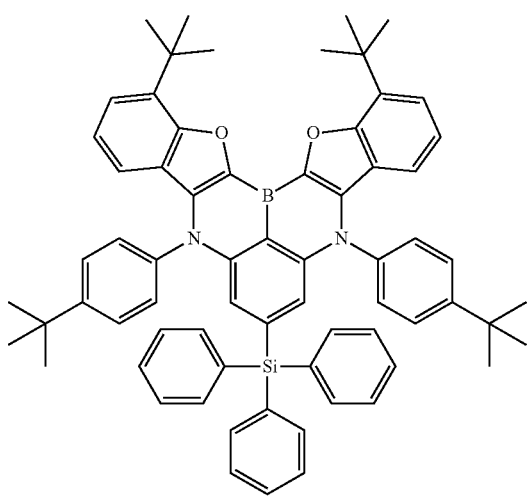
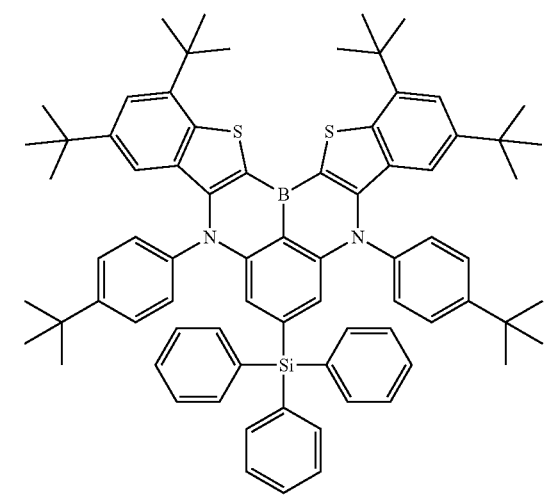

-continued
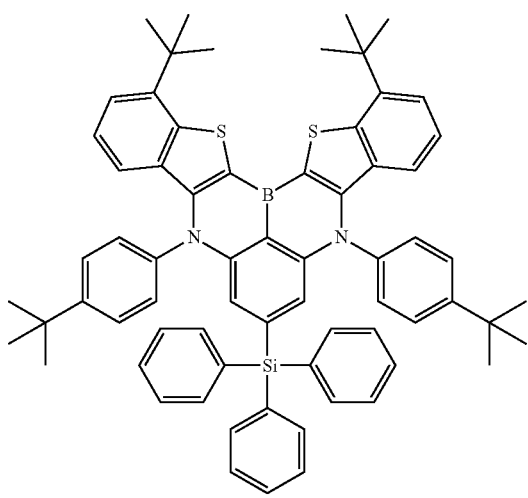
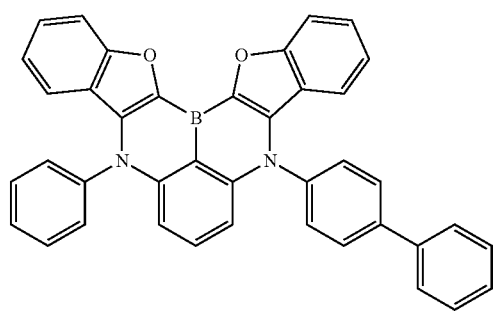
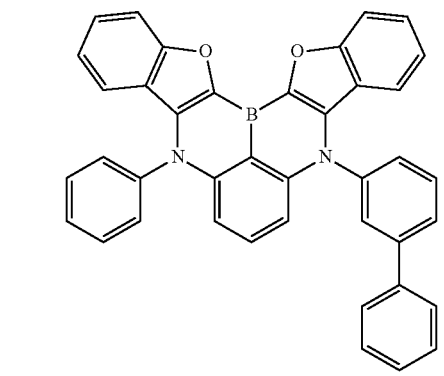
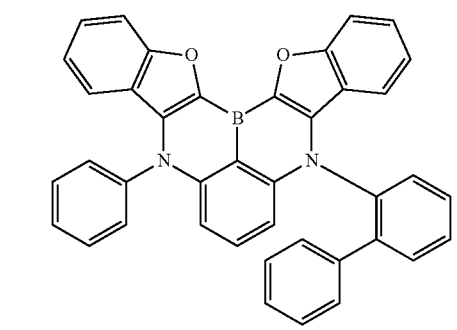
-continued
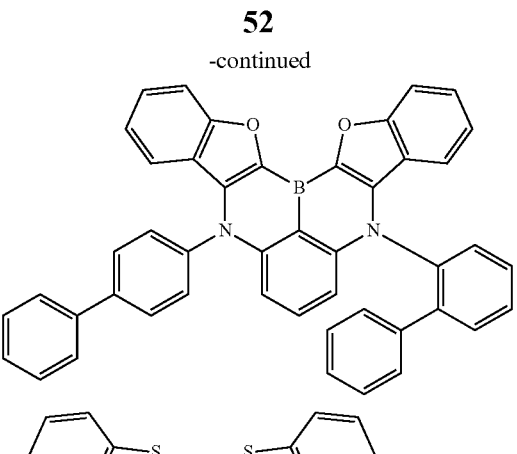
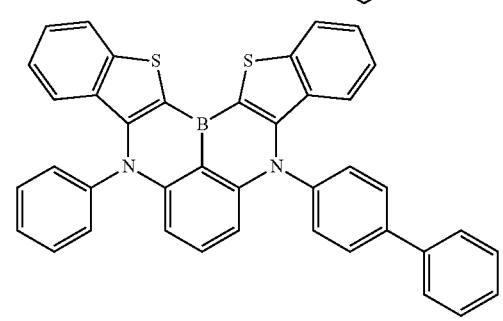
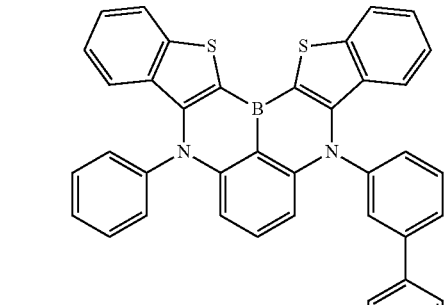
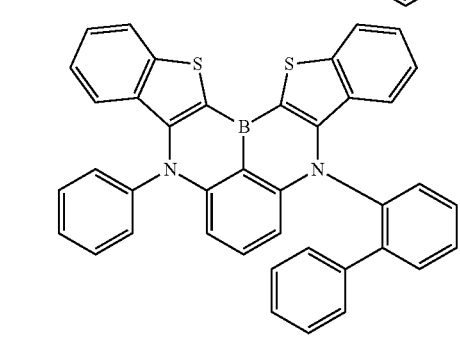
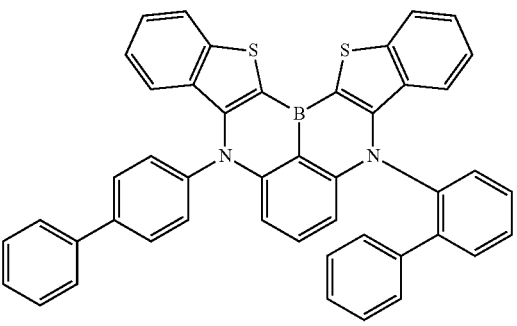

53
-continued
54
-continued
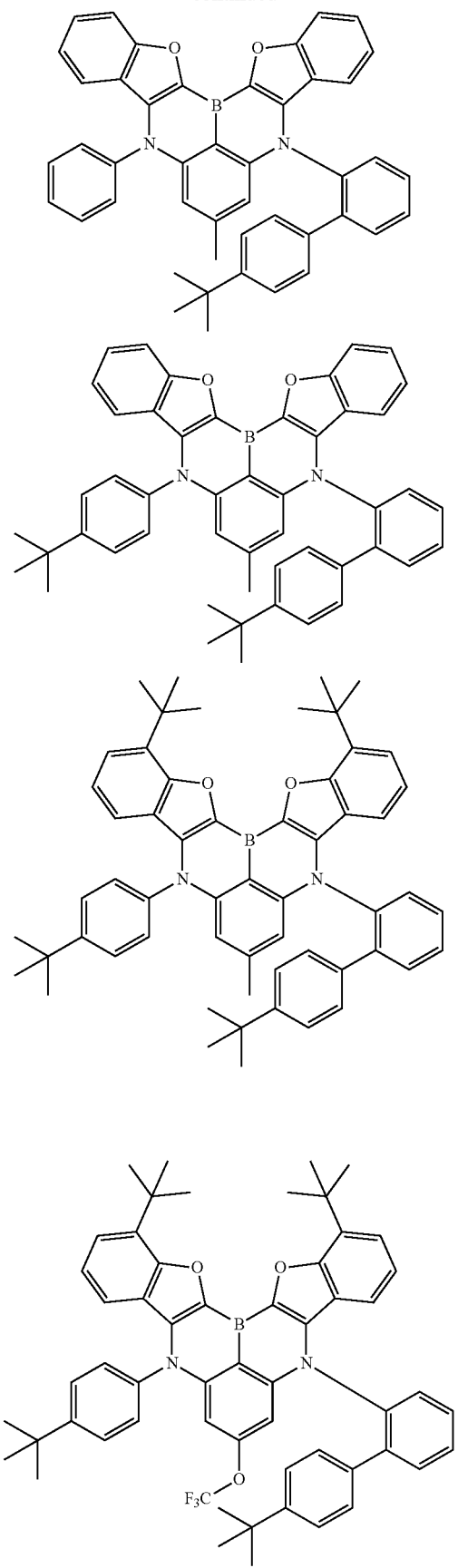
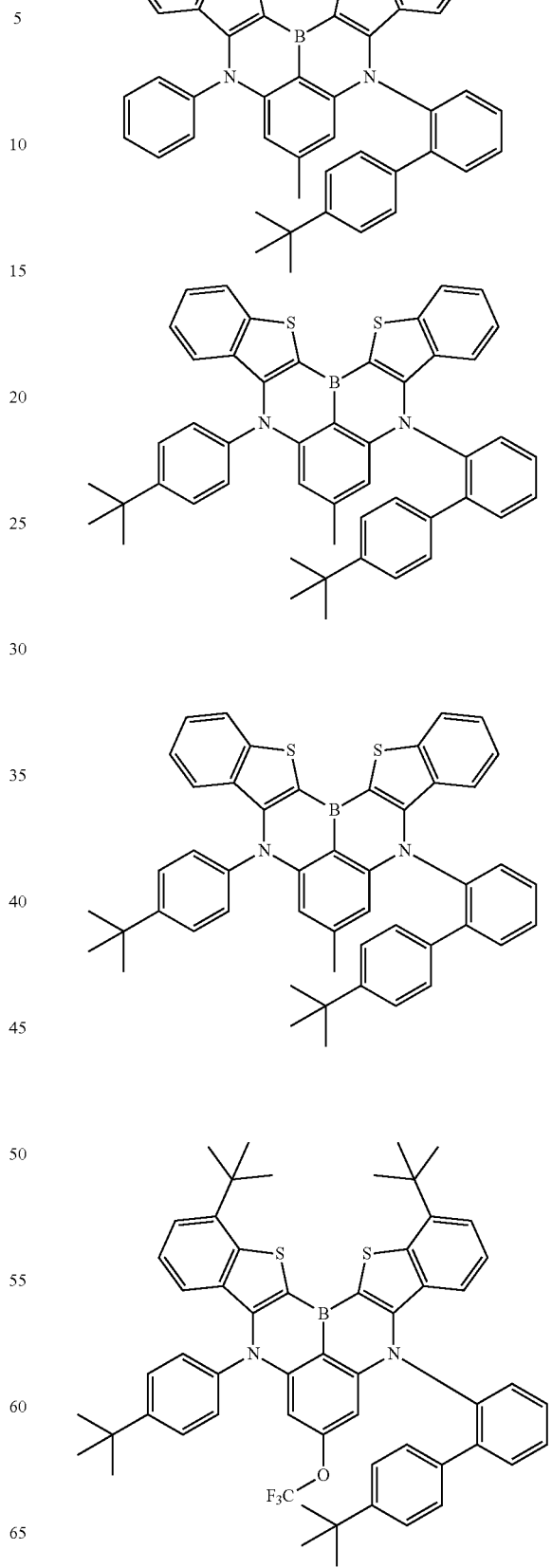

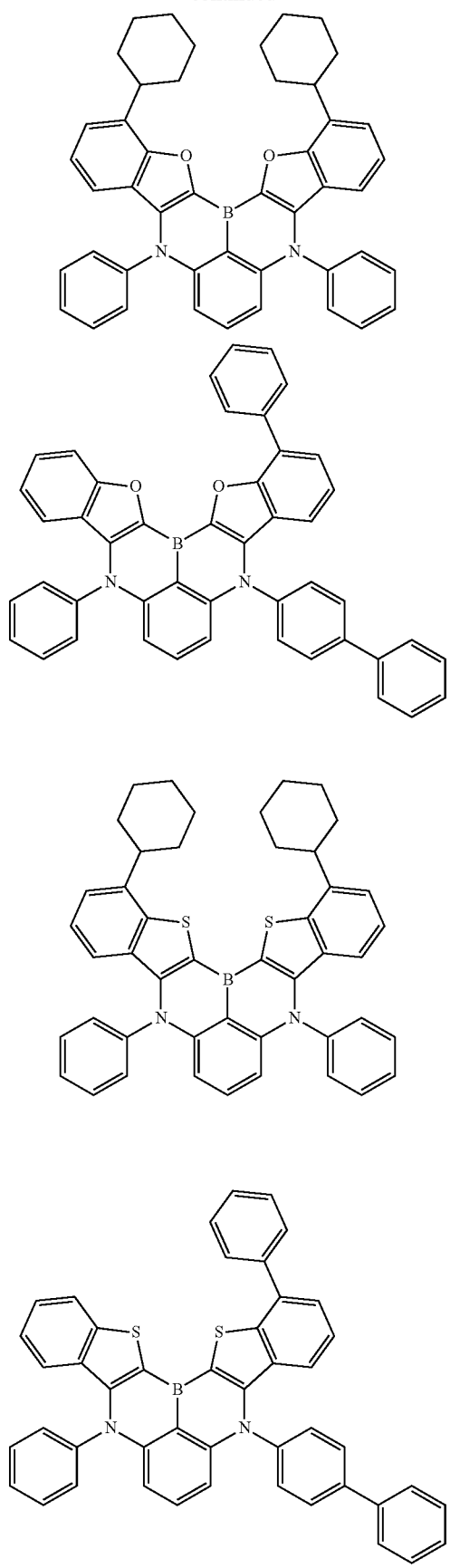
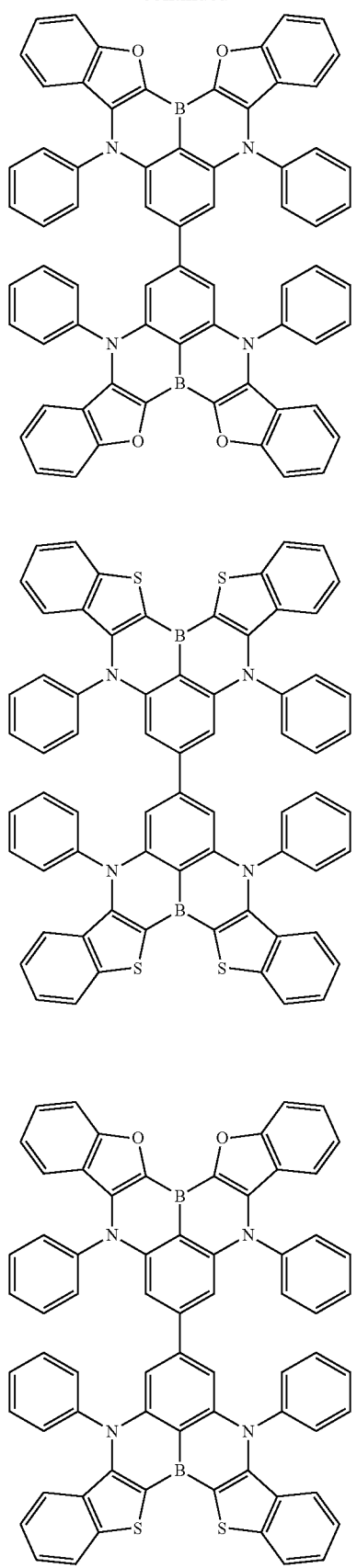

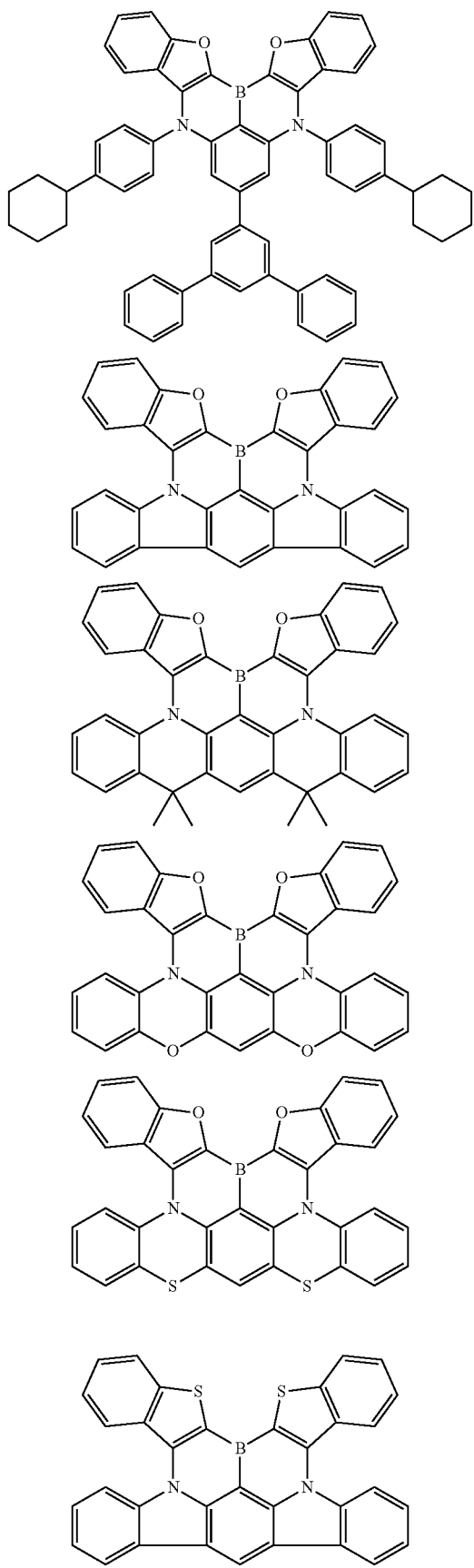

In addition, an organic electroluminescent device according to the present disclosure includes an anode; a cathode provided opposite to the anode; and a hole injection layer, a hole transfer layer, or a layer carrying out hole injection and transfer at the same time between the anode and the cathode, wherein the hole injection layer, the hole transfer layer, or the layer carrying out hole injection and transfer at the same time includes the heterocyclic compound of Chemical Formula 1.

The organic light emitting device of the present disclosure can be manufactured using common organic light emitting device manufacturing methods and materials except that one or more organic material layers are formed using the above-described compound.

The organic material layer of the organic light emitting device of the present disclosure can be formed in a single layer structure, but can also be formed in a multilayer structure in which two or more organic material layers are laminated. For example, the organic light emitting device of the present disclosure can have a structure including a hole injection layer, a hole transfer layer, a light emitting layer, an electron transfer layer, an electron injection layer and the like as the organic material layer. However, the structure of the organic light emitting device is not limited thereto, and can include a smaller number of organic material layers. In addition, the organic material layer can include one or more of an electron transfer layer, an electron injection layer, and a layer carrying out electron transfer and electron injection at the same time, and one or more layers of the above-described layers can include the compound.

Figures 1, 2:
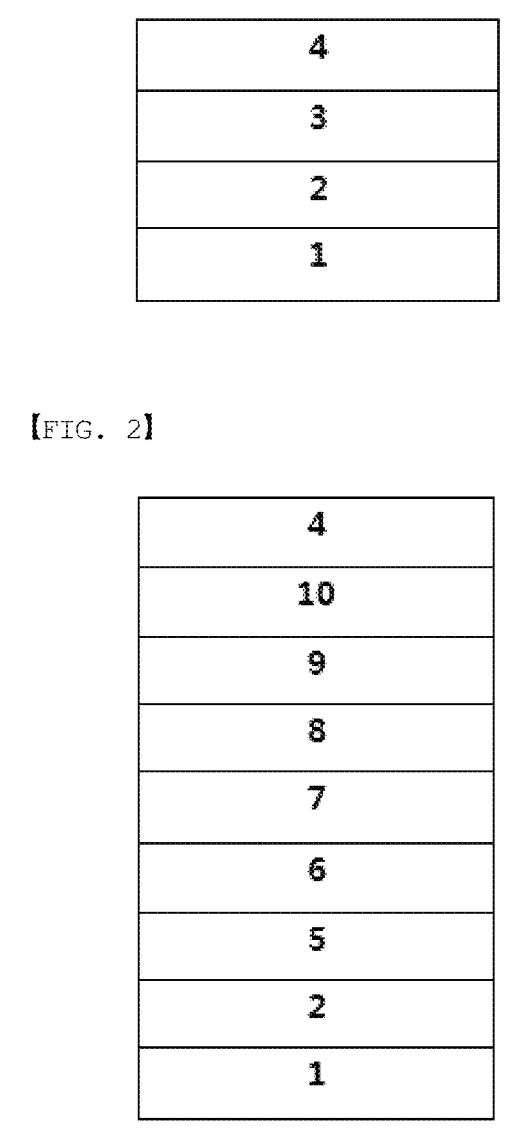

For example, the organic light emitting device of the present disclosure can have structures as illustrated in FIG. 1 and FIG. 2, however, the structure is not limited thereto.

FIG. 1 illustrates a structure of the organic light emitting device in which a first electrode (2), an organic material layer (3) and a second electrode (4) are consecutively laminated on a substrate (1).

FIG. 1 illustrates the organic light emitting device, and the structure is not limited thereto.

FIG. 2 illustrates a structure of the organic light emitting device in which a first electrode (2), a hole injection layer (5), a hole transfer layer (6), an electron blocking layer (7), a light emitting layer (8), an electron transfer layer (9), an electron injection layer (10) and a second electrode (4) are consecutively laminated on a substrate (1).

FIG. 2 illustrates the organic light emitting device, and the structure is not limited thereto.

In one embodiment of the present disclosure, the organic light emitting device has a structure consecutively laminating a substrate/a first electrode/an organic material layer/a second electrode.

In one embodiment of the present disclosure, the organic light emitting device has a structure consecutively laminating a substrate/a first electrode/an organic material layer/a light emitting layer/a second electrode.

In one embodiment of the present disclosure, the organic light emitting device has a structure consecutively laminating a substrate/a first electrode/a light emitting layer/an organic material layer/a second electrode.

In one embodiment of the present disclosure, the organic light emitting device has a structure consecutively laminating a substrate/a first electrode/an organic material layer/a light emitting layer/an organic material layer/a second electrode.

In one embodiment of the present disclosure, the organic light emitting device has a structure consecutively laminating a substrate/a first electrode/a hole injection layer/a light emitting layer/an organic material layer/a second electrode.

In one embodiment of the present disclosure, the organic light emitting device has a structure consecutively laminating a substrate/a first electrode/a hole injection layer/an electron blocking layer/a light emitting layer/an electron injection layer/a second electrode.

In one embodiment of the present disclosure, the organic light emitting device has a structure consecutively laminating a substrate/a first electrode/a hole injection layer/an electron blocking layer/a light emitting layer/an electron transfer layer/an electron injection layer/a second electrode.

In one embodiment of the present disclosure, the organic light emitting device has a structure consecutively laminating a substrate/a first electrode/a hole injection layer/a hole transfer layer/an electron blocking layer/a light emitting layer/a hole blocking layer/an electron transfer layer/an electron injection layer/a second electrode.

In one embodiment of the present disclosure, the organic material layer including the heterocyclic compound of Chemical Formula 1 includes a light emitting layer, and can include the heterocyclic compound of Chemical Formula 1 in the light emitting layer.

In one embodiment of the present disclosure, the organic material layer including the heterocyclic compound of Chemical Formula 1 includes a light emitting layer, and includes a host and a dopant in the light emitting layer.

In one embodiment of the present disclosure, the organic material layer including the heterocyclic compound of Chemical Formula 1 includes a light emitting layer, and includes a host and a dopant in the light emitting layer in a weight ratio of 99:1 to 1:99.

In one embodiment of the present disclosure, the organic material layer including the heterocyclic compound of Chemical Formula 1 includes a light emitting layer, and includes a host and a dopant in the light emitting layer in a weight ratio of 99:1 to 50:50.

In one embodiment of the present disclosure, the organic material layer including the heterocyclic compound of Chemical Formula 1 includes a light emitting layer, and includes the heterocyclic compound of Chemical Formula 1 as a dopant in the light emitting layer.

In one embodiment of the present disclosure, the organic material layer including the heterocyclic compound of Chemical Formula 1 includes a light emitting layer, and can use an organic compound as a host of the light emitting layer.

In one embodiment of the present disclosure, the organic material layer including the heterocyclic compound of Chemical Formula 1 includes a light emitting layer, and can use an anthracene-based organic compound as a host of the light emitting layer.

In one embodiment of the present disclosure, the organic material layer including the heterocyclic compound of Chemical Formula 1 includes an electron injection layer, an electron transfer layer, an electron injection and transfer layer, or a hole blocking layer, and can include the heterocyclic compound of Chemical Formula 1 in the electron injection layer, the electron transfer layer, the electron injection and transfer layer, or the hole blocking layer.

In one embodiment of the present disclosure, the organic material layer including the heterocyclic compound of Chemical Formula 1 includes a hole injection layer, a hole transfer layer, a hole injection and transfer layer, and an electron blocking layer, and can include the heterocyclic compound of Chemical Formula 1 in the hole injection layer, the hole transfer layer, the hole injection and transfer layer, and the electron blocking layer.

For example, the organic light emitting device according to the present disclosure can be manufactured by forming an anode on a substrate by depositing a metal, a metal oxide having conductivity, or an alloy thereof using a physical vapor deposition (PVD) method such as sputtering or e-beam evaporation, and forming an organic material layer including a hole injection layer, a hole transfer layer, a light emitting layer and an electron transfer layer, and an organic material layer including the heterocyclic compound of Chemical Formula 1, and then depositing a material capable of being used as a cathode thereon. In addition to such a method, the organic light emitting device can also be manufactured by consecutively depositing a cathode material, an organic material layer and an anode material on a substrate.

As the anode material, materials having large work function are normally preferred so that hole injection to an organic material layer is smooth. Specific examples of the anode material capable of being used in the present disclosure include metals such as vanadium, chromium, copper, zinc and gold, or alloys thereof; metal oxides such as zinc oxide, indium oxide, indium tin oxide (ITO) and indium zinc oxide (IZO); combinations of metals and oxides such as $ZnO:Al$ or $SnO_2:Sb$; conductive polymers such as poly(3-methylthiophene), poly[3,4-(ethylene-1,2-dioxy)thiophene] (PEDT), polypyrrole and polyaniline, but are not limited thereto.

As the cathode material, materials having small work function are normally preferred so that electron injection to an organic material layer is smooth. Specific examples of the cathode material include metals such as magnesium, calcium, sodium, potassium, titanium, indium, yttrium, lithium, gadolinium, aluminum, silver, tin and lead, or alloys thereof; multilayer structure materials such as LiF/Al or $LiO_2$/Al, and the like, but are not limited thereto.

The hole injection material is a material capable of favorably receiving holes from an anode at a low voltage, and the highest occupied molecular orbital (HOMO) of the hole injection material is preferably in between the work function of an anode material and the HOMO of surrounding organic material layers. Specific examples of the hole injection material include metal porphyrins, oligothiophene, arylamine-based organic materials, hexanitrile hexaazatriphenylene-based organic materials, quinacridone-based organic materials, perylene-based organic materials, anthraquinone, and polyaniline- and polythiophene-based conductive polymers, and the like, but are not limited thereto.

The hole transfer material is a material capable of receiving holes from an anode or a hole injection layer, moving the holes to a light emitting layer, and materials having high mobility for the holes are suited. Specific examples thereof include arylamine-based organic materials, conductive polymers, block copolymers having conjugated parts and nonconjugated parts together, and the like, but are not limited thereto.

The light emitting material is a material capable of emitting light in a visible light region by receiving holes and electrons from a hole transfer layer and an electron transfer layer, respectively, and binding the holes and the electrons, and is preferably a material having favorable quantum efficiency for fluorescence or phosphorescence. Specific examples thereof include 8-hydroxy-quinoline aluminum complexes ($Alq_3$); carbazole-based compounds; dimerized styryl compounds; BAlq; 10-hydroxybenzoquinoline-metal compounds; benzoxazole-, benzothiazole- and benzimidazole-based compounds; poly(p-phenylenevinylene) (PPV)-based polymers; spiro compounds; polyfluorene, rubrene, and the like, but are not limited thereto.

The light emitting layer can include a host material and a dopant material. The host material includes fused aromatic ring derivatives, heteroring-containing compounds or the like. Specifically, the fused aromatic ring derivative includes anthracene derivatives, pyrene derivatives, naphthalene derivatives, pentacene derivatives, phenanthrene compounds, fluoranthene compounds and the like, and the heteroring-containing compound includes heterocyclic compounds, dibenzofuran derivatives, ladder-type furan compounds, pyrimidine derivatives and the like, however, the material is not limited thereto.

When the organic light emitting device includes a plurality of organic material layers, the organic material layers can be formed with materials the same as or different from each other.

The organic light emitting device of the present specification can be manufactured using materials and methods known in the art except that one or more layers of the organic material layers are formed using the heterocyclic compound.

For example, the organic light emitting device of the present specification can be manufactured by consecutively laminating an anode, an organic material layer and a cathode on a substrate. Herein, the organic light emitting device can be manufactured by forming an anode on a substrate by depositing a metal, a metal oxide having conductivity, or an alloy thereof using a physical vapor deposition (PVD) method such as sputtering or e-beam evaporation, and forming an organic material layer including a hole injection layer, a hole transfer layer, a light emitting layer and an electron transfer layer thereon, and then depositing a material capable of being used as a cathode thereon. In addition to such a method, the organic light emitting device can also be manufactured by consecutively depositing a cathode material, an organic material layer and an anode material on a substrate.

Another embodiment of the present specification provides a method for manufacturing an organic light emitting device formed using the heterocyclic compound.

Specifically, the method in one embodiment of the present specification includes preparing a substrate; forming a cathode or an anode on the substrate; forming one or more organic material layers on the cathode or the anode; and forming an anode or a cathode on the organic material layer, wherein one or more layers of the organic material layers are formed using the heterocyclic compound.

The electron transfer layer is a layer that receives electrons from an electron injection layer and transfers the electrons to a light emitting layer, and as the electron transfer material, materials capable of favorably receiving electrons from a cathode, moving the electrons to a light emitting layer, and having high mobility for the electrons are suited. Specific examples thereof include Al complexes of 8-hydroxyquinoline; complexes including $Alq_3$; organic radical compounds; hydroxyflavon-metal complexes, and the like, but are not limited thereto. The electron transfer layer can be used together with any desired cathode material as used in the art. Particularly, examples of the suitable cathode material include common materials that have small work function, and in which an aluminum layer or a silver layer follows. Specifically, the cathode material includes cesium, barium, calcium, ytterbium and samarium, and in each case, an aluminum layer or a silver layer follows.

The electron injection layer is a layer that injects electrons from an electrode, and compounds that have an ability to transfer electrons, have an electron injection effect from a cathode, have an excellent electron injection effect for a light emitting layer or a light emitting material, prevent excitons generated in the light emitting layer from moving to a hole injection layer, and in addition thereto, have an excellent thin film forming ability are preferred. Specific examples thereof include fluorenone, anthraquinodimethane, diphenoquinone, thiopyran dioxide, oxazole, oxadiazole, triazole, imidazole, perylene tetracarboxylic acid, fluorenylidene methane, anthrone or the like, and derivatives thereof, metal complex compounds, nitrogen-containing 5-membered ring derivatives, and the like, but are not limited there.

The metal complex compound includes 8-hydroxyquinolinato lithium, bis(8-hydroxyquinolinato)zinc, bis(8-hydroxy-quinolinato)copper, bis(8-hydroxyquinolinato)manganese, tris(8-hydroxyquinolinato)aluminum, tris(2-methyl-8-hydroxy-quinolinato)aluminum, tris(8-hydroxyquinolinato)gallium, bis(10-hydroxybenzo[h]quinolinato)beryllium, bis(10-hydroxybenzo[h]quinolinato)zinc, bis(2-methyl-8-quinolinato)-chlorogallium, bis(2-methyl-8-quinolinato) (o-cresolato)-gallium, bis(2-methyl-8-quinolinato) (1-naphtholato)aluminum, bis(2-methyl-8-quinolinato) (2-naphtholato)gallium and the like, but is not limited thereto.

The hole blocking layer is a layer preventing holes from reaching a cathode, and can be generally formed under the same condition as a hole injection layer. Specific examples thereof can include oxadiazole derivatives, triazole derivatives, phenanthroline derivatives, BCP, aluminum complexes and the like, but are not limited thereto.

The organic light emitting device according to the present specification can be a top-emission type, a bottom-emission type or a dual-emission type depending on the materials used.

EXAMPLES

Synthesis Example

Synthesis Example 1: Synthesis of Compound 1

Step 1) Synthesis of Compound 1-a

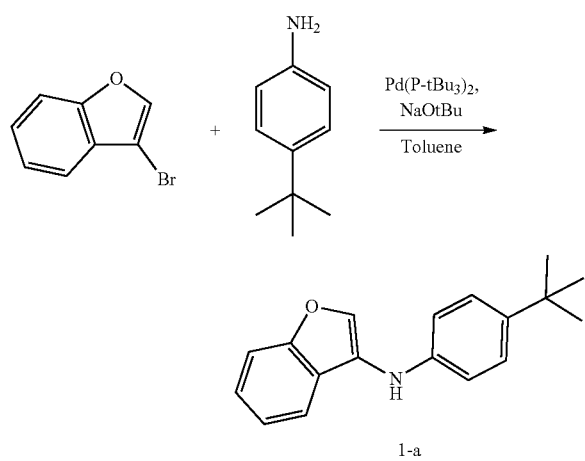

In a 3-neck flask, 3-bromobenzofuran (15.0 g, 76.1 mmol) and 4-(tert-butyl)aniline (12.5 g, 83.7 mmol) were dissolved in toluene (450 ml), and after introducing sodium tert-butoxide (11.0 g, 114.2 mmol) and bis(tri-tert-butyl-phosphine)palladium(0) (0.8 g, 1.5 mmol) thereto, the result was stirred for 6 hours under an argon atmosphere reflux condition. When the reaction was finished, the result was cooled to room temperature, H₂O was introduced thereto, and the reaction solution was transferred to a separatory funnel and extracted. The extract was dried with MgSO₄ and concentrated, and the sample was purified using silica gel column chromatography to obtain Compound 1-a (15.2 g). (Yield 75%, MS[M+H]+=265)

Step 2) Synthesis of Compound 1-b

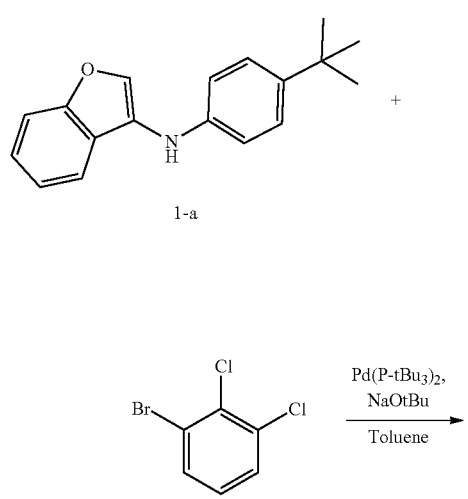

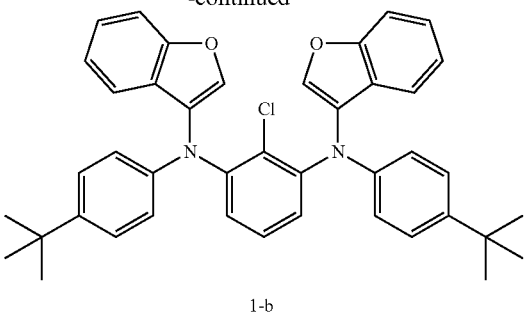

In a 3-neck flask, Compound 1-a (15.0 g, 56.5 mmol) and 1-bromo-2,3-dichlorobenzene (6.4 g, 28.3 mmol) were dissolved in toluene (300 ml), and after introducing sodium tert-butoxide (10.9 g, 113.1 mmol) and bis(tri-tert-butylphosphine)palladium(0) (0.6 g, 1.1 mmol) thereto, the result was stirred for 6 hours under an argon atmosphere reflux condition. When the reaction was finished, the result was cooled to room temperature, H₂O was introduced thereto, and the reaction solution was transferred to a separatory funnel and extracted. The extract was dried with MgSO₄ and concentrated, and the sample was purified using silica gel column chromatography to obtain Compound 1-b (27.5 g). (Yield 76%, MS[M+H]+=639)

Step 3) Synthesis of Compound 1

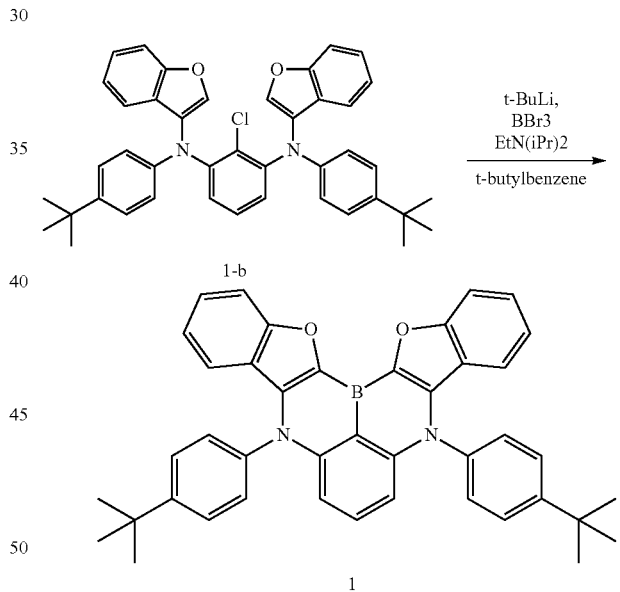

In a 3-neck flask, Compound 1-b (25.0 g, 39.1 mmol) was dissolved in tert-butylbenzene (500 ml), and cooled to 0° C. Under the nitrogen atmosphere, 1.7 M tert-butyllithium in pentane (35 ml, 58.7 mmol) was added thereto, and the result was stirred for 2 hours at 60° C. After that, the reaction material was cooled again to 0° C., BBr₃ (6 ml, 58.7 mmol) was added thereto, and the result was stirred for 0.5 hours at room temperature. The reaction material was cooled again to 0° C., and after adding N,N-diisopropylethylamine (10 ml, 58.7 mmol) thereto, the result was stirred for 2 hours at 60° C. When the reaction was finished, the result was cooled to room temperature, and extracted in a separatory funnel using ethyl acetate and H₂O. The extract was dried with MgSO₄ and concentrated, and the sample was purified using silica gel column chromatography and then sublimation purified to obtain Compound 1 (2.6 g). (Yield 11%, MS[M+H]+=612)

Synthesis Example 2: Synthesis of Compound 2

Step 1) Synthesis of Compound 2-a

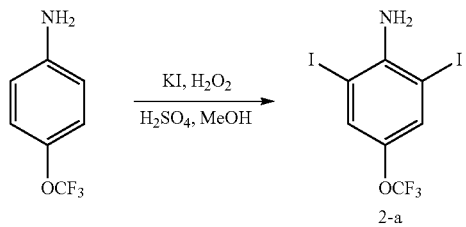 [SMILES: Nc1ccc(OC(F)(F)F)cc1 ; Nc1c(I)cc(OC(F)(F)F)cc1I]

In a 3-neck flask, 4-(trifluoromethoxy)aniline (15.0 g, 84.7 mmol) and potassium iodide (35.1 g, 211.7 mmol) were dissolved in concentrated H₂SO₄ (1 ml) and MeOH (420 ml), and the result was stirred for 4 hours at room temperature while slowly adding 30% H₂O₂ (1 ml). When the reaction was finished, the result was extracted in a separatory funnel using dichloromethane and H₂O. The extract was washed consecutively with an aqueous NaHSO₃ solution and H₂O, then dried with MgSO₄ and concentrated, and the sample was purified using silica gel column chromatography to obtain Compound 2-a (25.4 g). (Yield 70%, MS[M+H]+=428)

Step 2) Synthesis of Compound 2-b

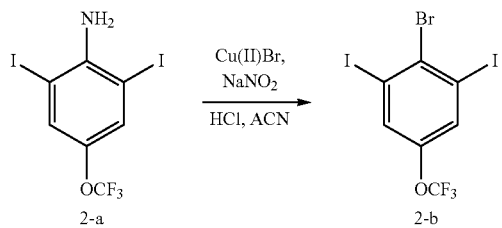 [SMILES: Nc1c(I)cc(OC(F)(F)F)cc1I ; FC(F)(F)Oc1cc(I)c(Br)c(I)c1]

Compound 2-a (20.0 g, 46.6 mmol) and acetic acid (100 ml) were introduced to a 3-neck flask, and cooled to 0° C. Under the nitrogen atmosphere, sodium nitrite (4.8 g, 69.9 mmol) dissolved in H₂O (20 ml) and then concentrated H₂SO₄ (20 ml) were added thereto, and the result was stirred for 0.5 hours. After that, copper bromide (14.7 g, 102.6 mmol) dissolved in a 45% aqueous HBr solution (340 ml) was added thereto at room temperature, and the result was stirred for 1 hour. When the reaction was finished, the result was extracted in a separatory funnel using ethyl acetate and H₂O. H₂O was introduced thereto, and the reaction solution was transferred to a separatory funnel and extracted. The result was washed consecutively with an aqueous NaHCO₃ solution and H₂O, dried with MgSO₄ and concentrated, and the sample was purified using silica gel column chromatography to obtain Compound 2-b (16.1 g). (Yield 70%, MS[M+H]+=492)

Step 3) Synthesis of Compound 2-c

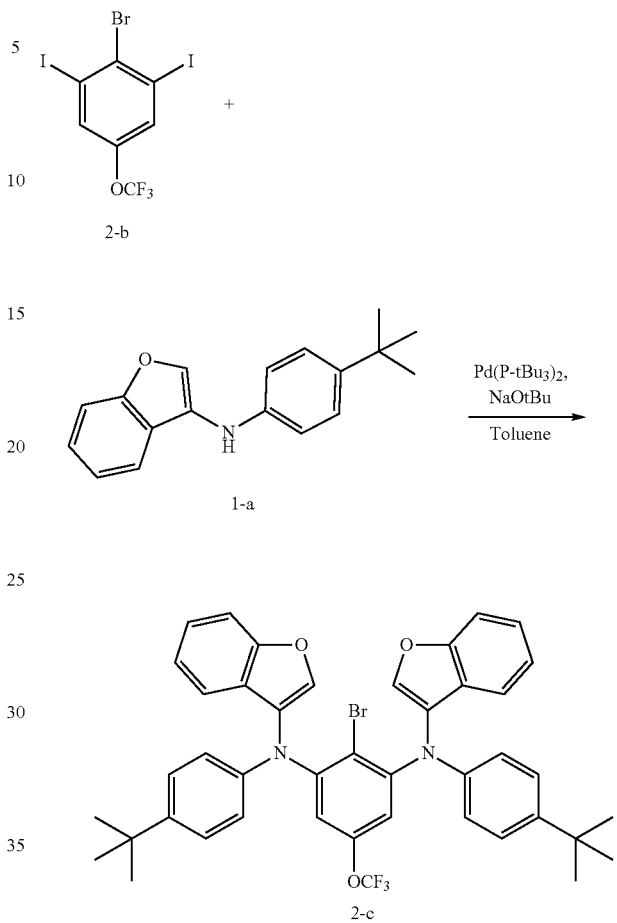

In a 3-neck flask, Compound 2-b (15.0 g, 30.4 mmol) and Compound 1-a (8.9 g, 33.5 mmol) were dissolved in toluene (450 ml), and after introducing sodium tert-butoxide (4.4 g, 45.7 mmol) and bis(tri-tert-butylphosphine)palladium(0) (0.3 g, 0.6 mmol) thereto, the result was stirred for 6 hours under an argon atmosphere reflux condition. When the reaction was finished, the result was cooled to room temperature, H₂O was introduced thereto, and the reaction solution was transferred to a separatory funnel and extracted. The extract was dried with MgSO₄ and concentrated, and the sample was purified using silica gel column chromatography to obtain Compound 2-c (15.9 g). (Yield 72%, MS[M+H]+=723)

Step 4) Synthesis of Compound 2

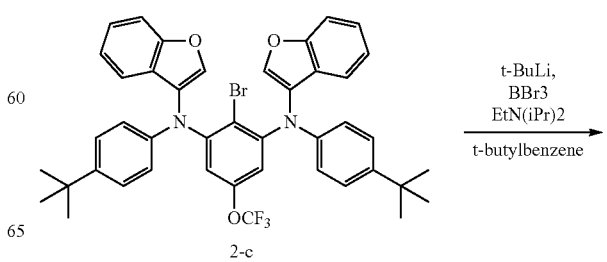

-continued

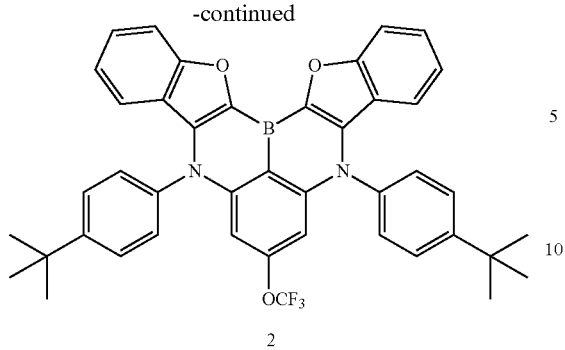

2

In a 3-neck flask, Compound 2-c (15.0 g, 20.7 mmol) was dissolved in tert-butylbenzene (300 ml), and cooled to 0° C. Under the nitrogen atmosphere, 1.7 M tert-butyllithium in pentane (18 ml, 31.1 mmol) was added thereto, and the result was stirred for 2 hours at 60° C. After that, the reaction material was cooled again to 0° C., BBr$_3$ (3 ml, 31.1 mmol) was added thereto, and the result was stirred for 0.5 hours at room temperature. The reaction material was cooled again to 0° C., and after adding N,N-diisopropylethylamine (5 ml, 31.1 mmol) thereto, the result was stirred for 2 hours at 60° C. When the reaction was finished, the result was cooled to room temperature, and extracted in a separatory funnel using ethyl acetate and H$_2$O. The extract was dried with MgSO$_4$ and concentrated, and the sample was purified using silica gel column chromatography and then sublimation purified to obtain Compound 2 (1.7 g). (Yield 12%, MS[M+H]+=696)

Synthesis Example 3: Synthesis of Compound 3

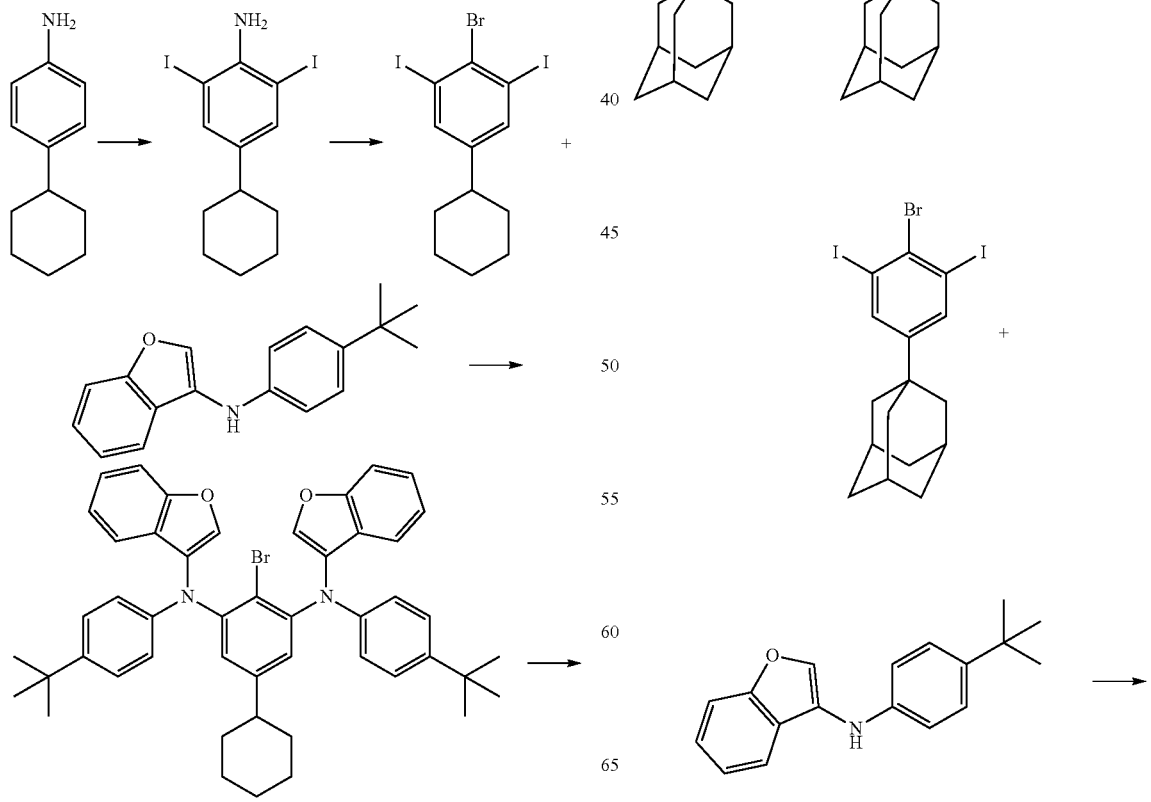

-continued

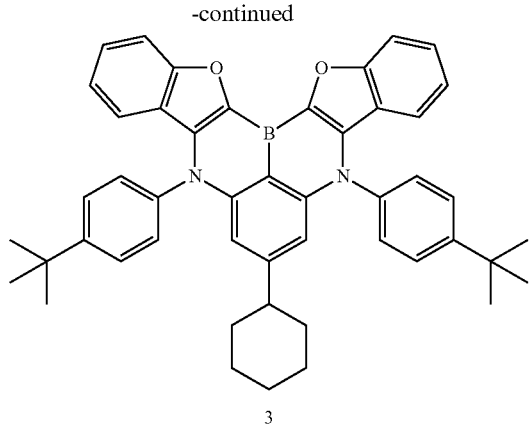

3

Compound 3 was obtained in the same manner as in the method for preparing Compound 2 in Synthesis Example 2 except that 4-cyclohexylaniline was used instead of 4 (trifluoromethoxy)aniline. (MS[M+H]$^+$=694)

Synthesis Example 4: Synthesis of Compound 4

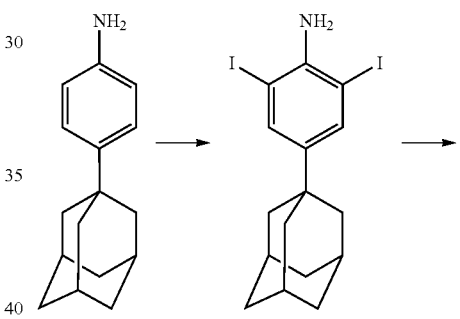

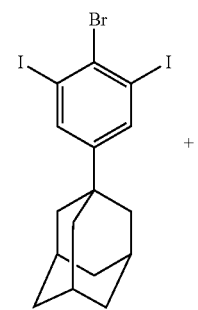

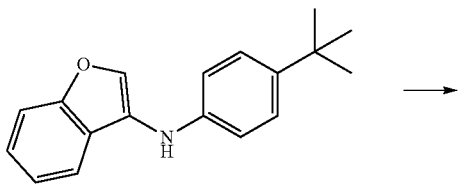

-continued

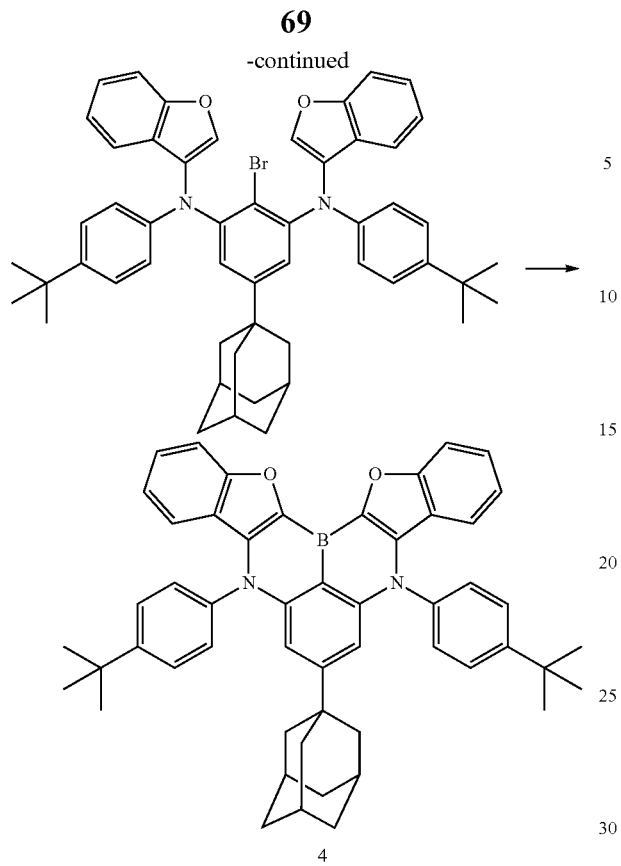

4

Compound 4 was obtained in the same manner as in the method for preparing Compound 2 in Synthesis Example 2 except that 4-((3r,5r,7r)-adamantan-1-yl)aniline was used instead of 4-(trifluoromethoxy) aniline. (MS[M+H]$^+$=746)

Synthesis Example 5: Synthesis of Compound 5

Step 1) Synthesis of Compound 5-a

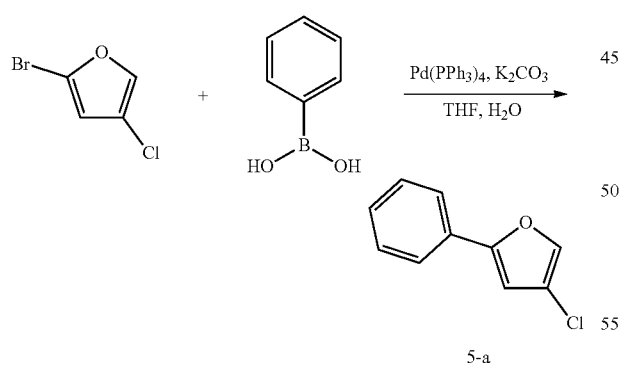

In a 3-neck flask, 2-bromo-4-chlorofuran (20.0 g, 110.2 mmol) and phenylboronic acid (14.1 g, 115.8 mmol) were dissolved in THF (400 ml), and potassium carbonate (91.4 g, 661.5 mmol) dissolved in H$_2$O (133 ml) was introduced thereto. Tetrakis(triphenylphosphine)palladium(0) (2.5 g, 2.2 mmol) was introduced thereto, and the result was stirred for 8 hours under an argon atmosphere reflux condition. When the reaction was finished, the result was cooled to room temperature, and the reaction solution was transferred to a separatory funnel and extracted with ethyl acetate. The extract was dried with MgSO$_4$ and concentrated, and the sample was purified using silica gel column chromatography to obtain Compound 5-a (16.0 g). (Yield 81%, MS[M+H]$^+$= 178)

Step 2) Synthesis of Compound 5

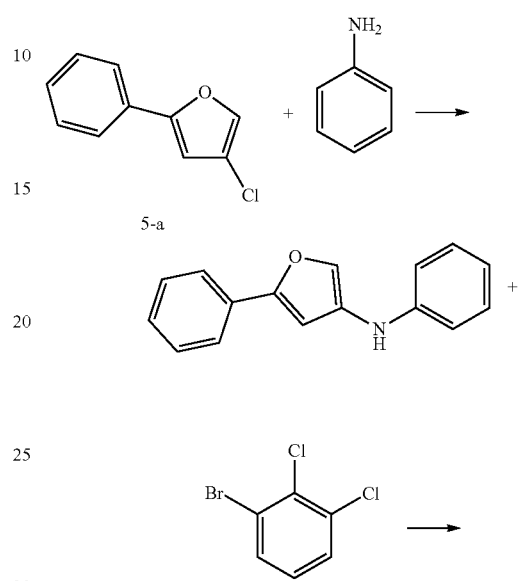

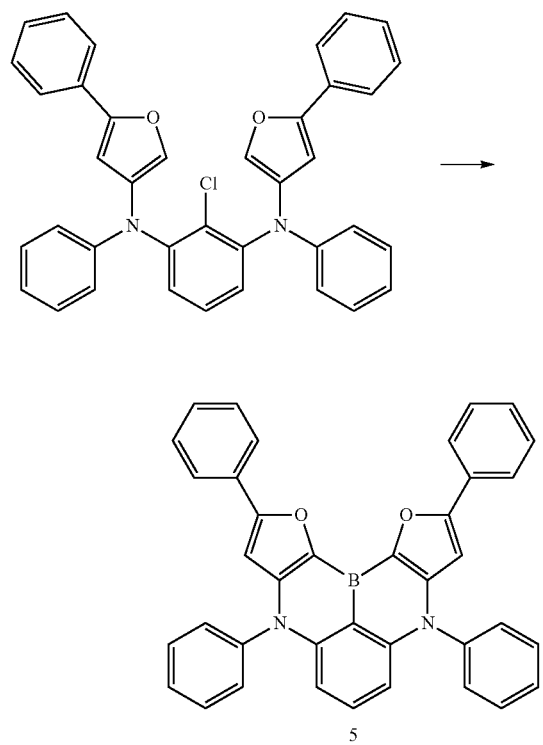

5

Compound 5 was obtained in the same manner as in the method for preparing Compound 1 in Synthesis Example 1 except that Compound 5-a was used instead of 3-bromobenzofuran, and aniline was used instead of 4-(tert-butyl)aniline. (MS[M+H]$^+$=522)

Synthesis Example 6: Synthesis of Compound 6

Step 1) Synthesis of Compound 6-a

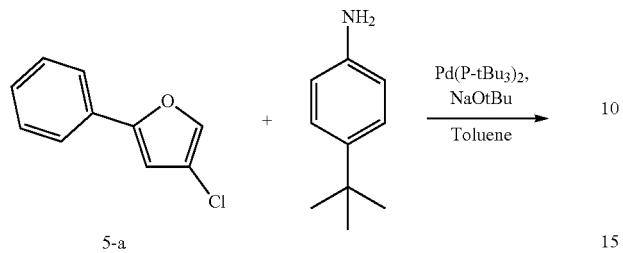

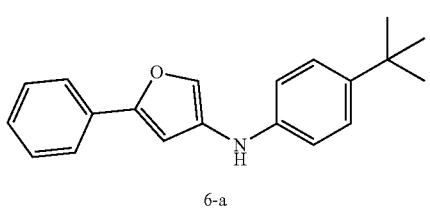

In a 3-neck flask, Compound 5-a (15.0 g, 84.0 mmol) and 4-(tert-butyl)aniline (13.2 g, 88.2 mmol) were dissolved in toluene (450 ml), and after introducing sodium tert-butoxide (12.1 g, 126.0 mmol) and bis(tri-tert-butyl-phosphine)palladium(0) (0.9 g, 1.7 mmol) thereto, the result was stirred for 6 hours under an argon atmosphere reflux condition. When the reaction was finished, the result was cooled to room temperature, $H_2O$ was introduced thereto, and the reaction solution was transferred to a separatory funnel and extracted. The extract was dried with $MgSO_4$ and concentrated, and the sample was purified using silica gel column chromatography to obtain Compound 6-a (17.4 g). (Yield 71%, MS[M+H]+= 291)

Step 2) Synthesis of Compound 6-b

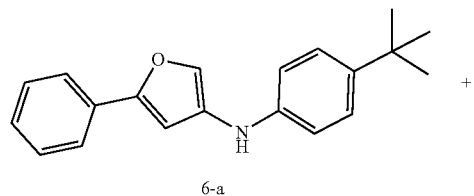

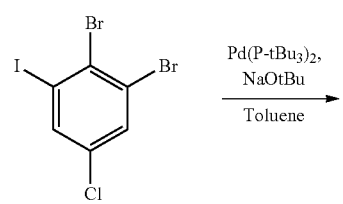

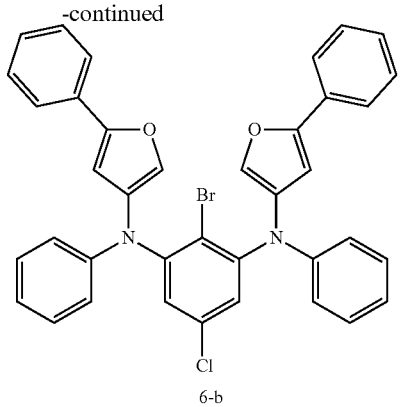

In a 3-neck flask, Compound 6-a (15.0 g, 51.5 mmol) and 1,2-dibromo-5-chloro-3-iodobenzene (9.5 g, 25.7 mmol) were dissolved in toluene (300 ml), and after introducing sodium tert-butoxide (9.9 g, 103.0 mmol) and bis(tri-tert-butylphosphine)palladium(0) (0.5 g, 1.0 mmol) thereto, the result was stirred for 6 hours under an argon atmosphere reflux condition. When the reaction was finished, the result was cooled to room temperature, $H_2O$ was introduced thereto, and the reaction solution was transferred to a separatory funnel and extracted. The extract was dried with $MgSO_4$ and concentrated, and the sample was purified using silica gel column chromatography to obtain Compound 6-b (24.3 g). (Yield 77%, MS[M+H]+=613)

Step 3) Synthesis of Compound 6-c

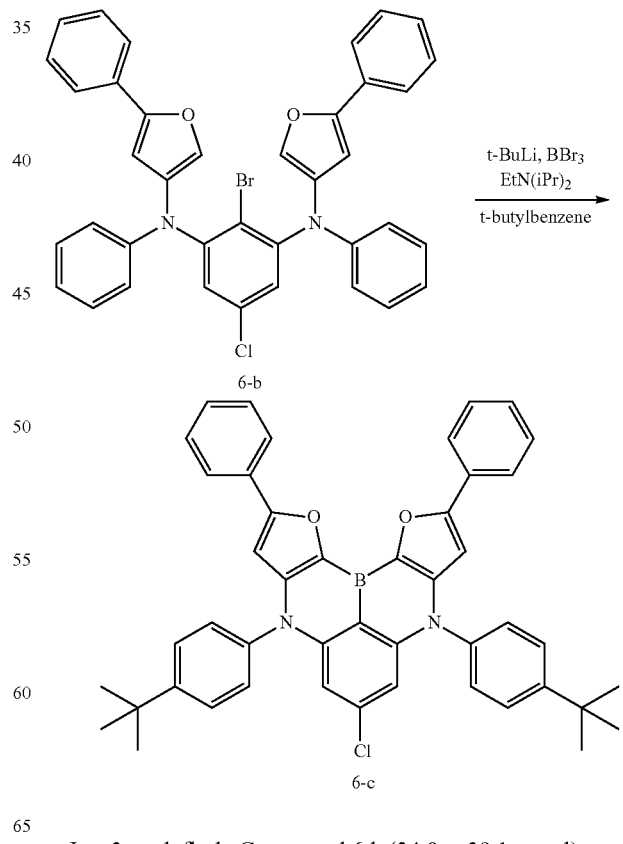

In a 3-neck flask, Compound 6-b (24.0 g, 39.1 mmol) was dissolved in tert-butylbenzene (480 ml), and cooled to 0° C.

Under the nitrogen atmosphere, 1.7 M tert-butyllithium in pentane (35 ml, 58.7 mmol) was added thereto, and the result was stirred for 2 hours at 60° C. After that, the reaction material was cooled again to 0° C., BBr$_3$ (6 ml, 58.7 mmol) was added thereto, and the result was stirred for 0.5 hours at room temperature. The reaction material was cooled again to 0° C., and after adding N,N-diisopropylethylamine (10 ml, 58.7 mmol) thereto, the result was stirred for 2 hours at 60° C. When the reaction was finished, the result was cooled to room temperature, and extracted in a separatory funnel using ethyl acetate and H$_2$O. The extract was dried with MgSO$_4$ and concentrated, and the sample was purified using silica gel column chromatography to obtain Compound 6-c (6.3 g). (Yield 23%, MS[M+H]+=699)

Step 4) Synthesis of Compound 6

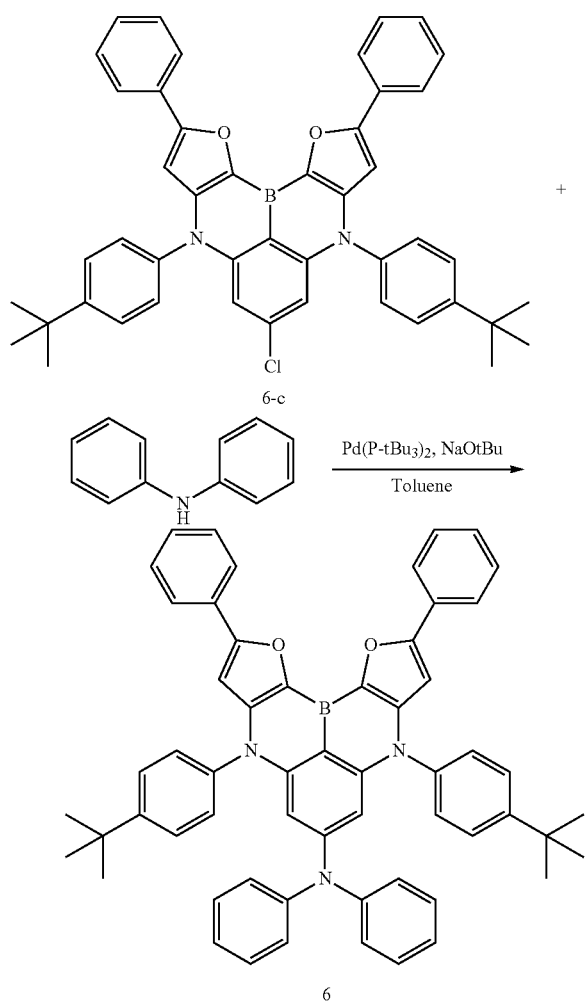

In a 3-neck flask, Compound 6-c (6.0 g, 8.6 mmol) and diphenylamine (1.6 g, 9.4 mmol) were dissolved in toluene (150 ml), and after introducing sodium tert-butoxide (1.2 g, 12.9 mmol) and bis(tri-tert-butylphosphine)palladium(0) (0.1 g, 0.2 mmol) thereto, the result was stirred for 6 hours under an argon atmosphere reflux condition. When the reaction was finished, the result was cooled to room temperature, H$_2$O was introduced thereto, and the reaction solution was transferred to a separatory funnel and extracted. The extract was dried with MgSO$_4$ and concentrated, and the sample was purified using silica gel column chromatography and then sublimation purified to obtain Compound 6 (2.5 g). (Yield 35%, MS[M+H]+=831)

Synthesis Example 7: Synthesis of Compound 7

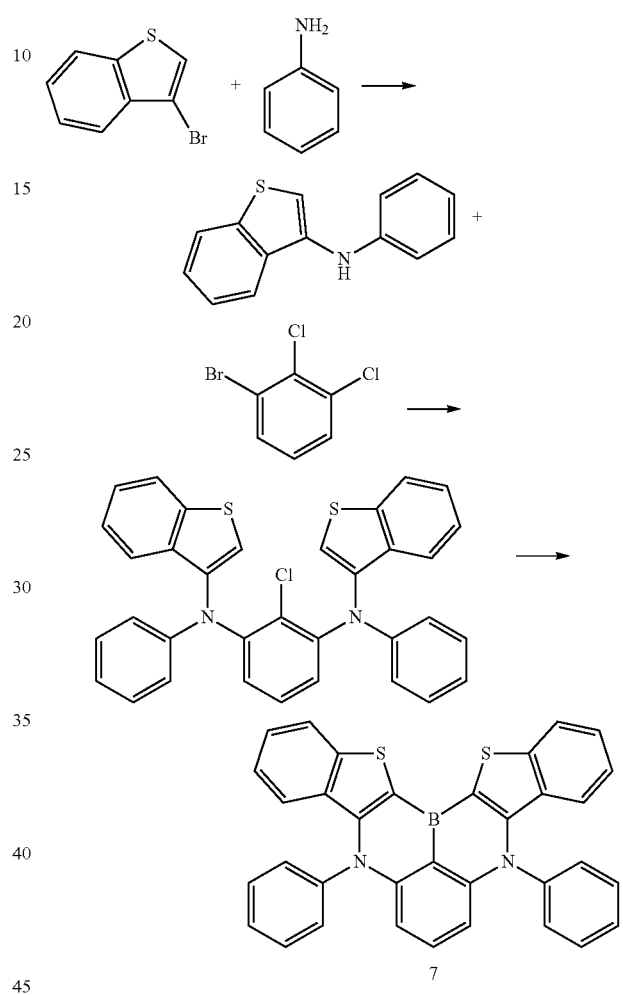

Compound 7 was obtained in the same manner as in the method for preparing Compound 1 in Synthesis Example 1 except that 3-bromobenzo[b]thiophene was used instead of 3-bromobenzofuran, and aniline was used instead of 4-(tert-butyl)aniline. (MS[M+H]$^+$=532)

Synthesis Example 8: Synthesis of Compound 8

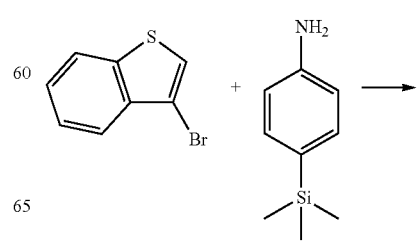

-continued

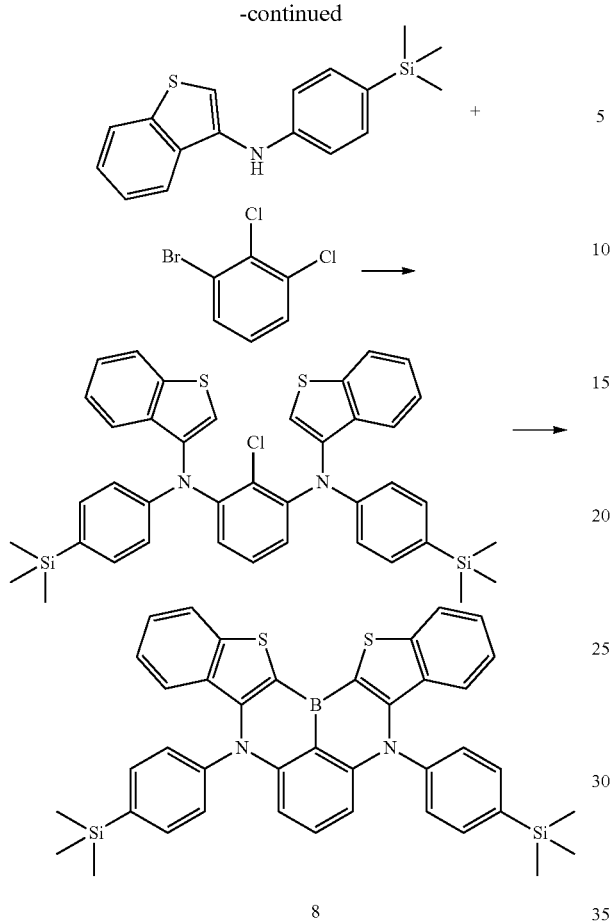

8

Compound 8 was obtained in the same manner as in the method for preparing Compound 1 in Synthesis Example 1 except that 3-bromobenzo[b]thiophene was used instead of 3-bromobenzofuran, and 4-(trimethylsilyl)aniline was used instead of 4-(tert-butyl)aniline. (MS[M+H]$^+$=676)

Device Example

Example 1

A glass substrate on which indium tin oxide (ITO) was coated as a thin film to a thickness of 1,400 Å was placed in detergent-dissolved distilled water and ultrasonic cleaned. Herein, a Decon™ CON705 product of Fischer Co. was used as the detergent, and as the distilled water, distilled water filtered twice with a 0.22 μm sterilizing filter manufactured by Millipore Co. was used. After the ITO was cleaned for 30 minutes, ultrasonic cleaning was repeated twice using distilled water for 10 minutes. After the cleaning with distilled water was finished, the substrate was ultrasonic cleaned with solvents of isopropyl alcohol, acetone and methanol for 10 minutes each, then dried, and then transferred to a plasma cleaner. In addition, the substrate was cleaned for 5 minutes using oxygen plasma, and then transferred to a vacuum deposition apparatus.

On the transparent ITO electrode prepared as above, a hole injection layer was formed by consecutively thermal vacuum depositing the following HI-A and LG-101 to thicknesses of 650 Å and 50 Å, respectively. As a hole transfer layer, the following HT-A was vacuum deposited to a thickness of 600 Å, and then the following HT-B was thermal vacuum deposited to a thickness of 50 Å as an electron blocking layer. Subsequently, as a light emitting layer, BH-A and Compound 1 were vacuum deposited to a thickness of 200 Å in a weight ratio of 96:4. Subsequently, as an electron transfer layer, compounds ET and Liq were thermal vacuum deposited to a thickness of 360 Å in a weight ratio of 1:1, and then a compound of the following Liq was vacuum deposited to a thickness of 5 Å to form an electron injection layer. On the electron injection layer, a cathode was formed by consecutively depositing magnesium and silver to a thickness of 220 Å in a weight ratio of 10:1 and then aluminum to a thickness of 1000 Å, and an organic light emitting device was manufactured.

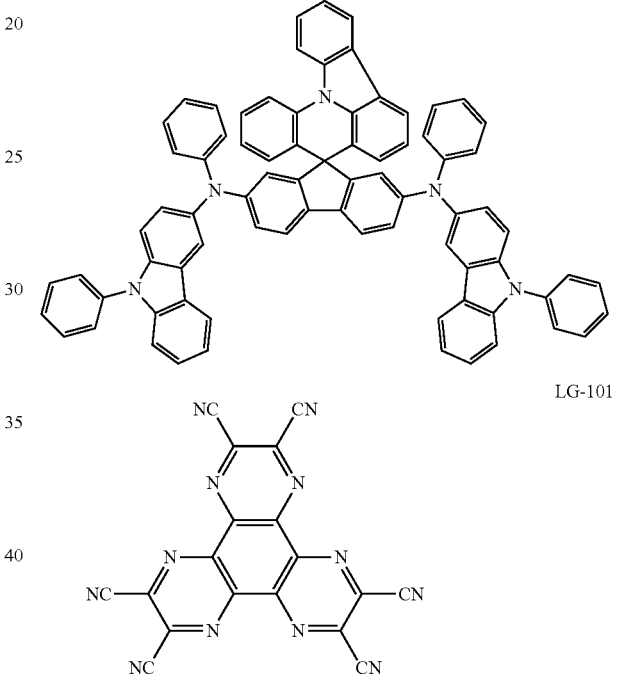

HI-A

LG-101

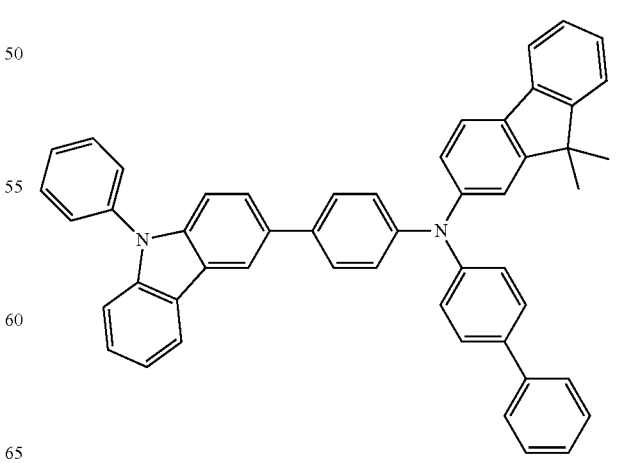

HT-A

-continued

HT-B

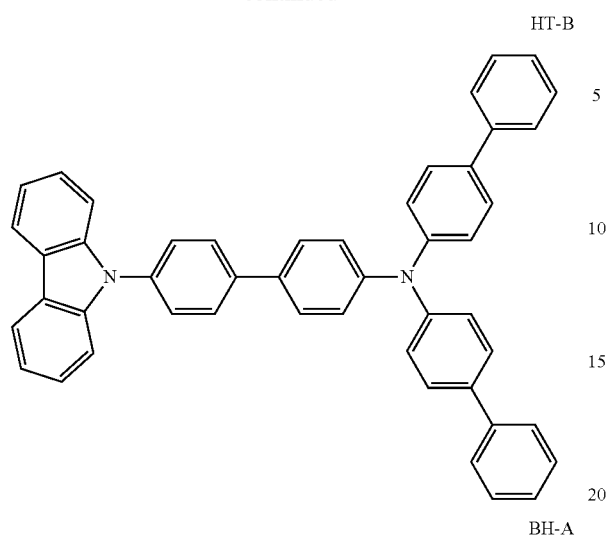

Liq

Example 2 to Example 8 and Comparative Example 1 to Comparative Example 3

Organic light emitting devices of Example 2 to Example 8 and Comparative Example 1 to Comparative Example 3 were each manufactured in the same manner as in Example 1 except that, as a dopant material, compounds described in Table 1 were used instead.

BH-A

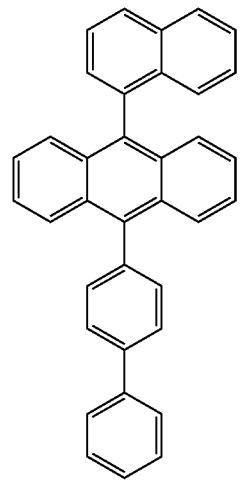

BD-A

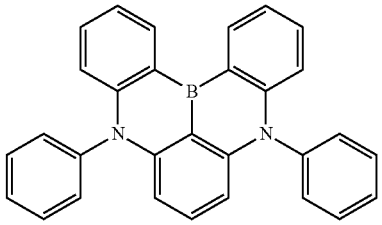

BD-B

ET

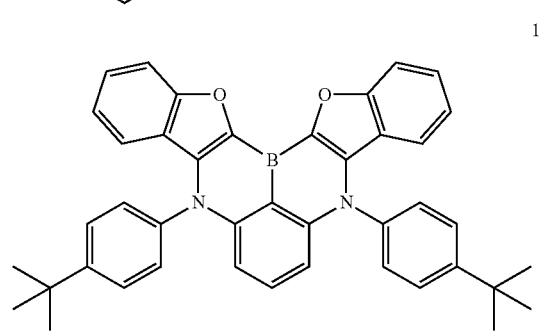

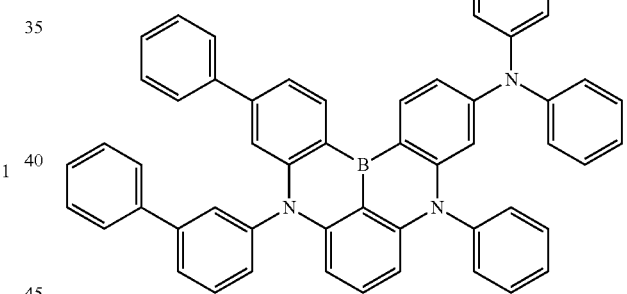

BD-C

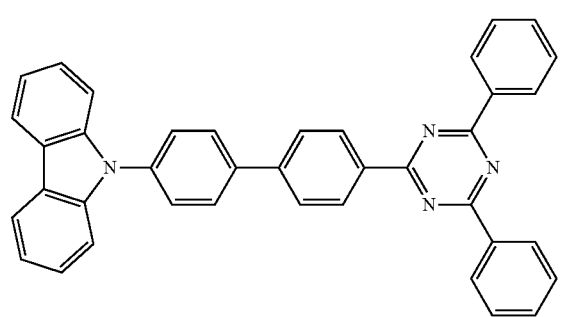

Voltage, efficiency and lifetime (T95) were measured by applying a current to each of the organic light emitting devices manufactured in Example 1 to Example 8 and Comparative Example 1 to Comparative Example 3, and the results are shown in the following Table 1. Herein, the voltage and the efficiency were measured by applying current density of 10 mA/cm², and FWHM (full width at half maximum) was obtained from a spectrum measured herein. T95 means time taken for initial luminance decreasing to 95% at current density of 20 mA/cm².

TABLE 1

| | | @10 mA/cm² | | | @20 mA/cm² |
|---|---|---|---|---|---|
| | Dopant | V | QE | FWHM (nm) | LT95 |
| Example 1 | Compound 1 | 3.88 | 7.61 | 21 | 110 |
| Example 2 | Compound 2 | 3.92 | 7.76 | 20 | 105 |
| Example 3 | Compound 3 | 3.93 | 7.76 | 21 | 106 |
| Example 4 | Compound 4 | 3.96 | 7.58 | 20 | 101 |
| Example 5 | Compound 5 | 3.85 | 7.65 | 20 | 119 |
| Example 6 | Compound 6 | 3.91 | 7.63 | 21 | 115 |
| Example 7 | Compound 7 | 3.90 | 7.75 | 20 | 116 |
| Example 8 | Compound 8 | 3.95 | 7.71 | 21 | 100 |
| Comparative Example 1 | BD-A | 3.98 | 7.30 | 25 | 81 |
| Comparative Example 2 | BD-B | 4.05 | 7.02 | 26 | 76 |
| Comparative Example 3 | BD-C | 4.16 | 6.91 | 26 | 69 |

As shown in [Table 1], using the structures of [Chemical Formula 1] in which upper two rings are pentagonal rings as a dopant of an organic light emitting device resulted in small full width at half maximum (FWHM), high efficiency and long lifetime compared to structures in which only hexagonal rings are linked to a boron atom. In order to understand the cause, a quantum calculation was conducted on the following two compounds, and optimized structures are shown in FIG. 3. The quantum calculation was conducted as density function theory (DFT) calculation of the Schrodinger Material Science Suite program, and herein, B3LYP was used as the functional, and 6-31 g* was used as the basis function.

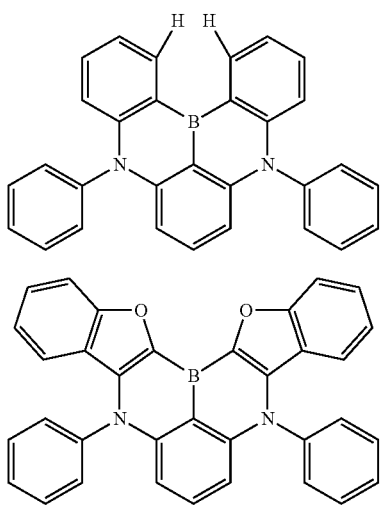

In a material formed with only hexagonal rings such as BD-A, a distance between the indicated two hydrogen atoms is close and the two hexagonal rings are distorted due to the resulting repulsive force. On the other hand, compounds having the structure of [Chemical Formula 1] such as Compound 9 do not have hydrogen atoms on these locations, and the structure is flatter. Compounds having such a flat structure had reduced vibration energy resulting in a narrower light emission spectrum leading to high efficiency, and a lifetime increased by being structurally more stable. As a result, when using the compound of Chemical Formula 1 as a light emitting layer dopant of an organic light emitting device, a device with high color purity, high efficiency and long lifetime was able to be obtained.

The invention claimed is:

1. A heterocyclic compound of Chemical Formula 1:

Chemical Formula 1

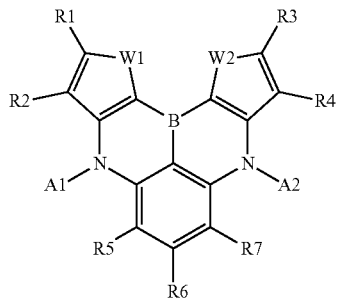

wherein, in Chemical Formula 1:

W1 and W2 are the same as or different from each other, and each independently is O or S;

A1 and A2 are the same as or different from each other, and each independently is a substituted or unsubstituted aryl group, or a substituted or unsubstituted heteroaryl group;

R1 to R7 are the same as or different from each other, and each independently is hydrogen, deuterium, a nitrile group, a halogen group, a substituted or unsubstituted alkyl group, a substituted or unsubstituted cycloalkyl group, a substituted or unsubstituted alkoxy group, a substituted or unsubstituted silyl group, a substituted or unsubstituted amine group, a substituted or unsubstituted aryl group, or a substituted or unsubstituted heteroaryl group; and R1 to R7, A1 and A2 can bond to adjacent substituents to form a substituted or unsubstituted ring.

2. The heterocyclic compound of claim 1, wherein Chemical Formula 1 is one of the following Chemical Formula 2 or 3:

Chemical Formula 2

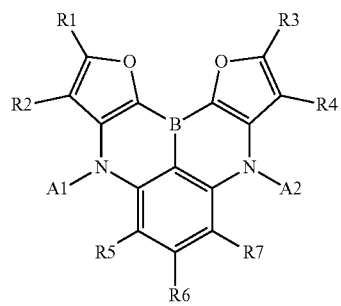

-continued

Chemical Formula 3

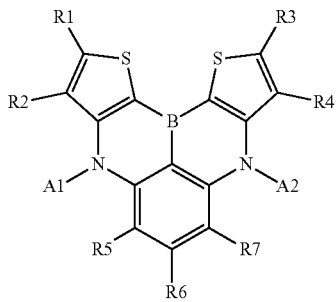

wherein in Chemical Formulae 2 and 3:
A1, A2, and R1 to R7 have the same definitions as in Chemical Formula 1.

3. The heterocyclic compound of claim 1, wherein Chemical Formula 1 is one of the following Chemical Formula 4 or 5:

Chemical Formula 4

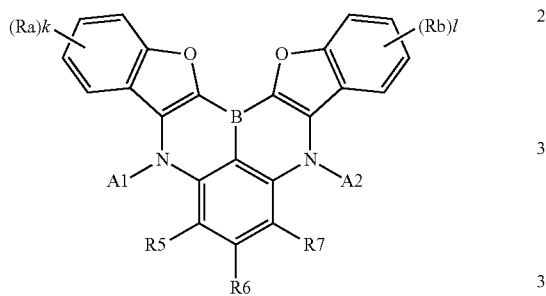

Chemical Formula 5

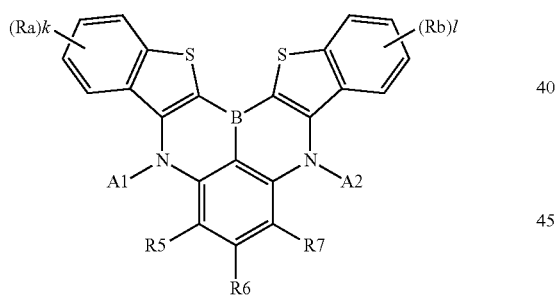

wherein in Chemical Formulae 4 and 5:
A1, A2, and R5 to R7 have the same definitions as in Chemical Formula 1;
Ra and Rb are the same as or different from each other, and each independently is hydrogen, deuterium, a nitrile group, a halogen group, a substituted or unsubstituted alkyl group, a substituted or unsubstituted silyl group, a substituted or unsubstituted amine group, a substituted or unsubstituted aryl group, or a substituted or unsubstituted heteroaryl group, or adjacent substituents bond to each other to form a substituted or unsubstituted ring;
k and l are each an integer of 0 to 4; and
when k and l are each a plural number, the substituents in the parentheses are the same as or different from each other.

4. The heterocyclic compound of claim 1, wherein R1 to R7 are the same as or different from each other, and each independently is hydrogen; a nitrile group; a halogen group; an aryl group that is unsubstituted or substituted with a silyl group or an alkyl group; an alkyl group having 1 to 10 carbon atoms; a silyl group that is unsubstituted or substituted with an alkyl group having 1 to 10 carbon atoms; an alkoxy group having 1 to 10 carbon atoms; an amine group that is unsubstituted or substituted with an aryl group having 6 to 30 carbon atoms; or an N, O or S-containing heteroaryl group having 3 to 10 carbon atoms unsubstituted or substituted with an alkyl group having 1 to 10 carbon atoms.

5. The heterocyclic compound of claim 1, wherein A1 and A2 are the same as or different from each other, and each independently is an aryl group having 6 to 30 carbon atoms unsubstituted or substituted with an alkyl group having 1 to 10 carbon atoms, a cycloalkyl group having 3 to 30 carbon atoms, or a silyl group substituted with an alkyl group having 1 to 10 carbon atoms.

6. The heterocyclic compound of claim 1, wherein Chemical Formula 1 is any one compound selected from among the following compounds:

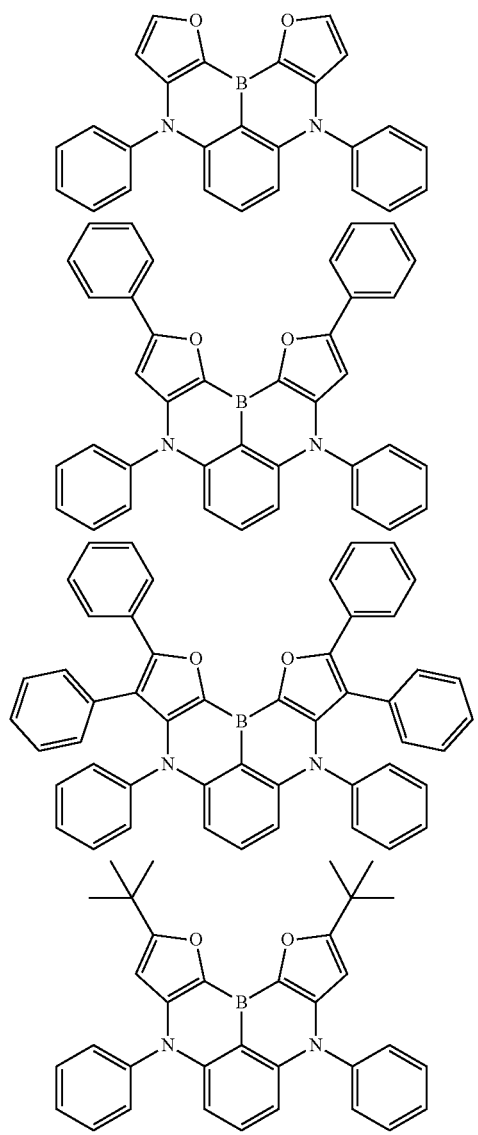

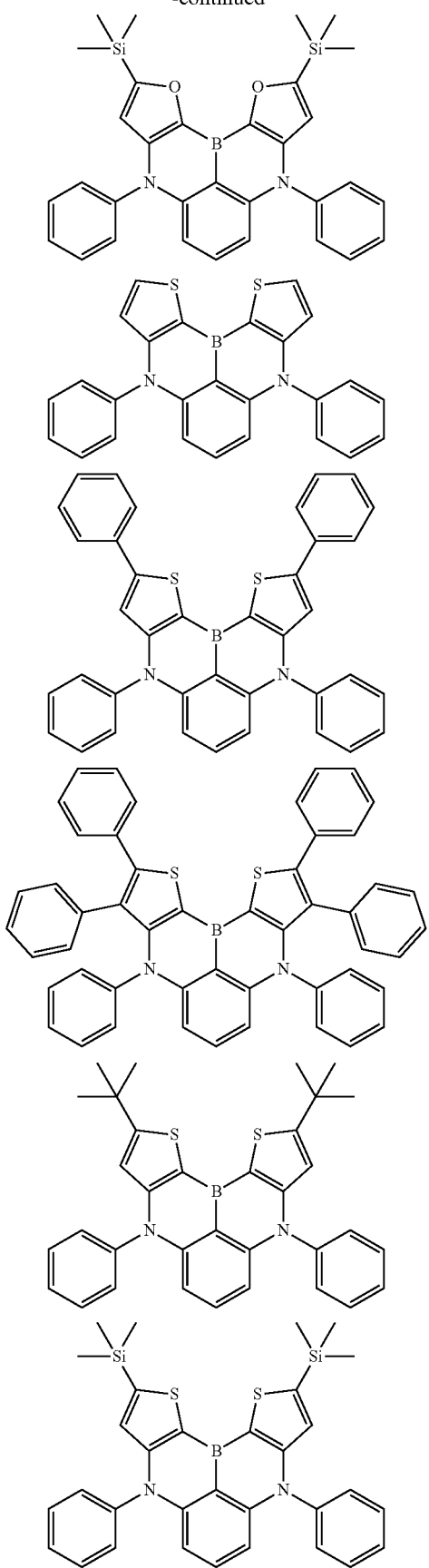
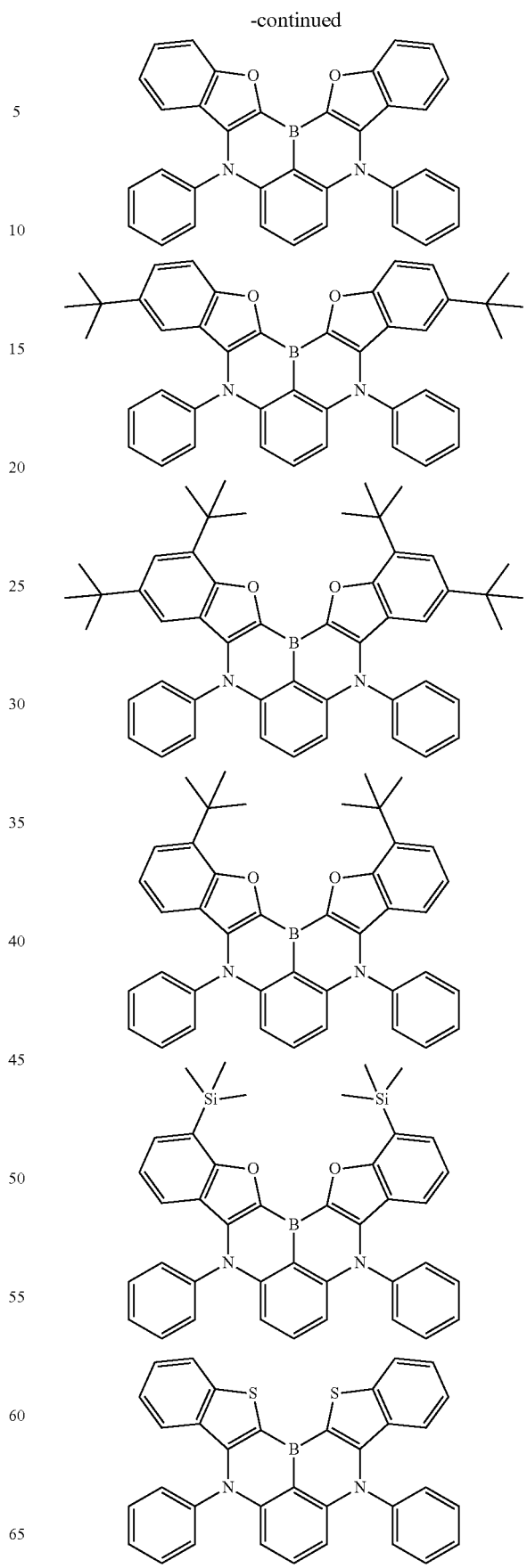

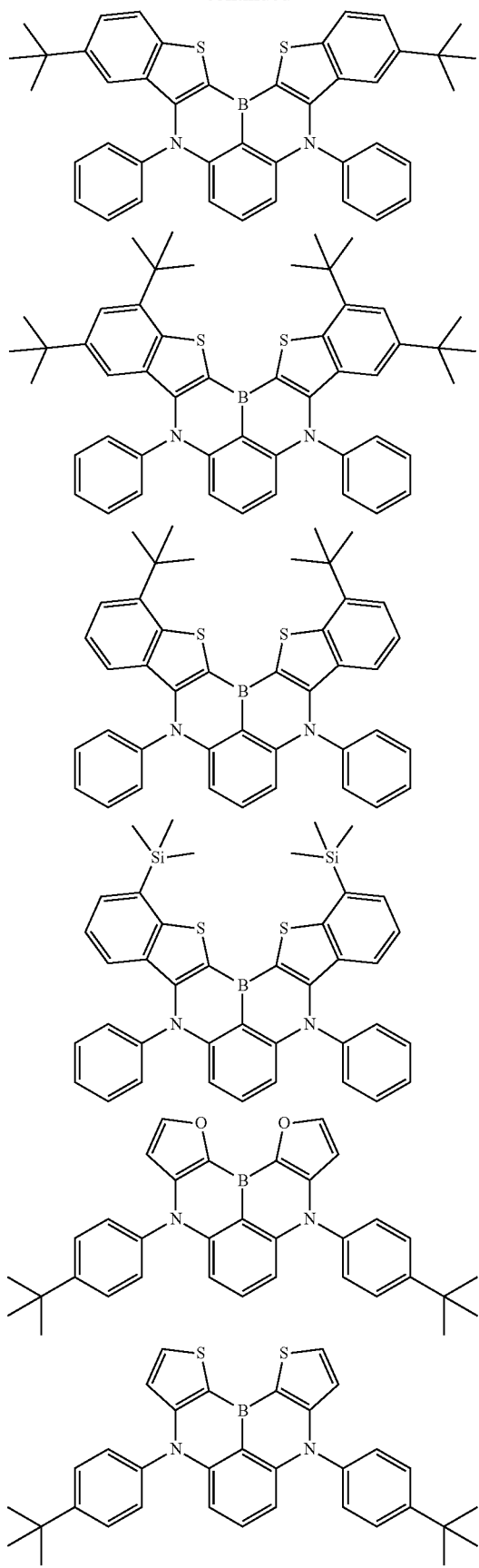
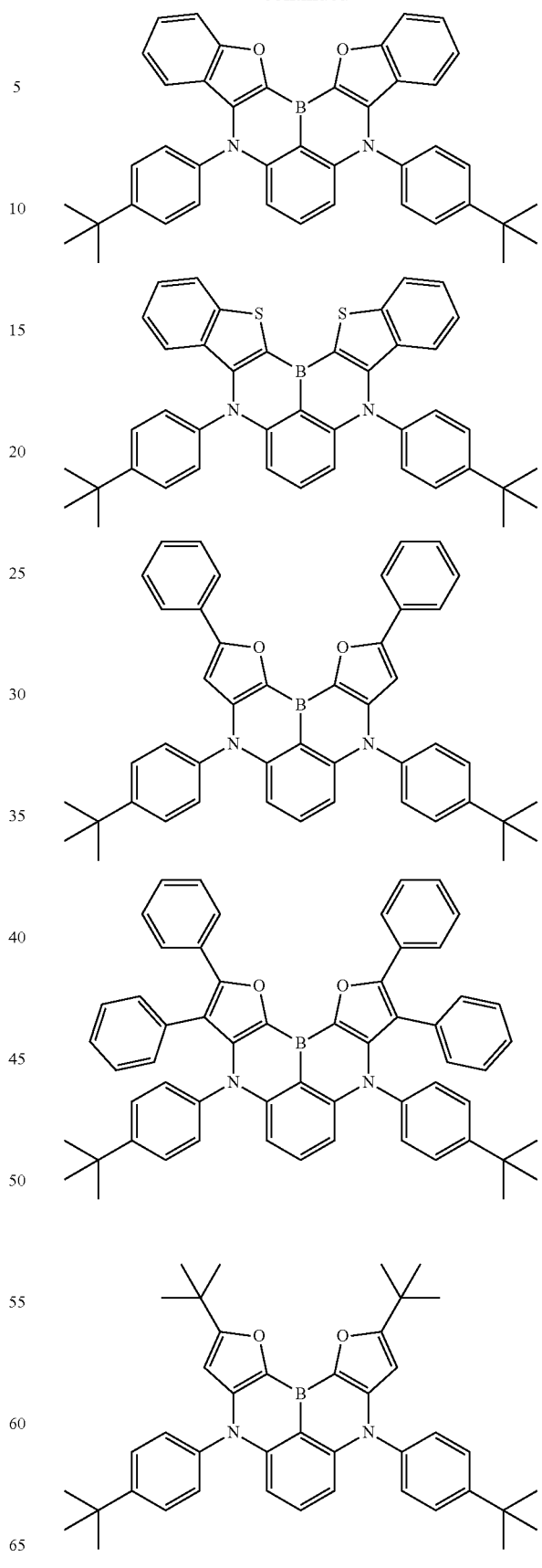

87
-continued
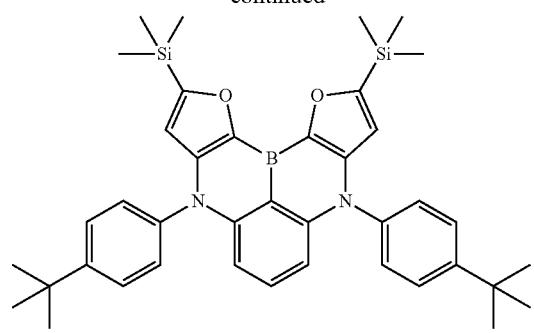
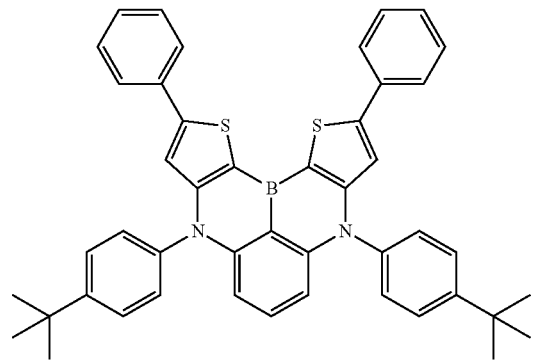
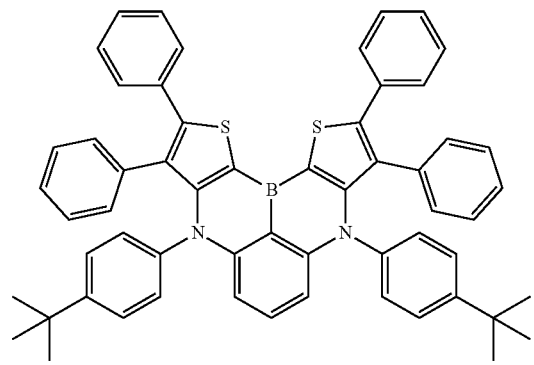
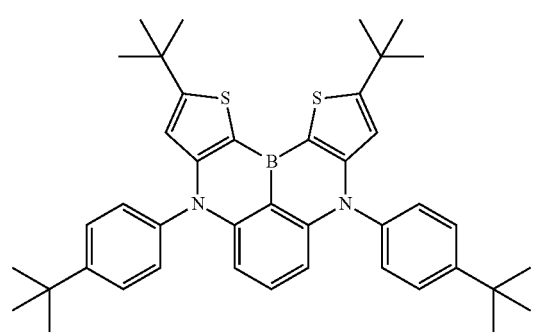
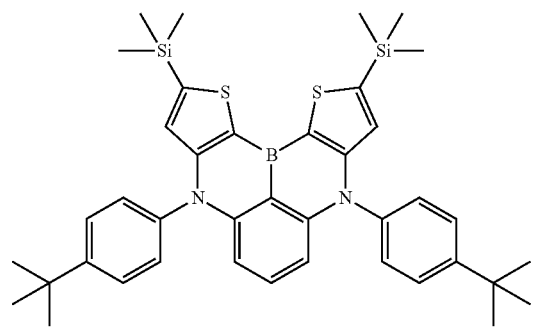
88
-continued
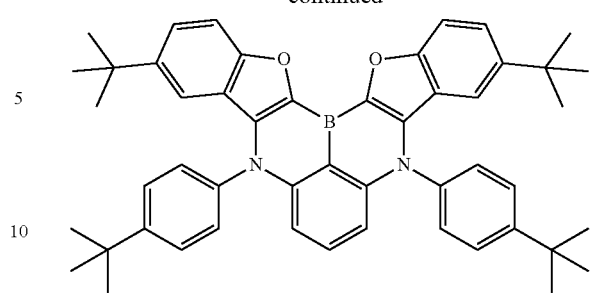
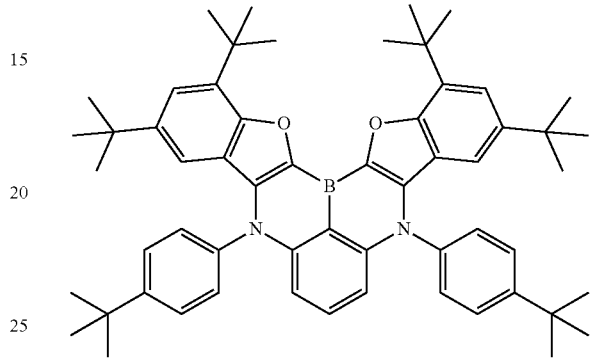
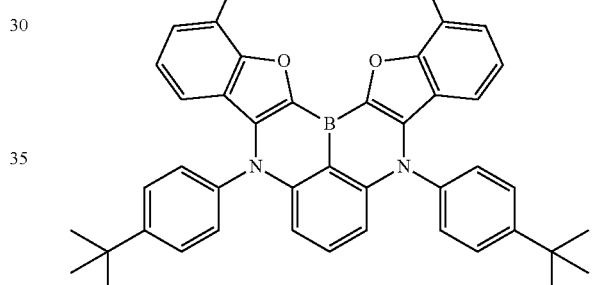
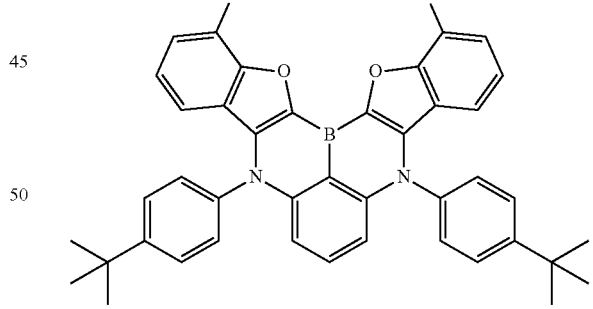
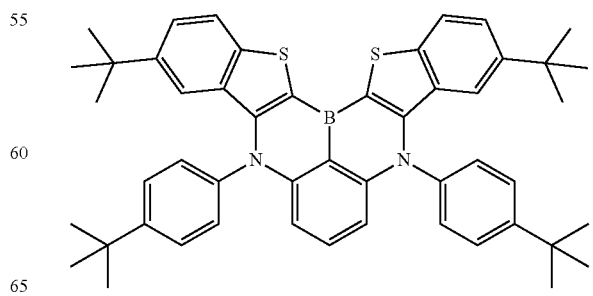

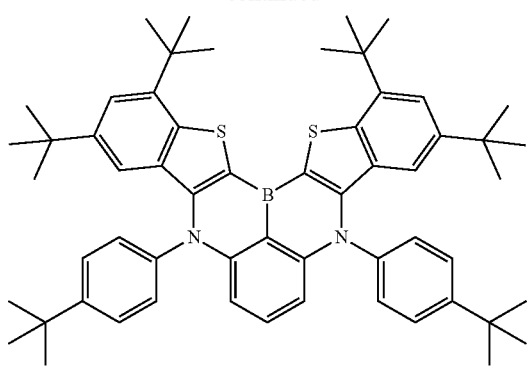
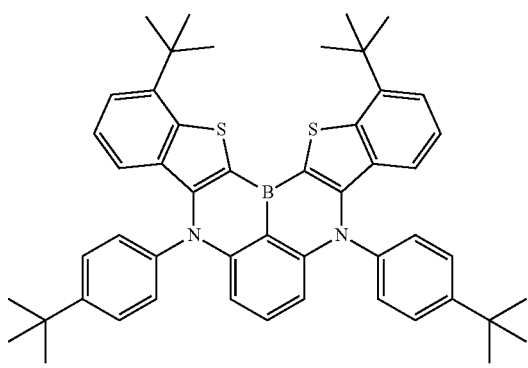
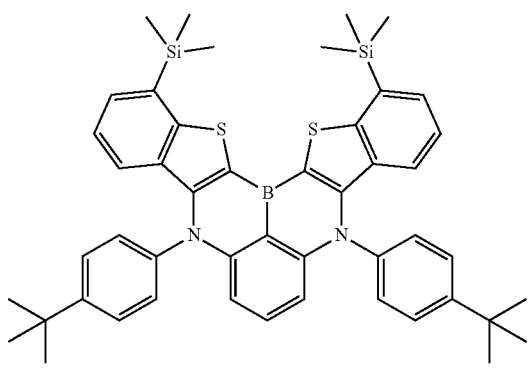
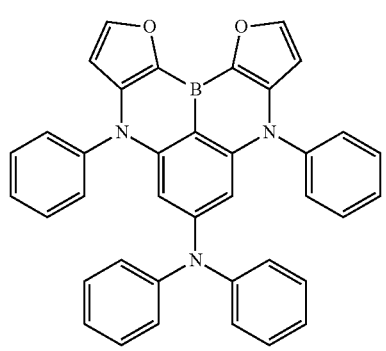
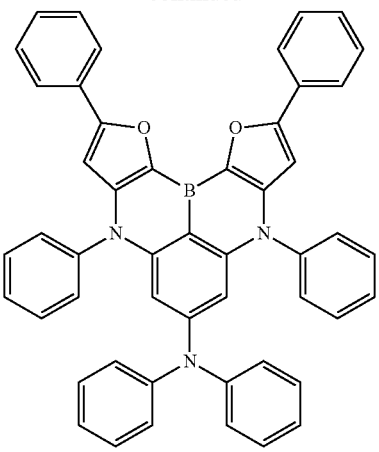
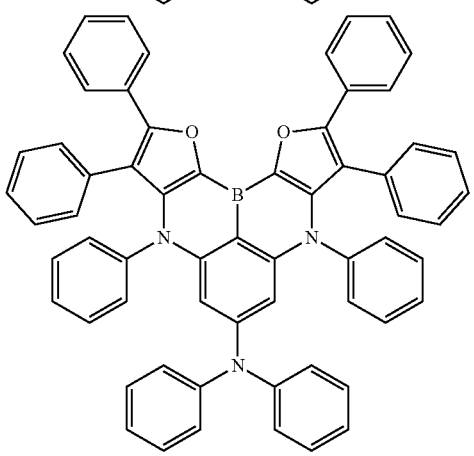
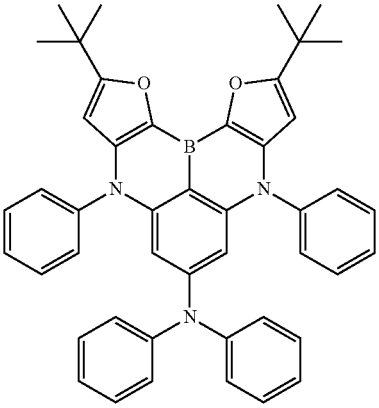
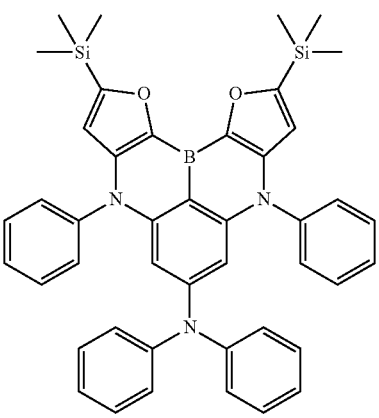

91
-continued
92
-continued
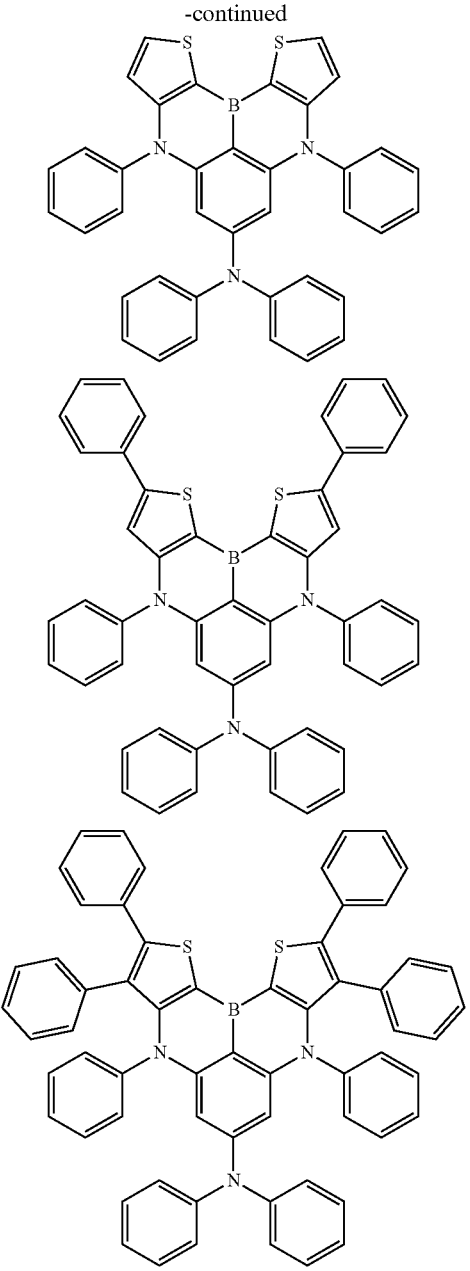
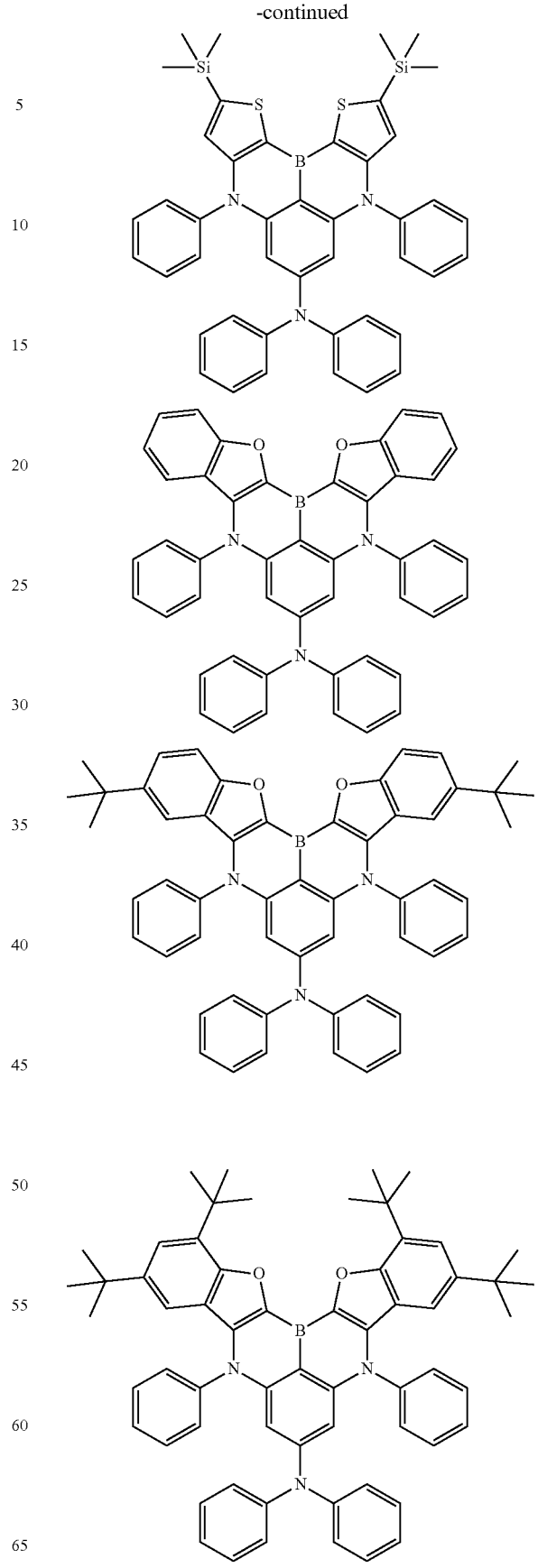

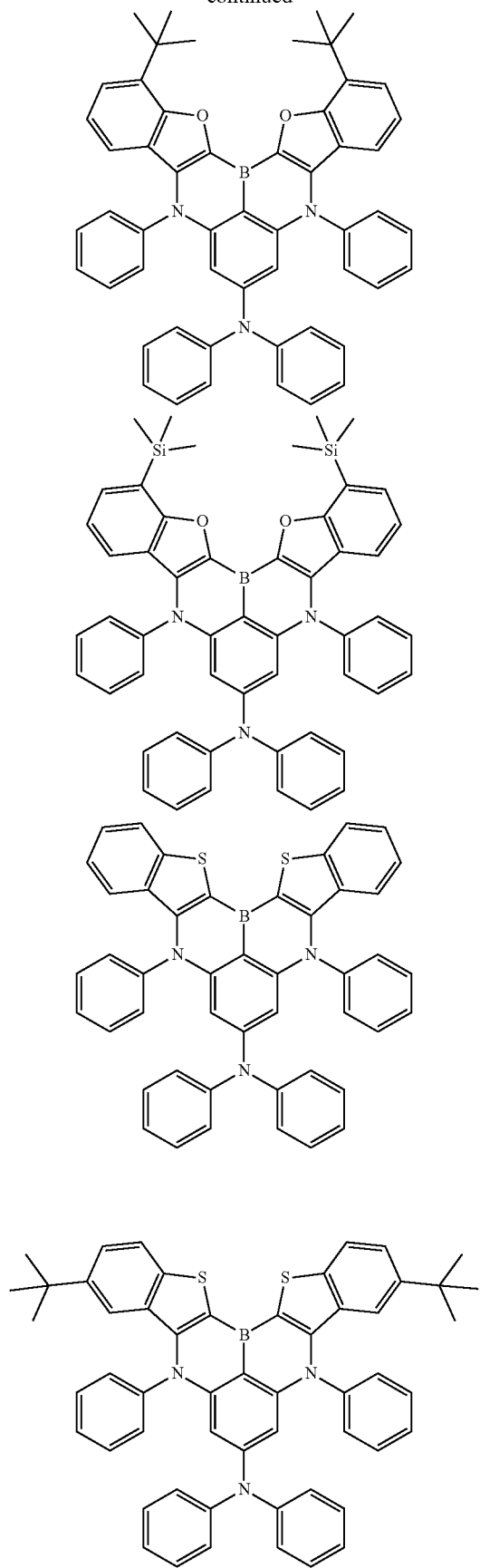
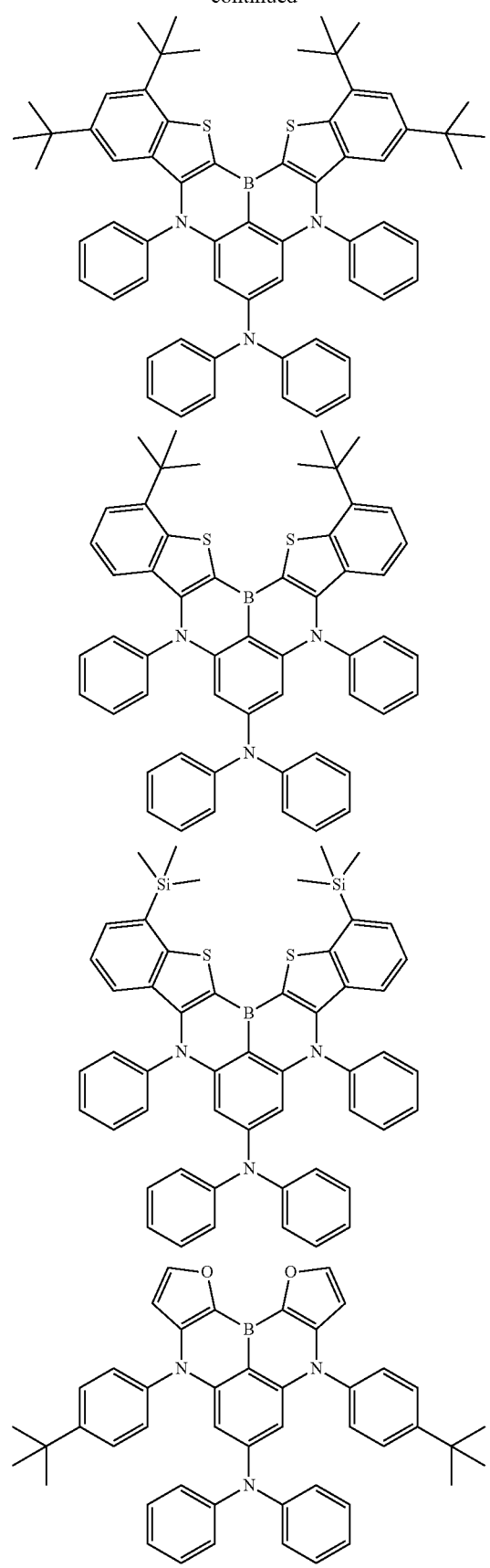

-continued
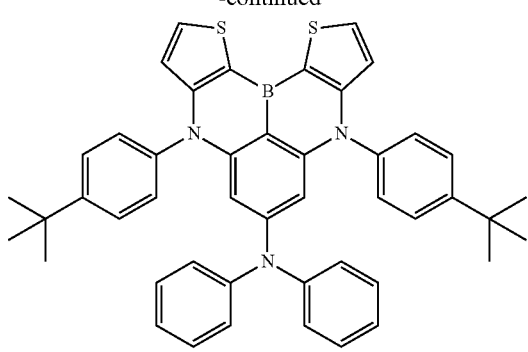
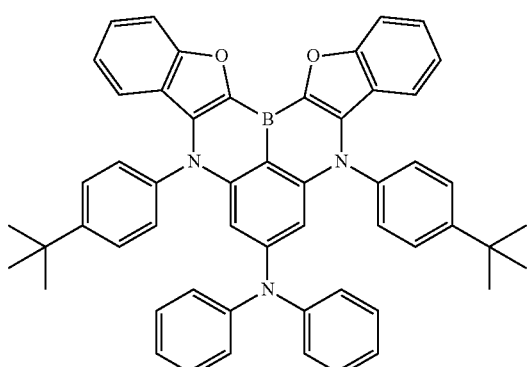
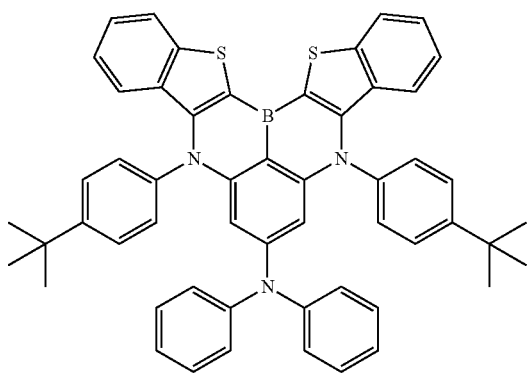
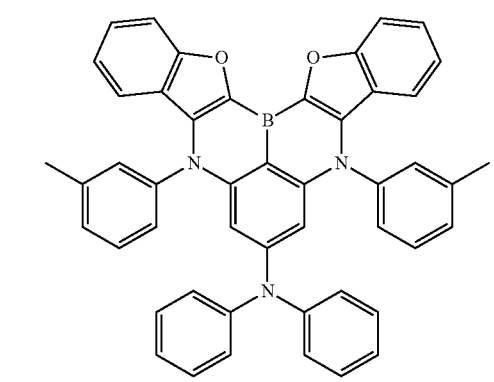
-continued
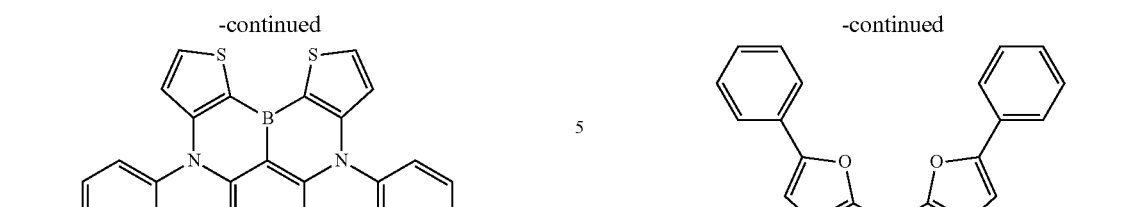
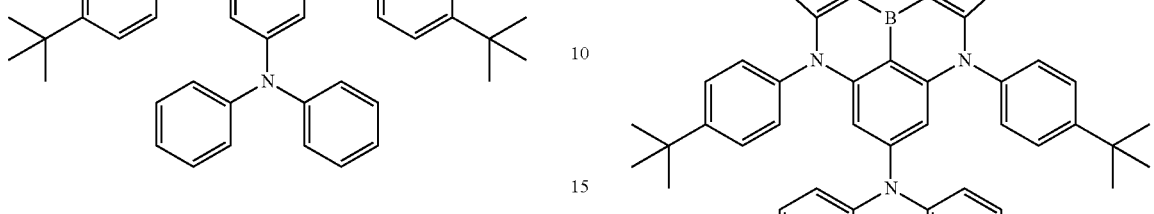
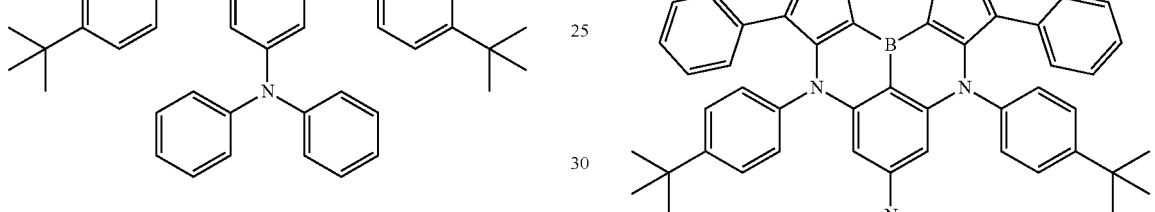
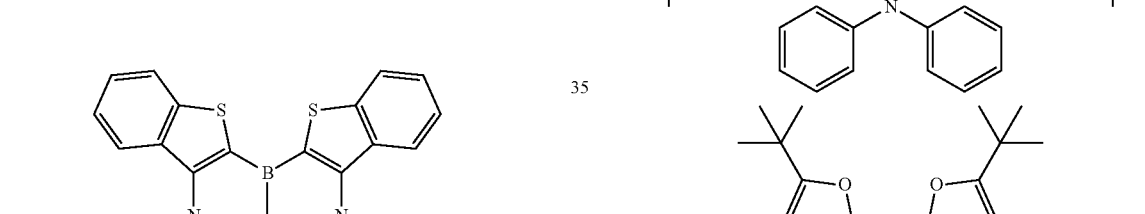
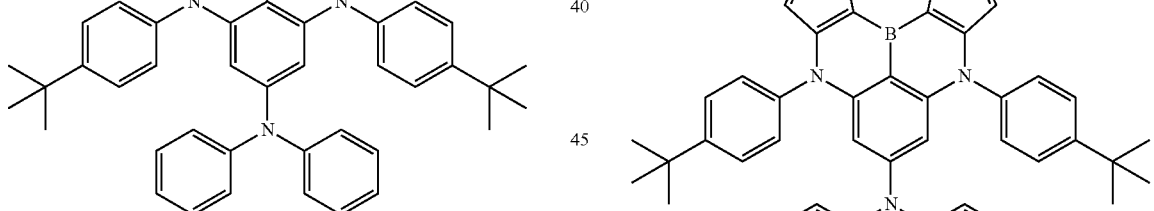

97
-continued
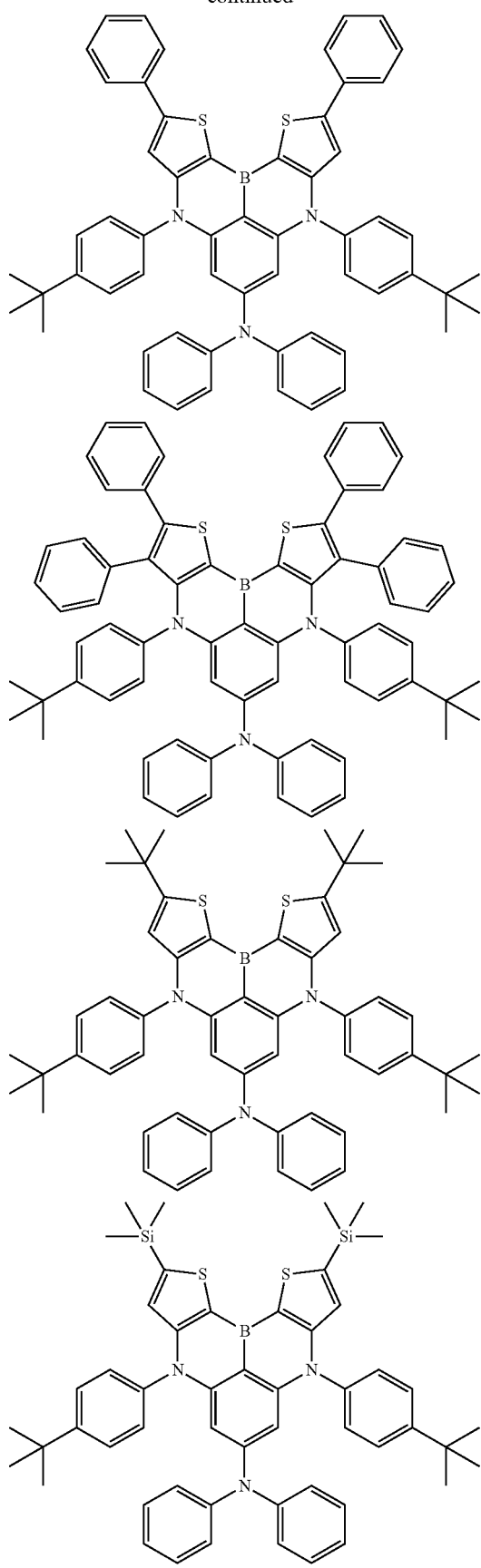
98
-continued
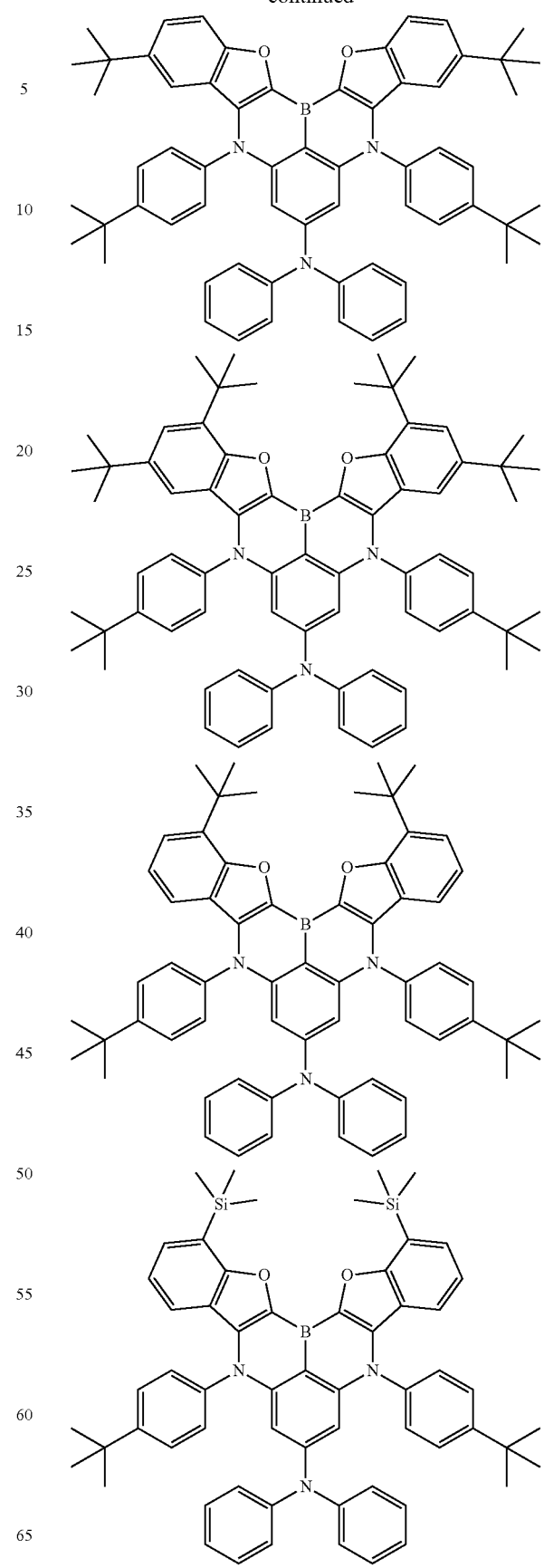

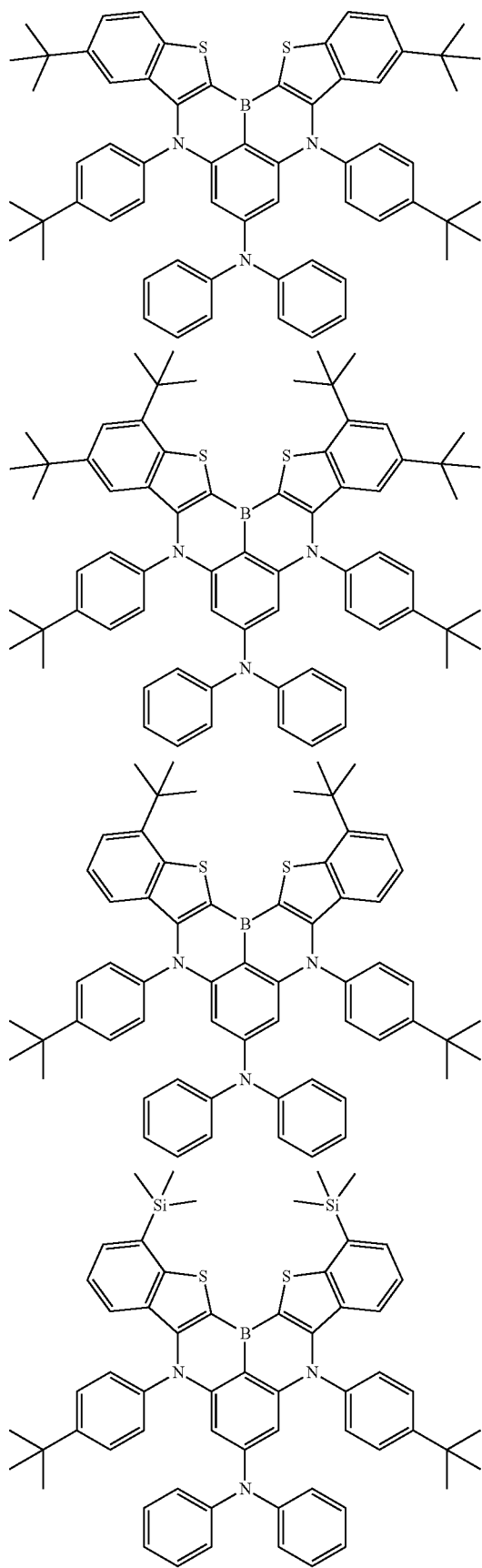
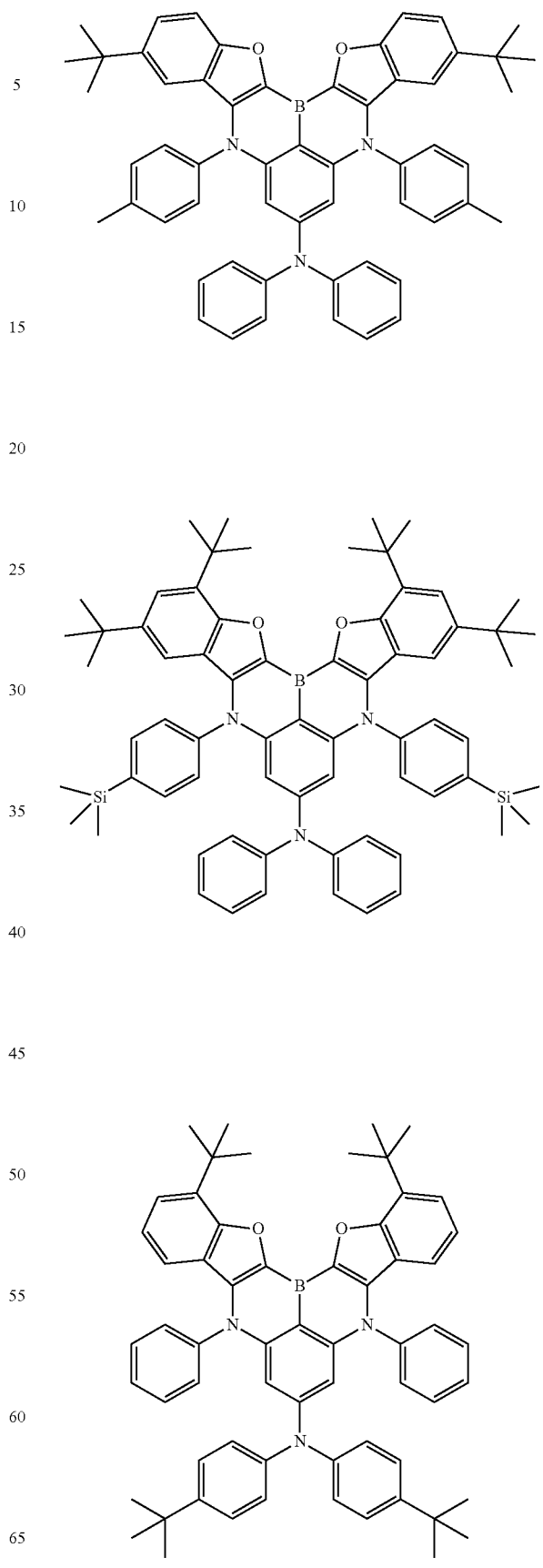

101
-continued
102
-continued
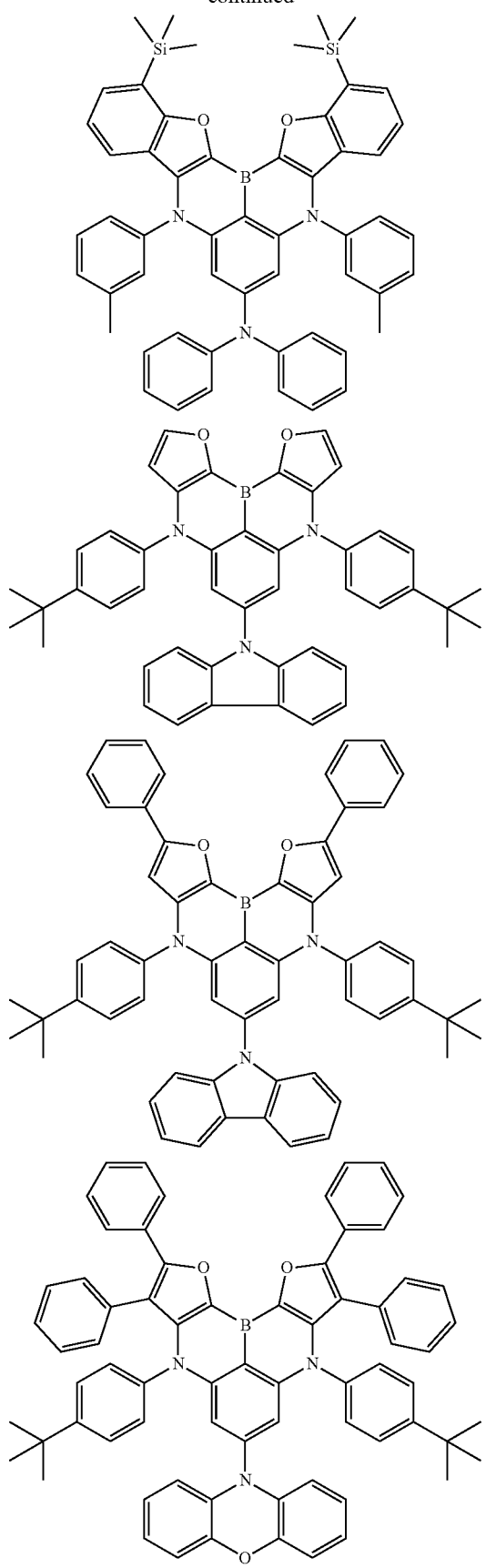
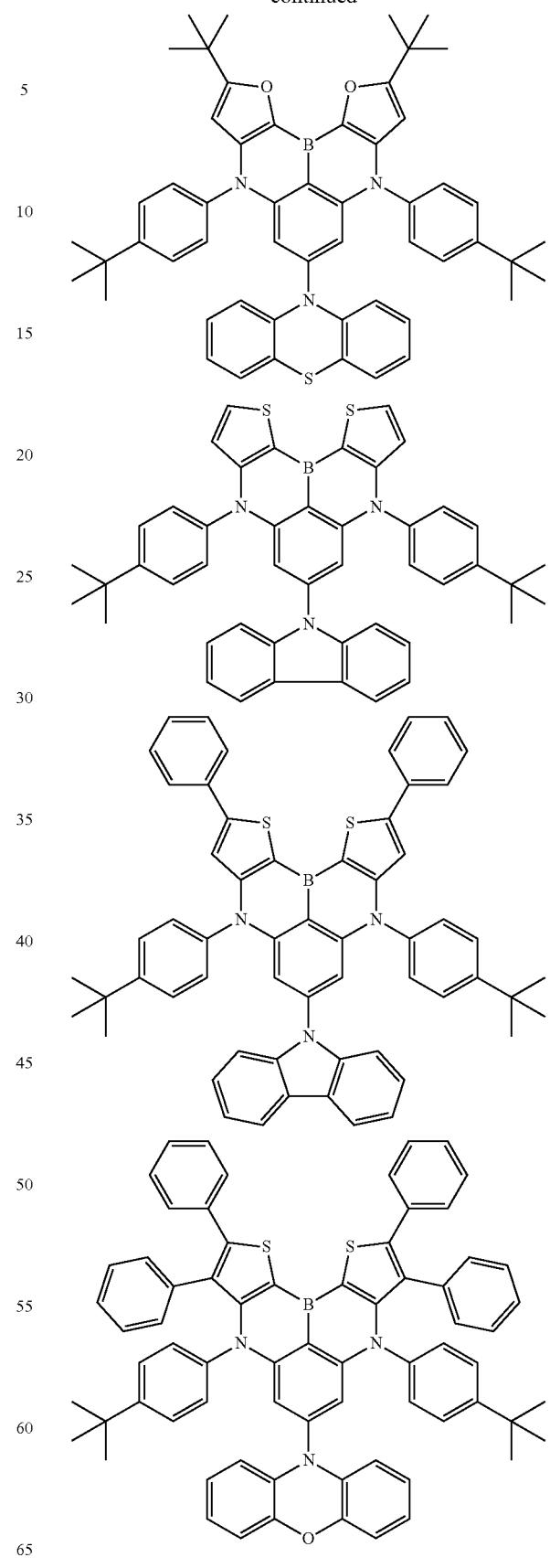

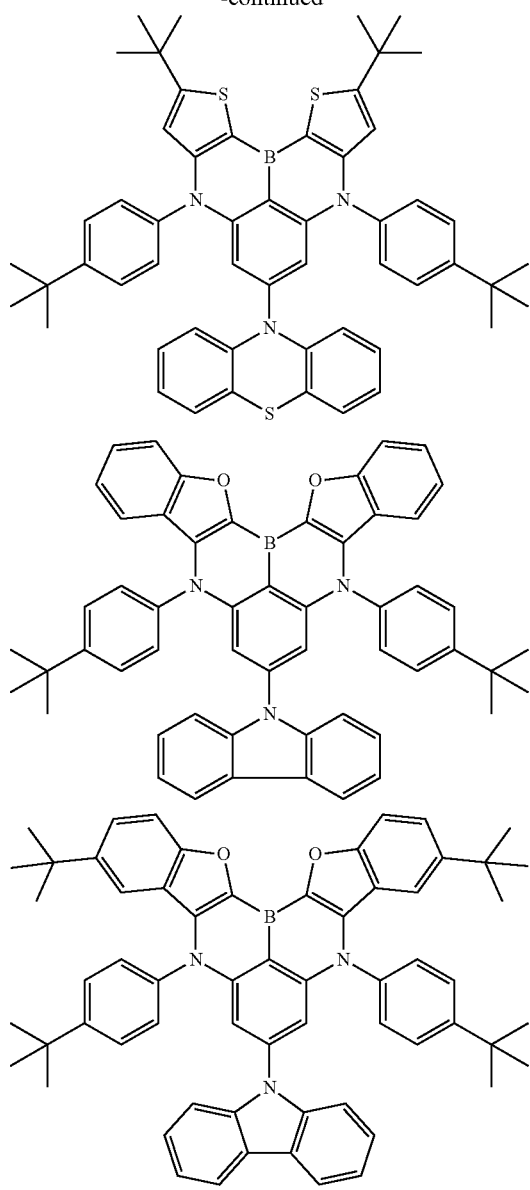
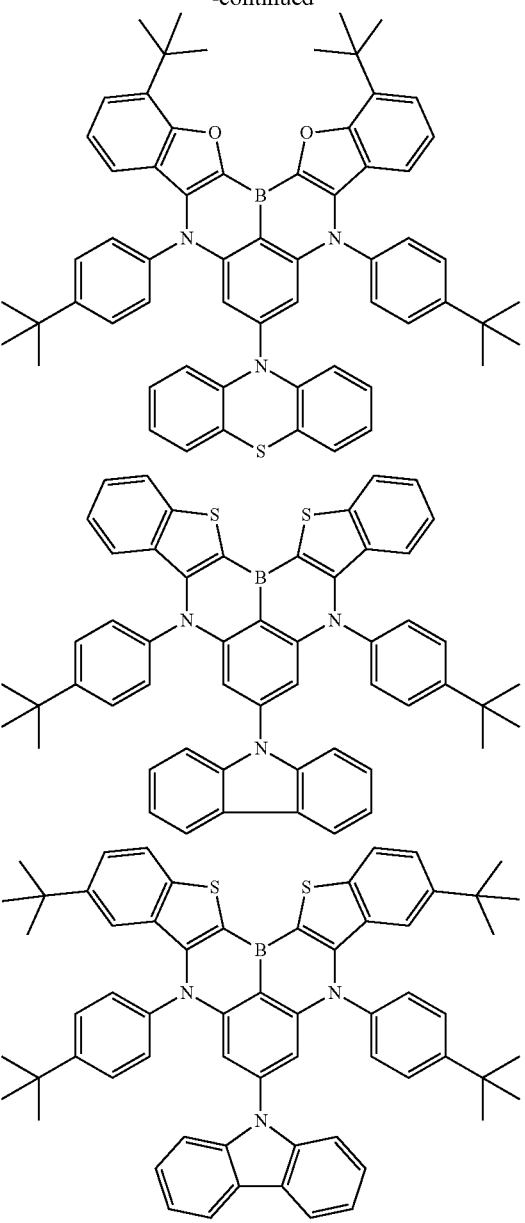
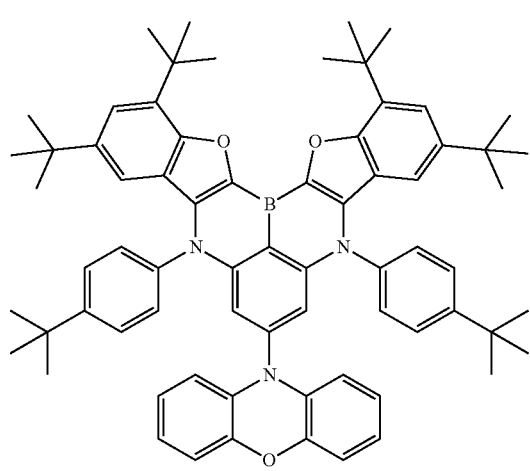
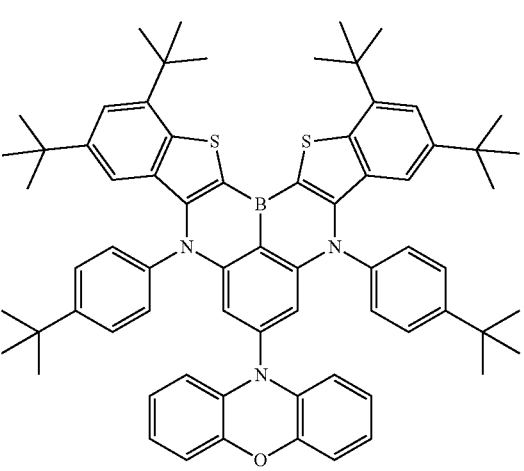

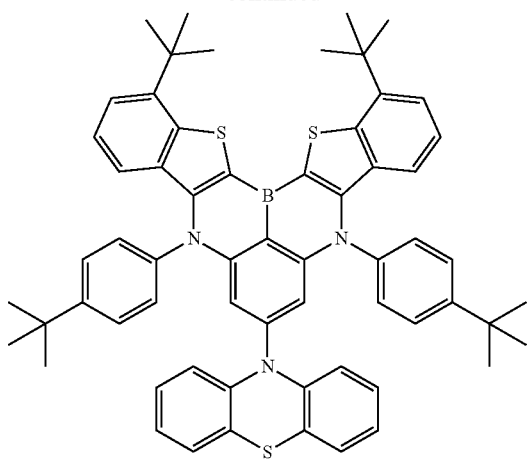
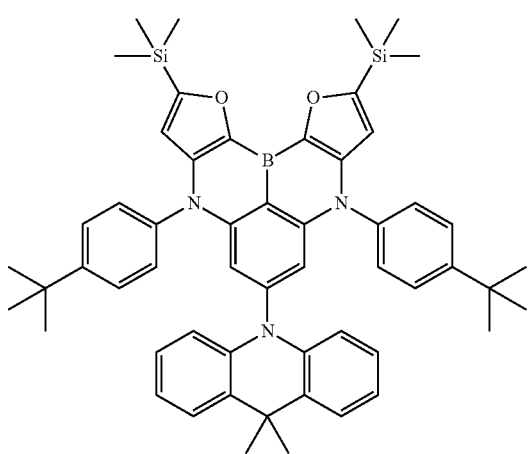
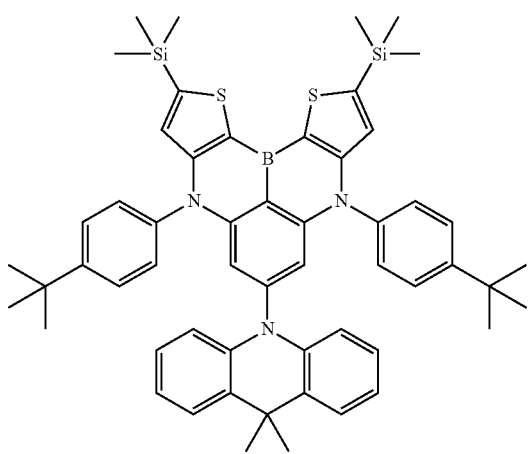
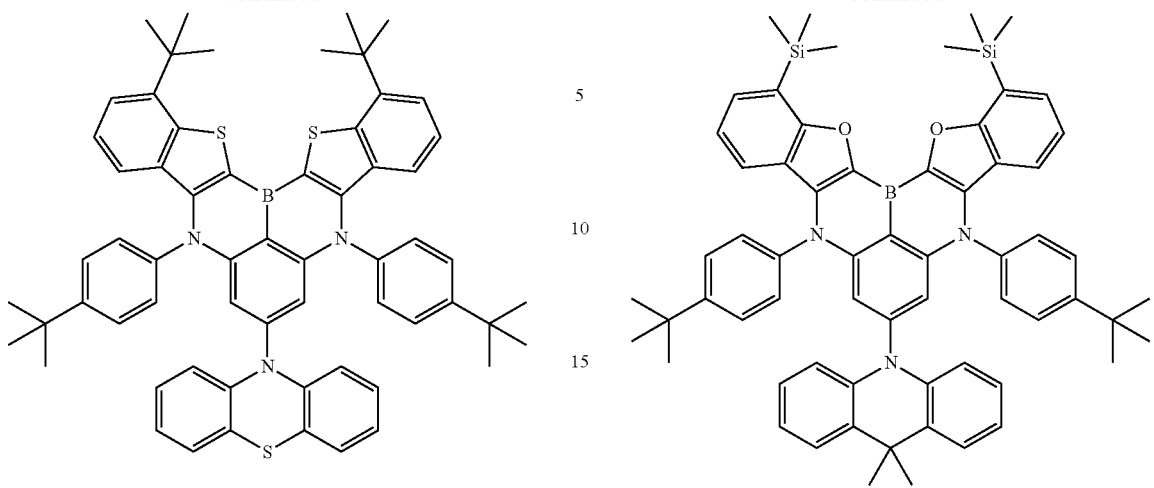
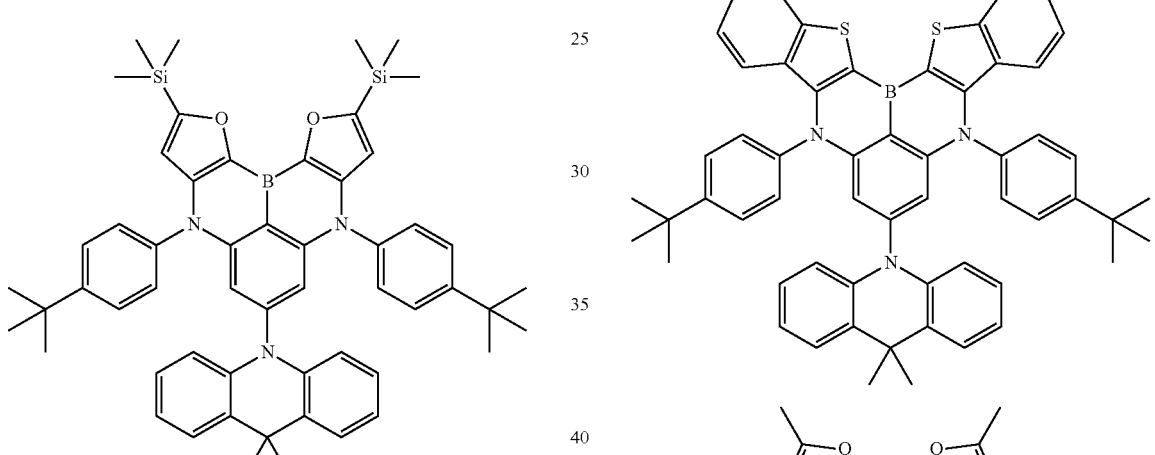
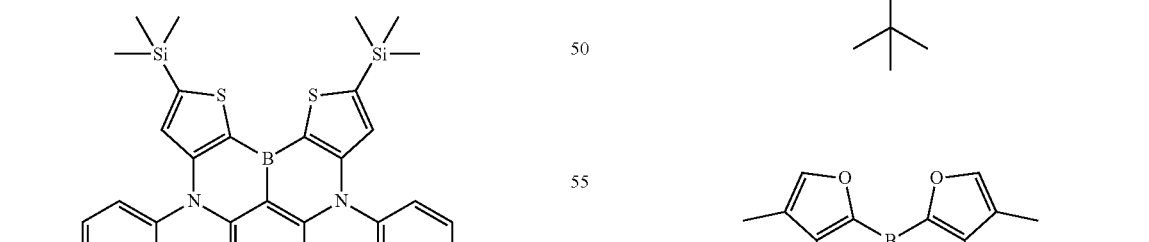
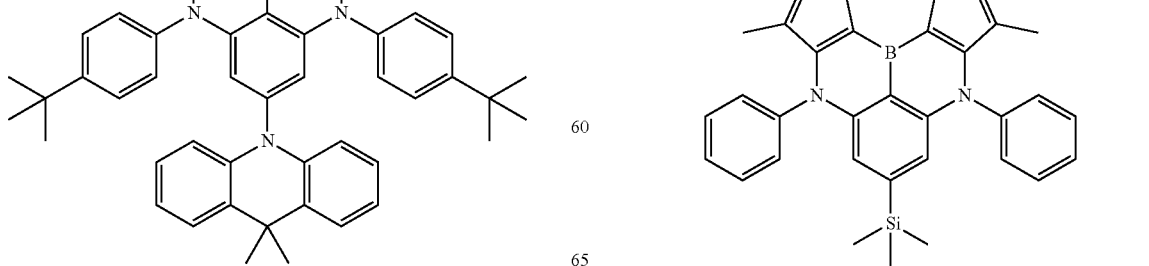

107
-continued
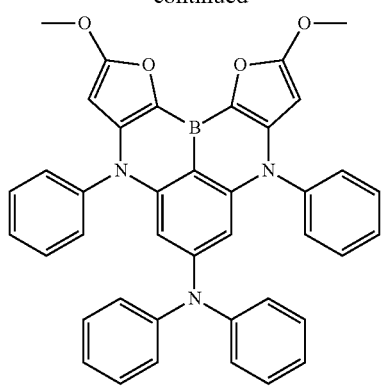
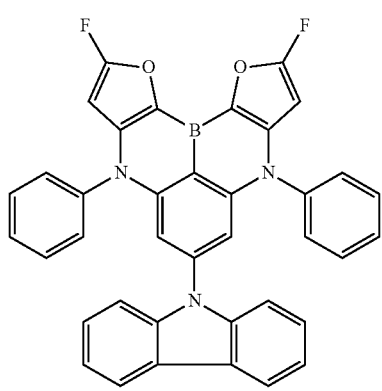
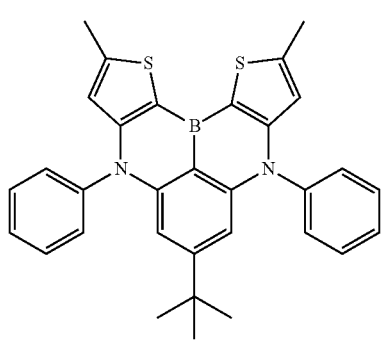
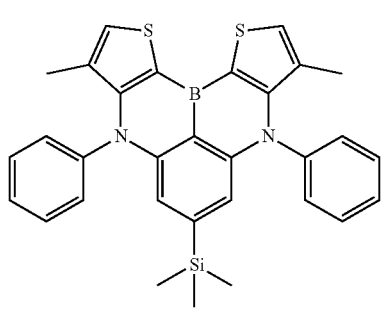
108
-continued
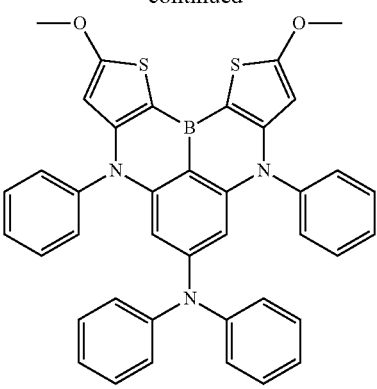
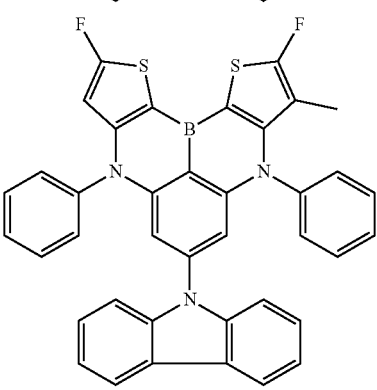
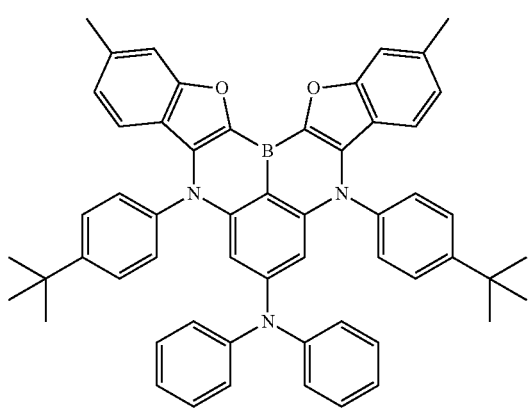
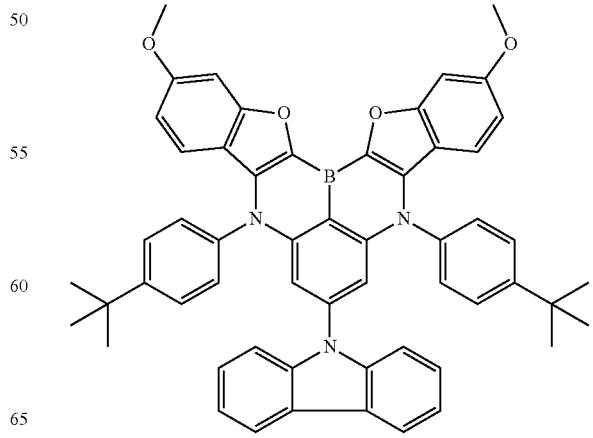

109
-continued
110
-continued
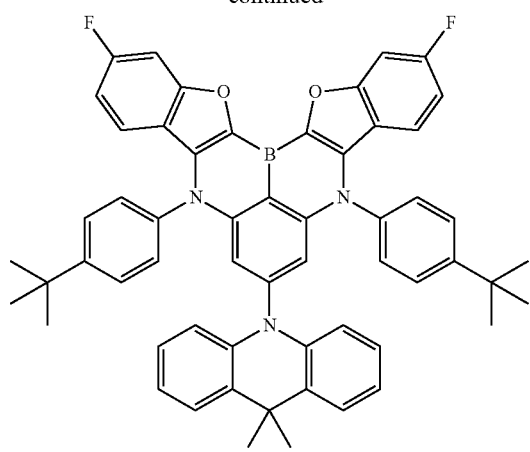
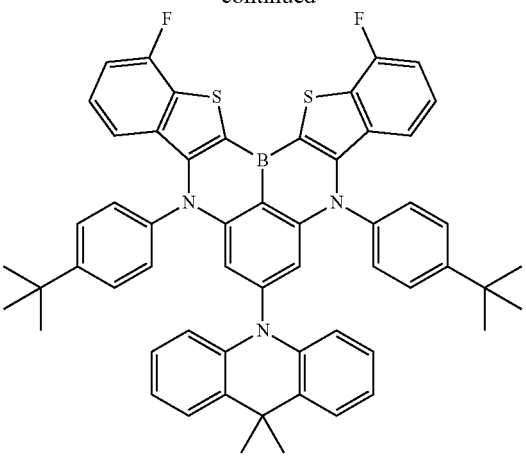

111
-continued
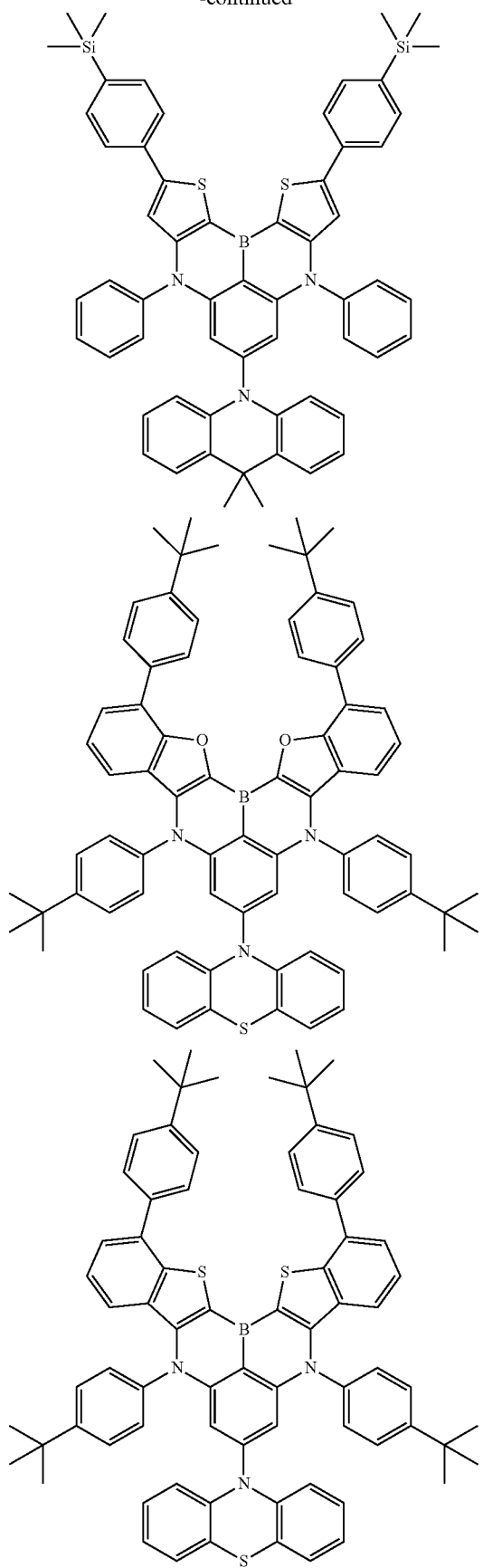
112
-continued
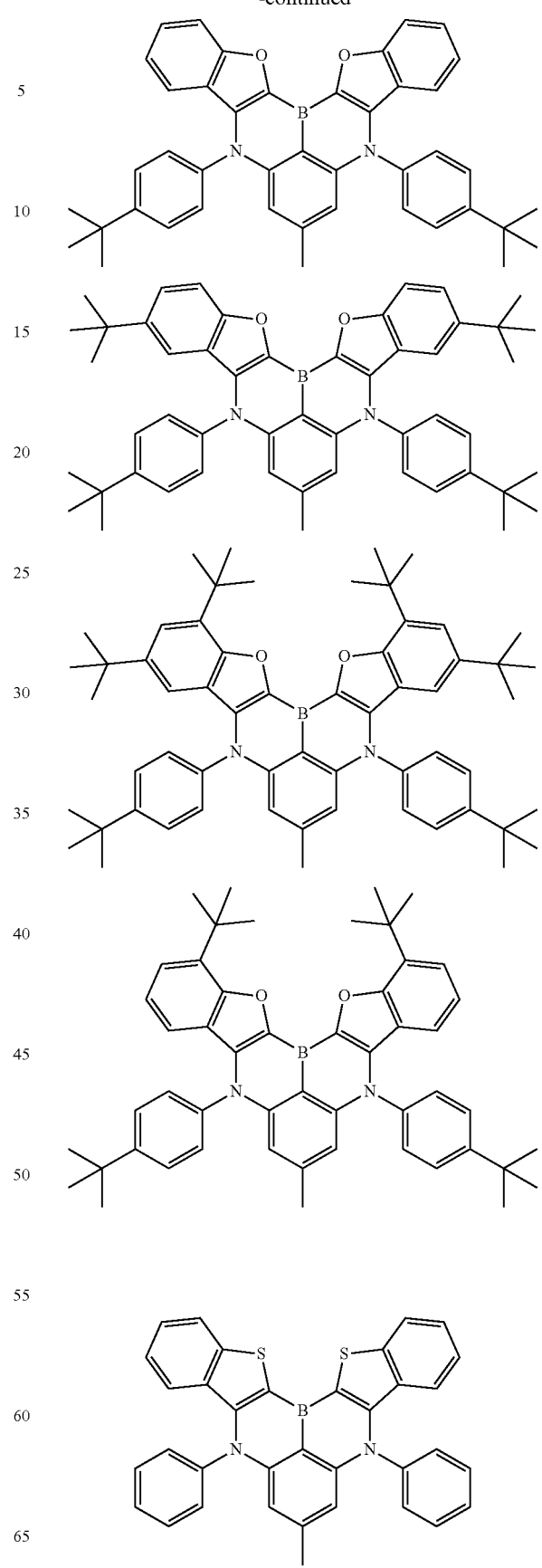

113
-continued
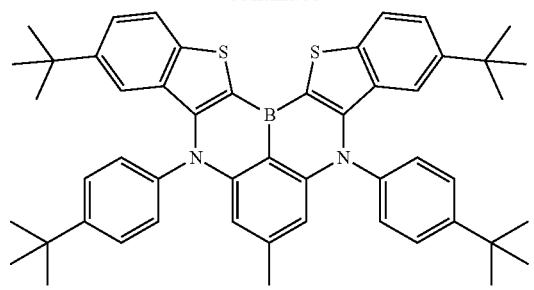
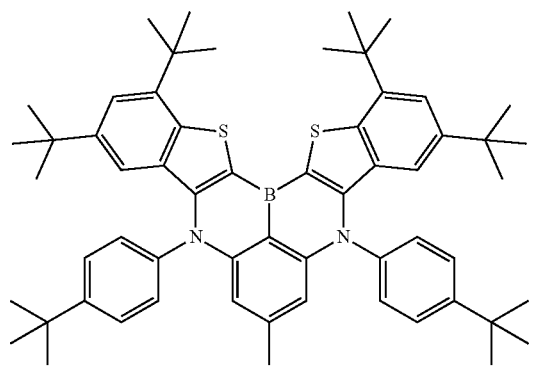
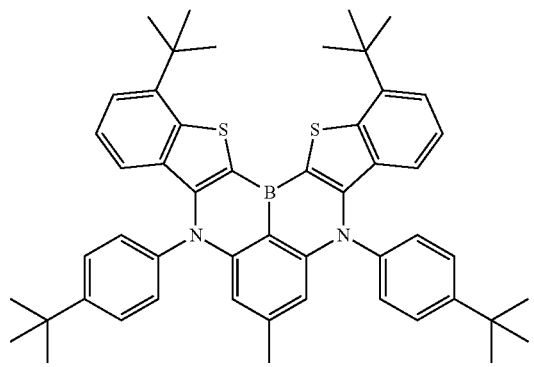
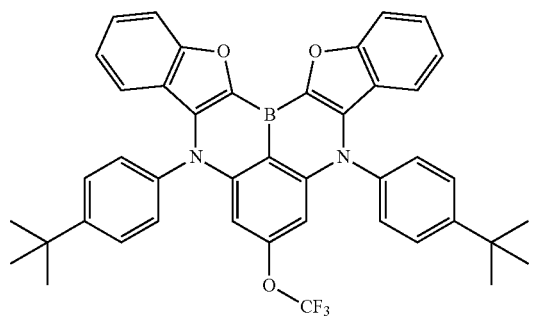
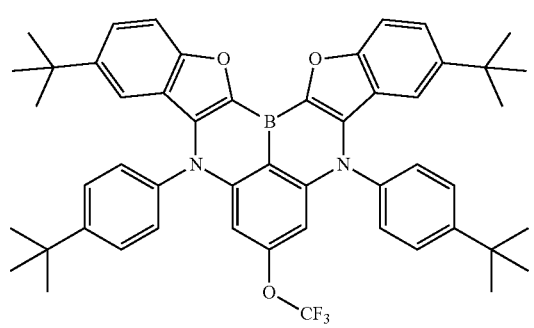
114
-continued
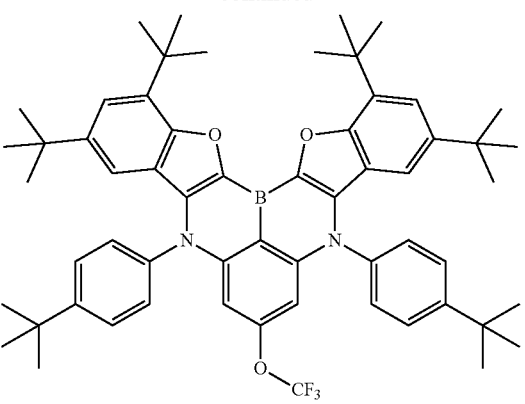
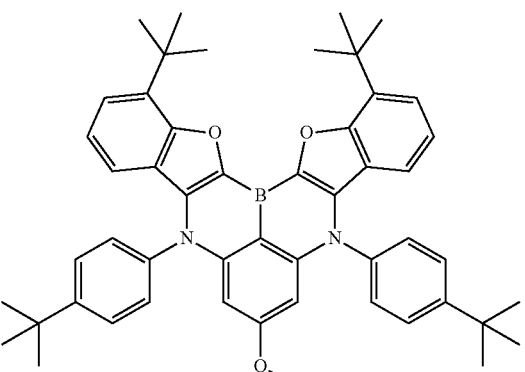
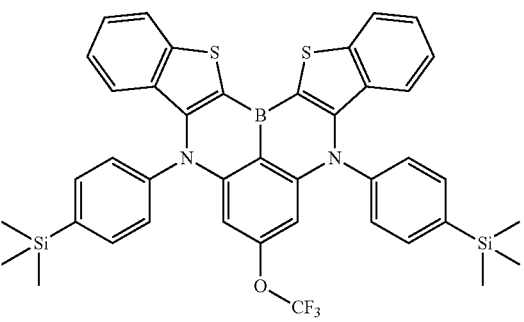
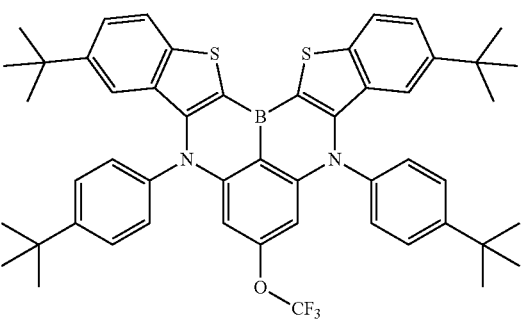

115
-continued
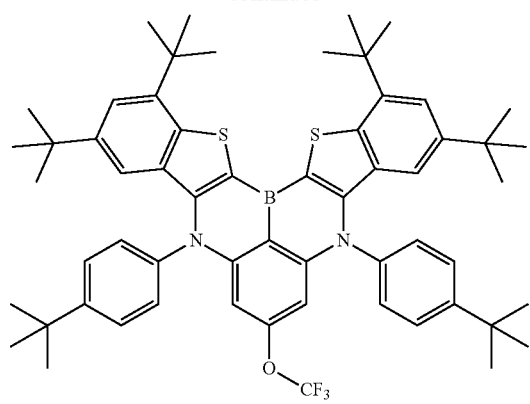
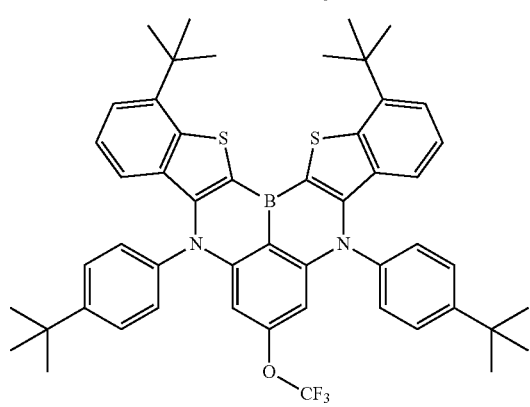
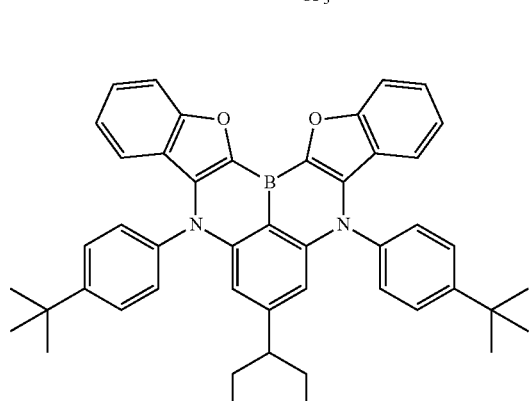
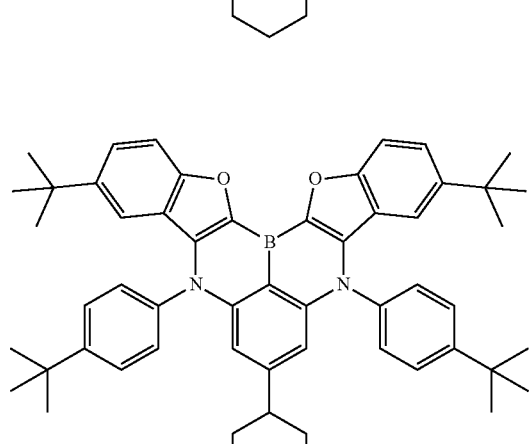
116
-continued
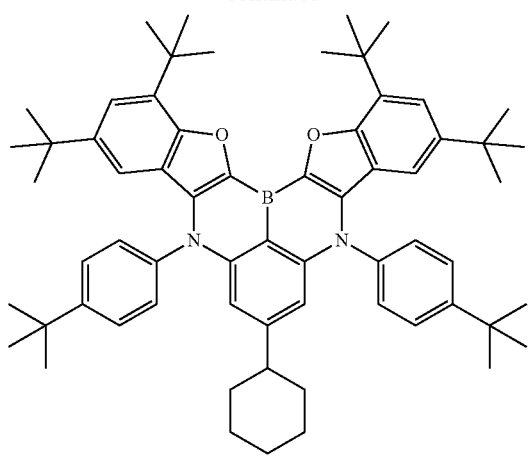
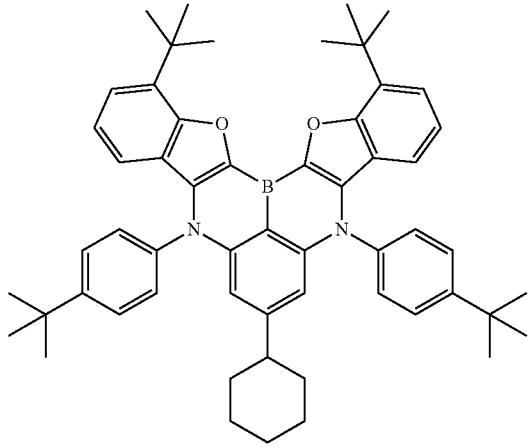
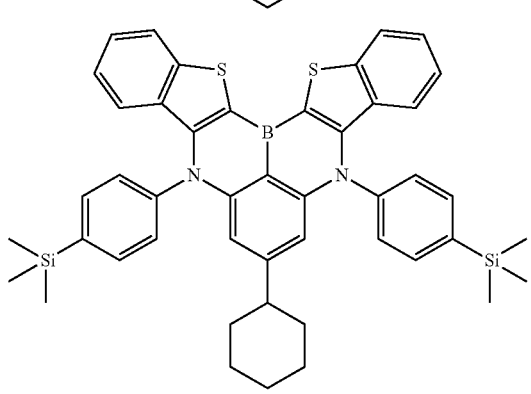
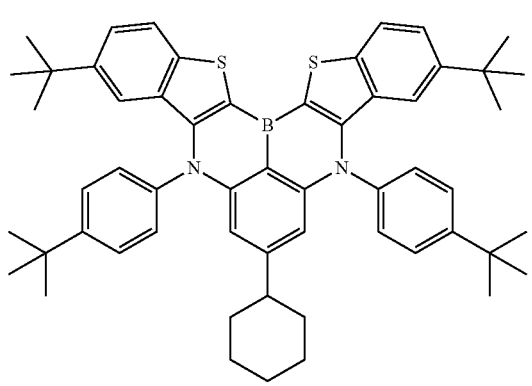

117
-continued
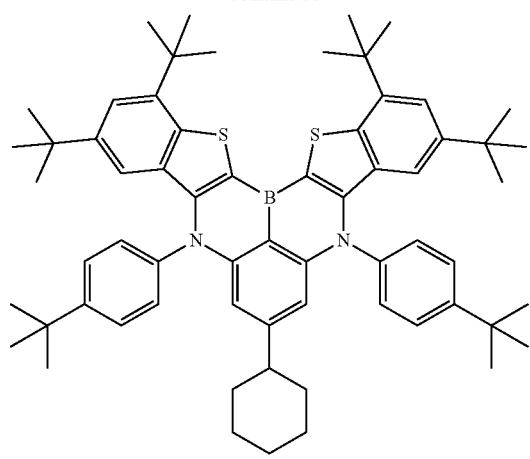
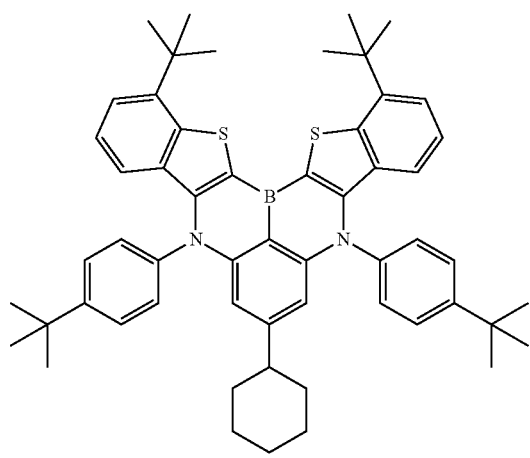
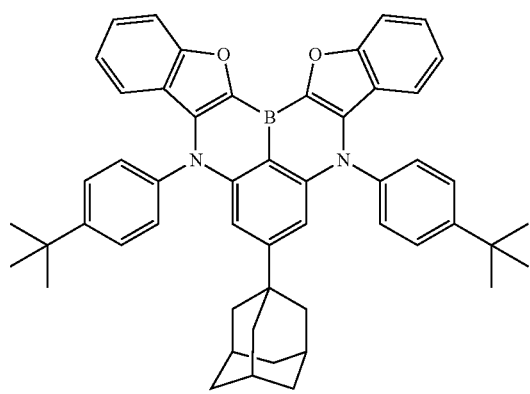
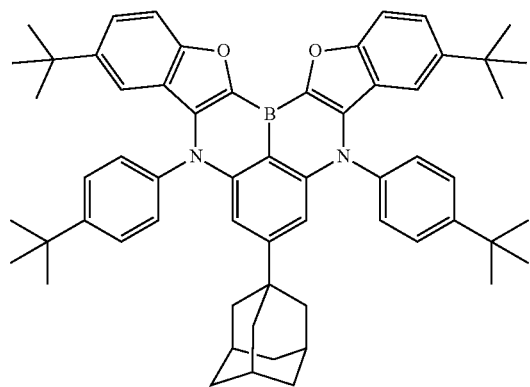
118
-continued
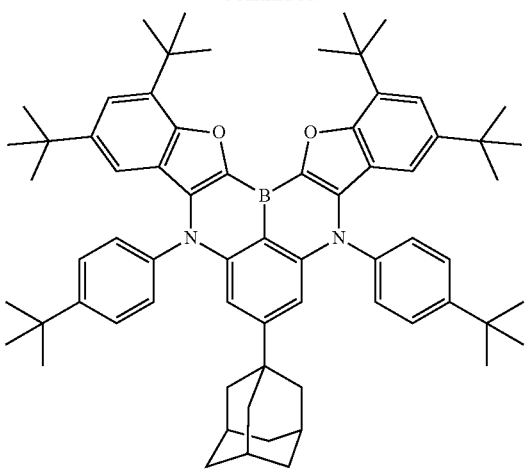
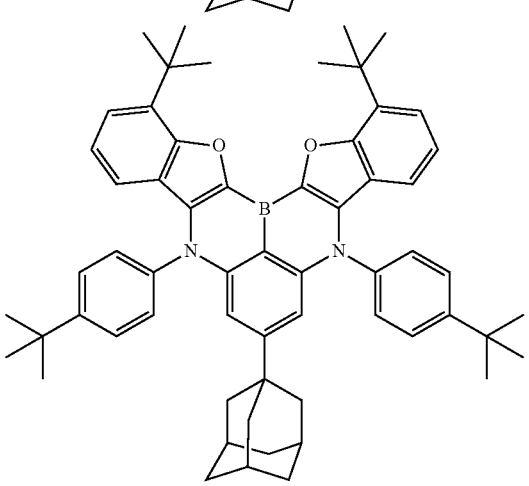
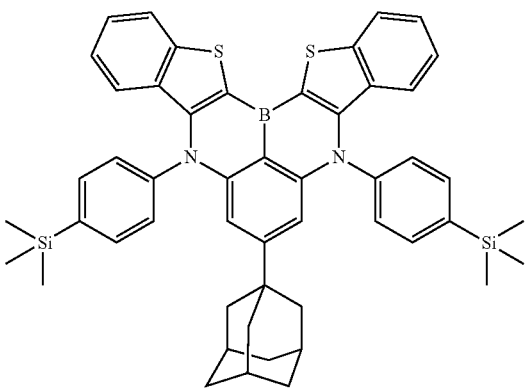
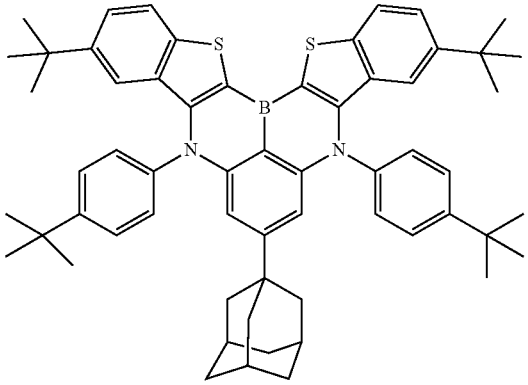

119
-continued
120
-continued
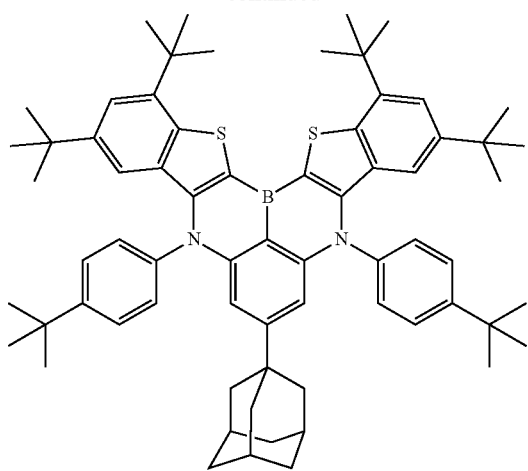
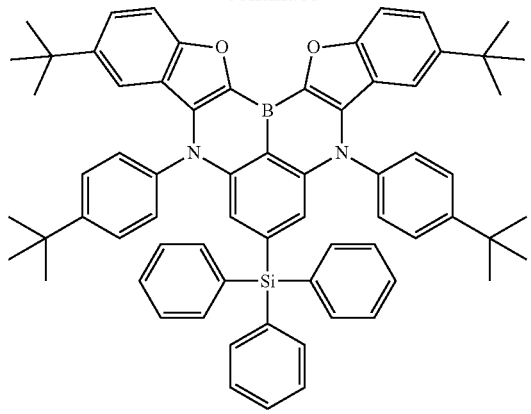
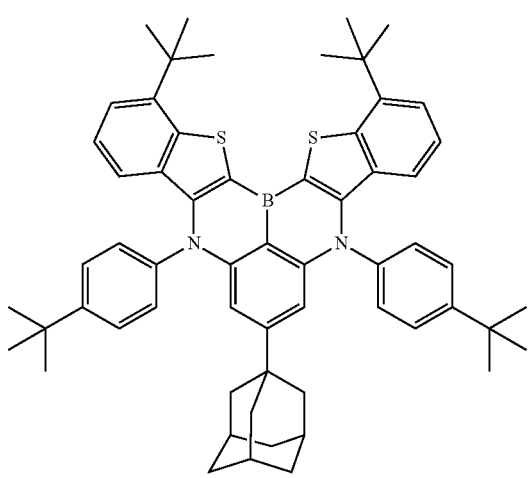
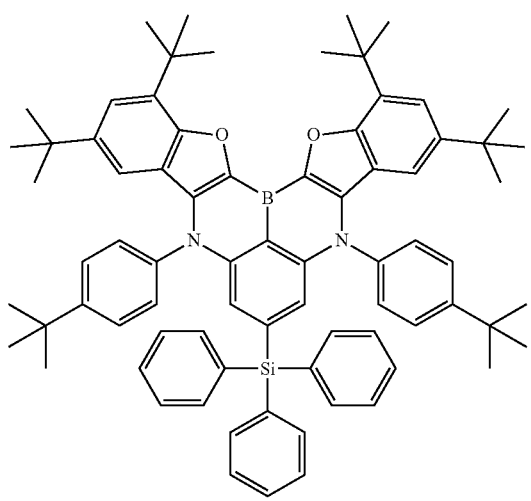
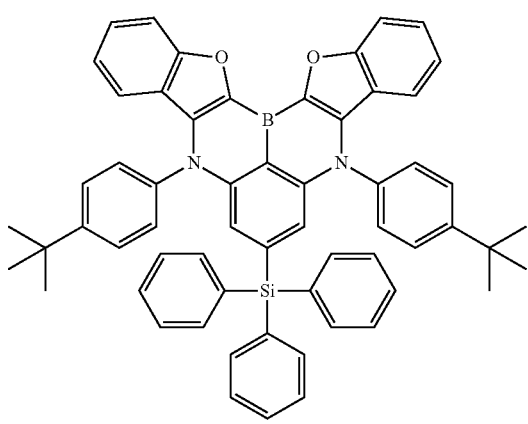
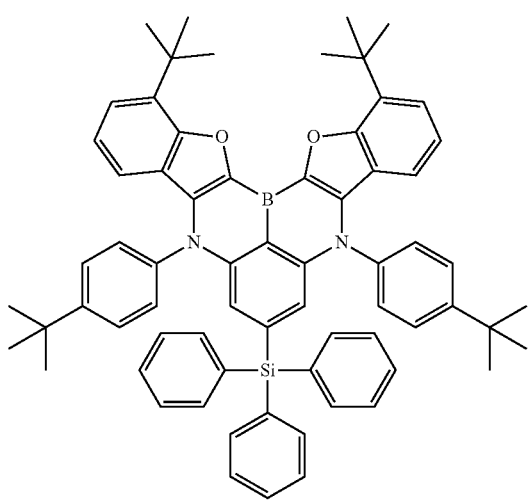

121
-continued
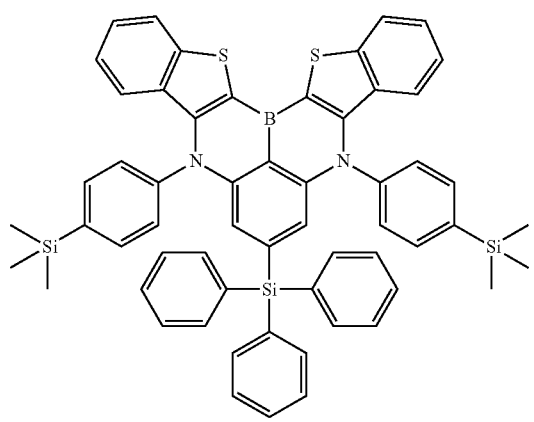
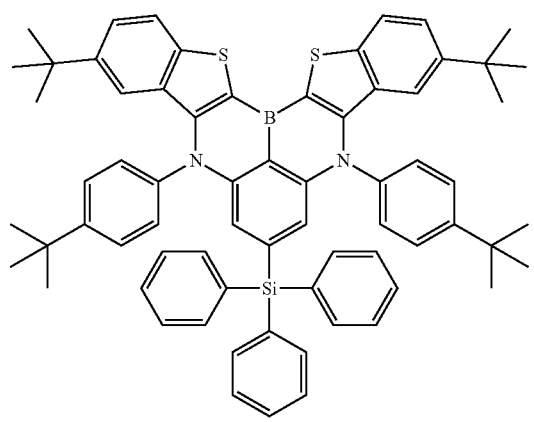
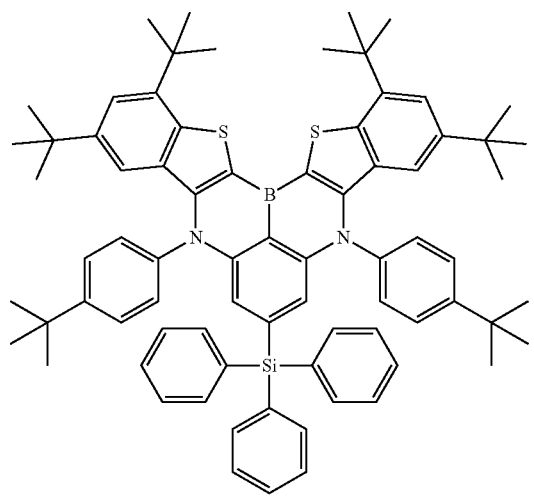
122
-continued
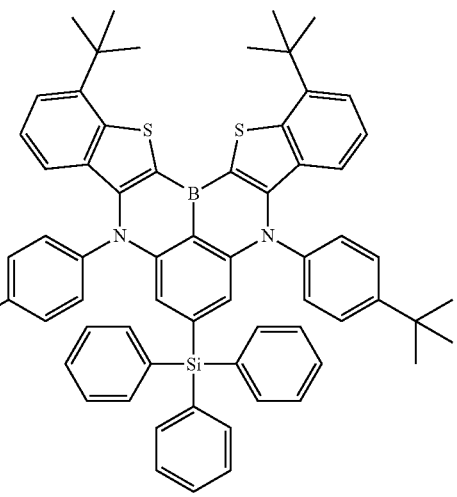
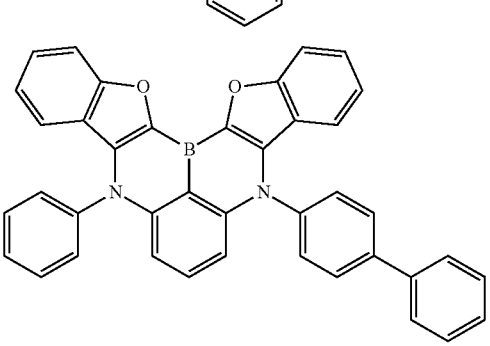
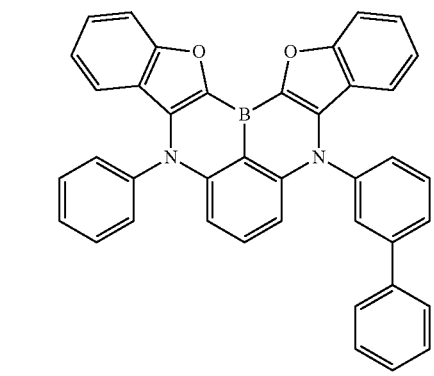
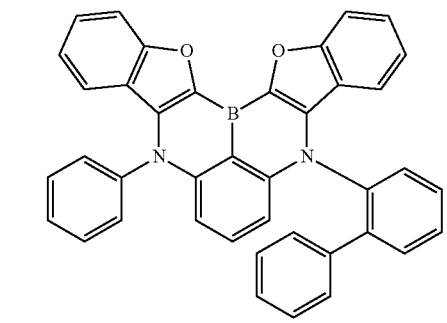

123
-continued
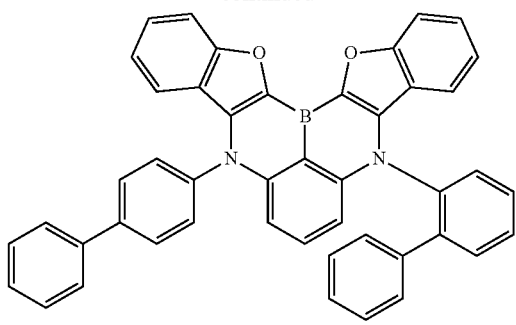
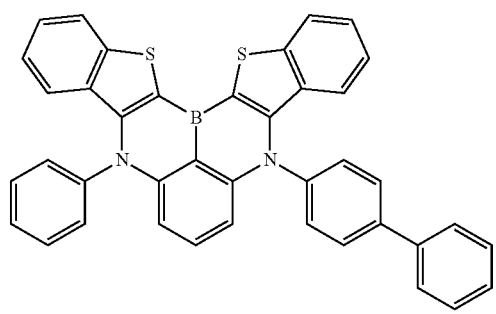
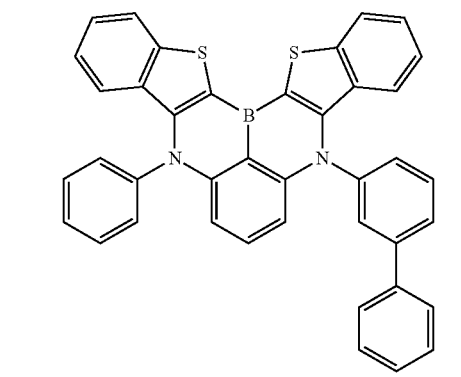
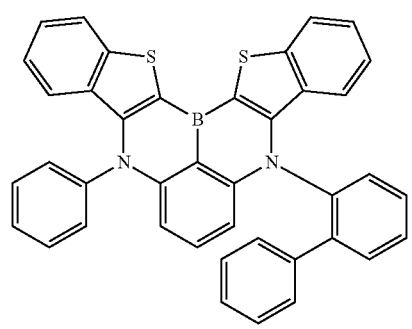
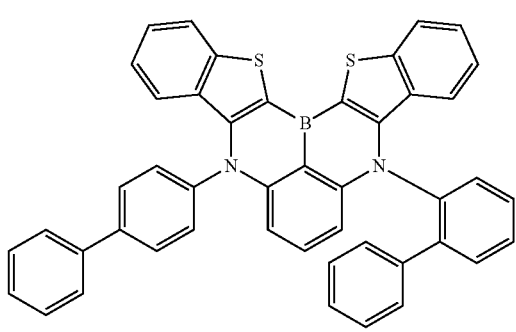
124
-continued
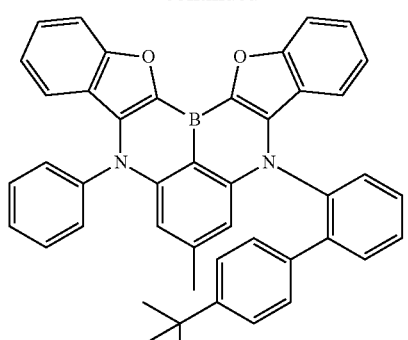
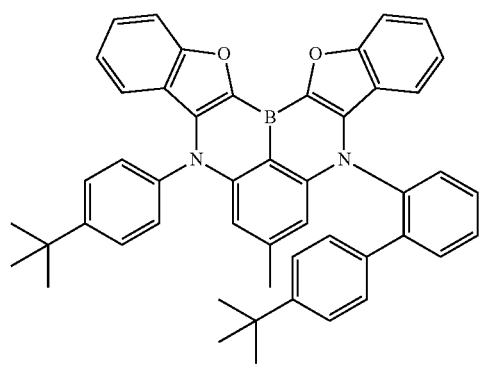
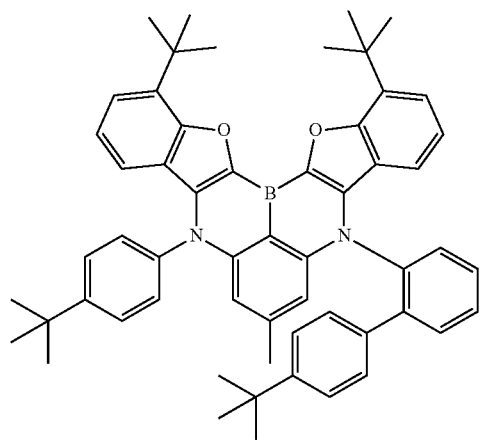
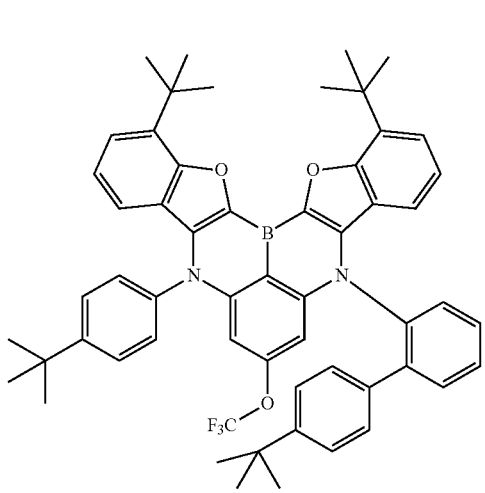

125
-continued
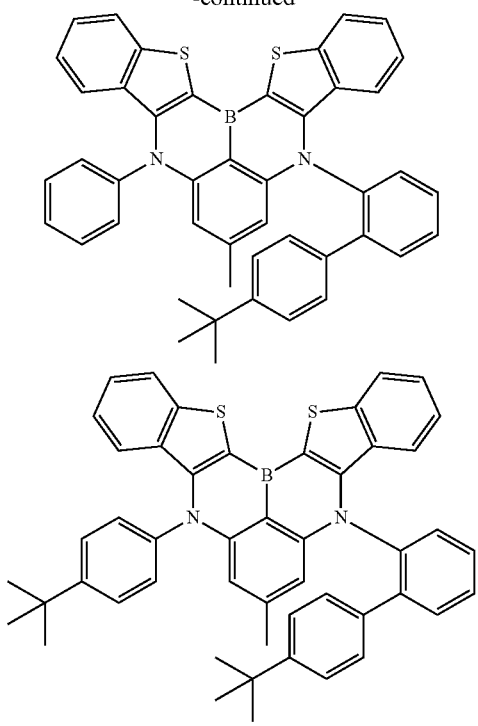
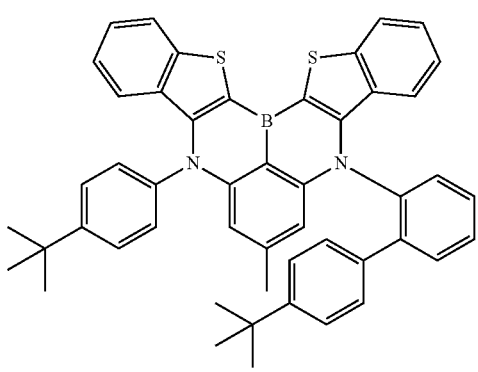
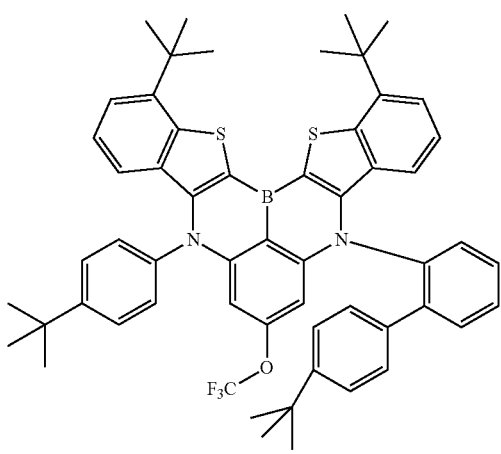
126
-continued
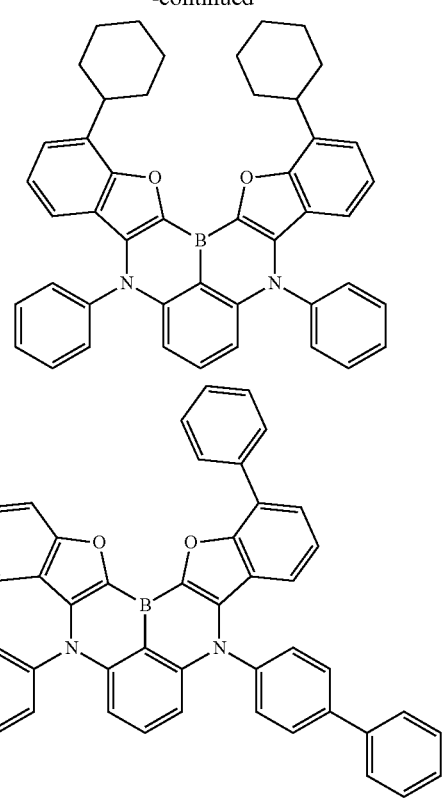
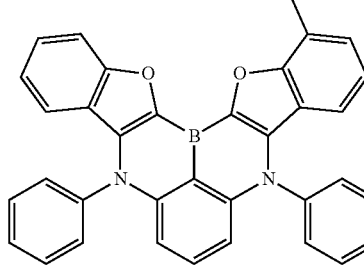
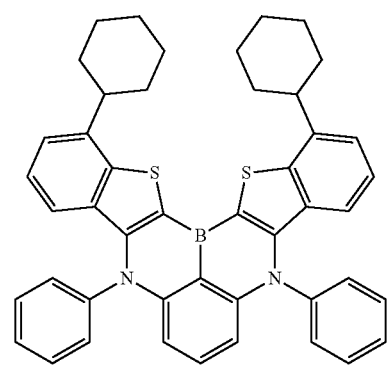
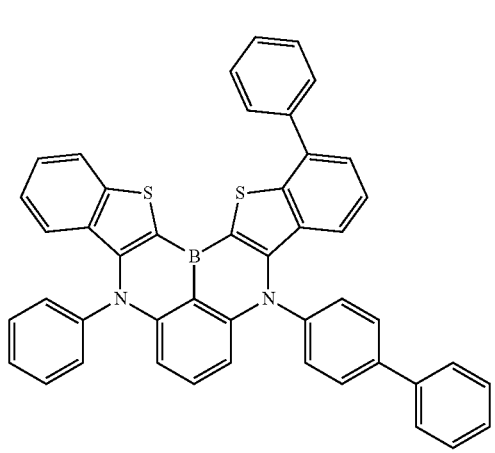

127
-continued
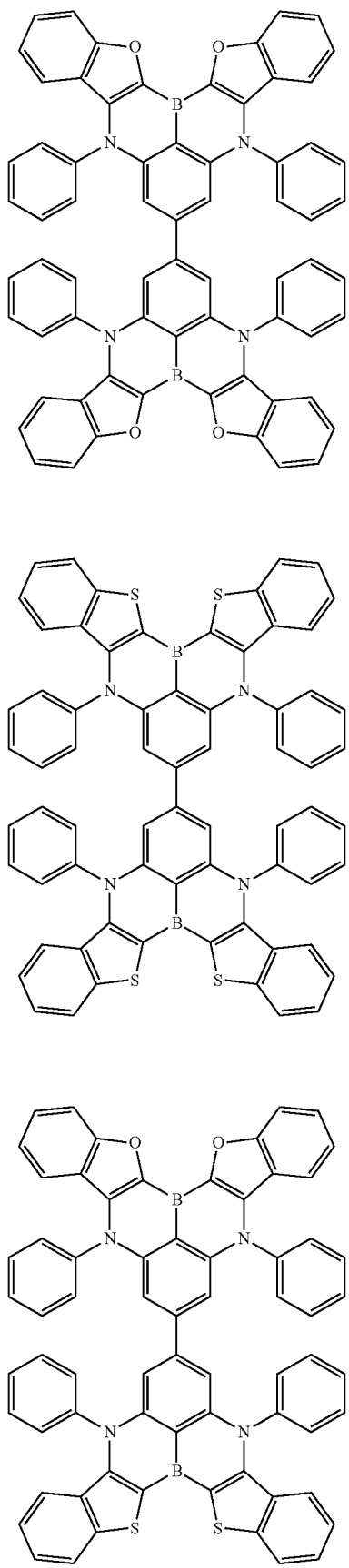
128
-continued
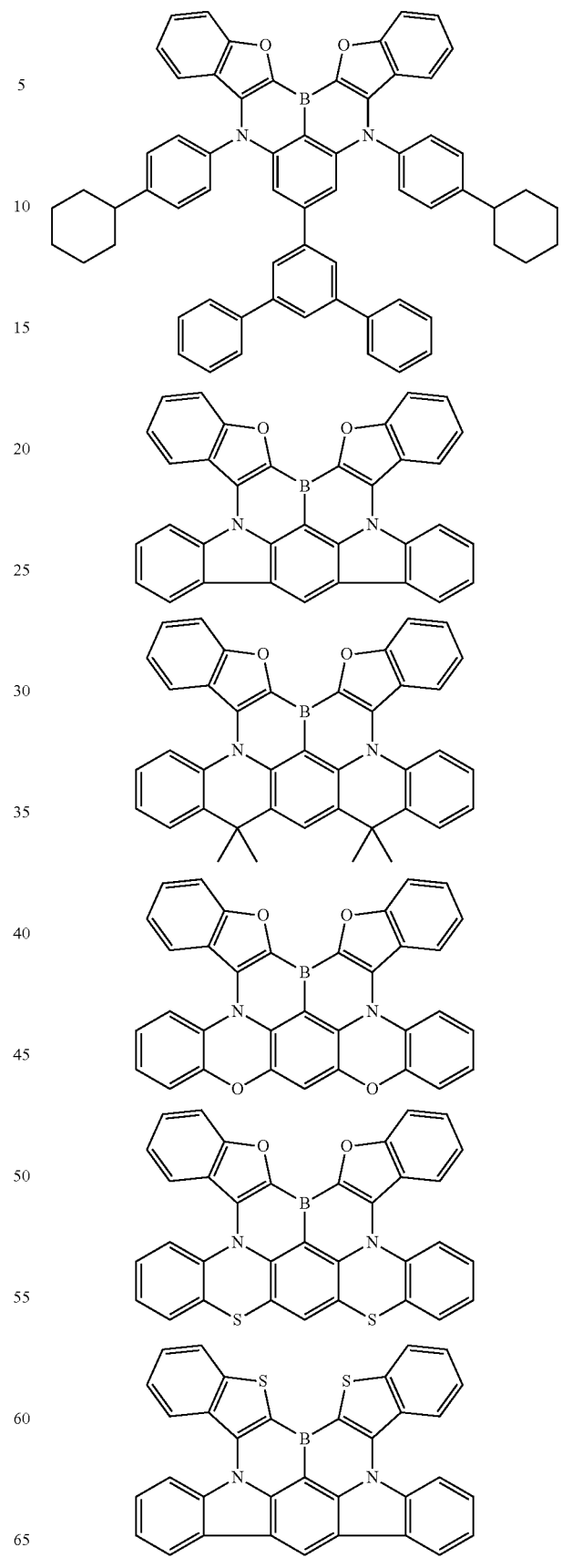

129
-continued

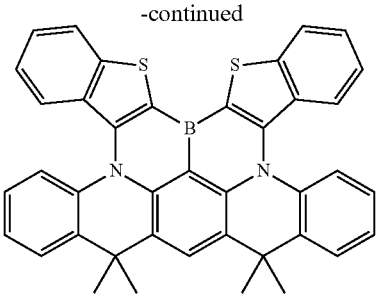

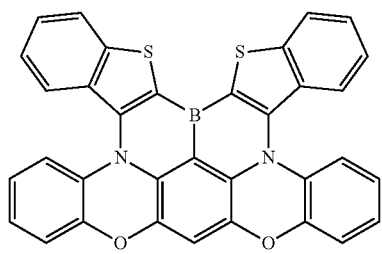

130
-continued

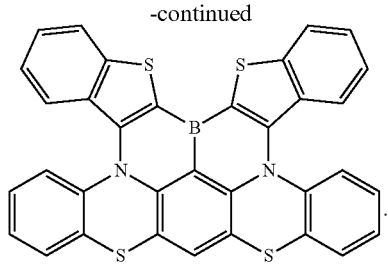

7. An organic light emitting device comprising:
a first electrode;
a second electrode provided opposite to the first electrode; and
one, two or more organic material layers provided between the first electrode and the second electrode,
wherein one or more layers of the organic material layers include the heterocyclic compound of claim 1.

8. The organic light emitting device of claim 7, wherein the organic material layer includes a light emitting layer, and the light emitting layer includes the heterocyclic compound.

* * * * *